(12) United States Patent
Guilfoyle et al.

(10) Patent No.: US 7,627,018 B1
(45) Date of Patent: Dec. 1, 2009

(54) POLARIZATION CONTROL USING DIFFRACTION GRATINGS IN VCSEL WAVEGUIDE GRATING COUPLERS

(75) Inventors: Peter Guilfoyle, Zephyr Cove, NV (US); Duane Louderback, Zephyr Cove, NV (US); Ketan Petal, Stateline, NV (US); Sven Mahnkopf, Dayton, NV (US)

(73) Assignee: Opticomp Corporation, Zephyr Cove, NV (US)

( * ) Notice: Subject to any disclaimer, the term of this patent is extended or adjusted under 35 U.S.C. 154(b) by 144 days.

(21) Appl. No.: 12/005,193

(22) Filed: Dec. 26, 2007

Related U.S. Application Data

(63) Continuation-in-part of application No. 10/860,607, filed on Jun. 3, 2004, now Pat. No. 7,535,944, which is a continuation-in-part of application No. 10/136,953, filed on May 1, 2002, now Pat. No. 6,829,286, which is a continuation of application No. 09/867,719, filed on May 29, 2001, now abandoned.

(60) Provisional application No. 60/207,525, filed on May 26, 2000.

(51) Int. Cl.
    *H01S 3/08* (2006.01)
(52) U.S. Cl. .................................. 372/102; 372/107
(58) Field of Classification Search ................ 372/108, 372/19, 50.11; 438/401; 385/24
    See application file for complete search history.

(56) References Cited

U.S. PATENT DOCUMENTS 5,648,978 A * 7/1997 Sakata ..................... 372/50.11
5,710,849 A * 1/1998 Little et al. .................... 385/50
6,885,804 B2 * 4/2005 Park et al. .................... 385/131
7,304,781 B2 * 12/2007 Chang-Hasnain et al. ... 359/260

OTHER PUBLICATIONS

K. Choquette, et al., "Control of Vertical-Cavity Laser Polarization With Anisotropic Transverse Cavity Gemometries," IEEE Photonics Technology Letters (1994), pp. 40-42, vol. 6, No. 1.

G. Verschaffelt, et al., "Polarization Stabilization in Vertical-Cavity Surface-Emitting Lasers Through Asymmetric Current Injection," IEEE Photonics Technology Letters (2000), pp. 945-947, vol. 12, No. 8.

(Continued)

*Primary Examiner*—Minsun Harvey
*Assistant Examiner*—Tuan N. Nguyen
(74) *Attorney, Agent, or Firm*—DLA Piper LLP (US)

(57) ABSTRACT

A VCSEL waveguide grating coupler is provided such that a first and second mirror are positioned to define a resonant cavity between them. The waveguide grating coupler further includes a waveguide having a first grating formed as a part of the waveguide to couple light of a first polarization mode into the waveguide. A second grating is formed on the waveguide grating coupler and is orthogonal to the first grating. The second grating is operative to enhance the light coupled to the waveguide by creating a loss difference between light of the first polarization mode and light of a second polarization mode, so that light of the first polarization mode lases preferentially within the VCSEL.

31 Claims, 42 Drawing Sheets

OTHER PUBLICATIONS

H. Uenohara, et al., "Polarization-Controlled 850-nm-Wavelength Vertical-Cavity Surface-Emitting Lasers Grown on (311)B Substrates by Metal-Organic Chemical Vapor Depositions," IEEE Journal of Selected Topics in Quantum Electronics (1999), pp. 537-545, vol. 5, No. 3.

Jung-Hoon Ser, "Polarization Stabilization of Vertical-Cavity Top-Surface-Emitting Lasers by Inscription of Fine Metal-interlaced Gratings," American Institute of Physics (1995), pp. 2769-2771.

* cited by examiner

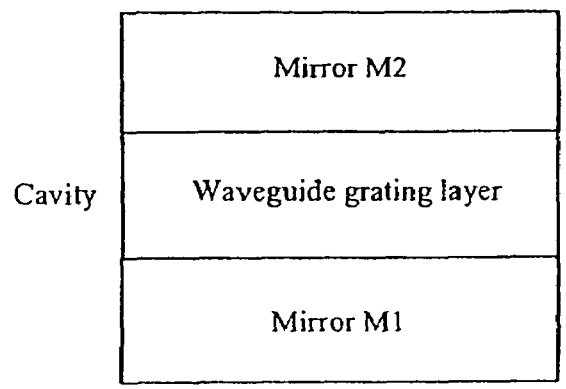
Figure 1: A resonant cavity enhanced (RCE) waveguide grating coupler
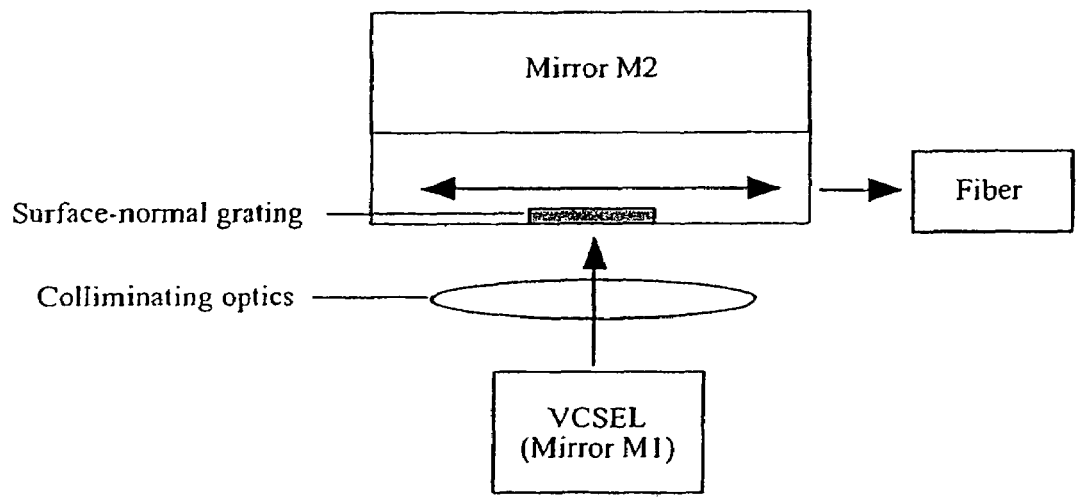
Figure 2: A hybrid RCE VCSEL/waveguide grating coupler

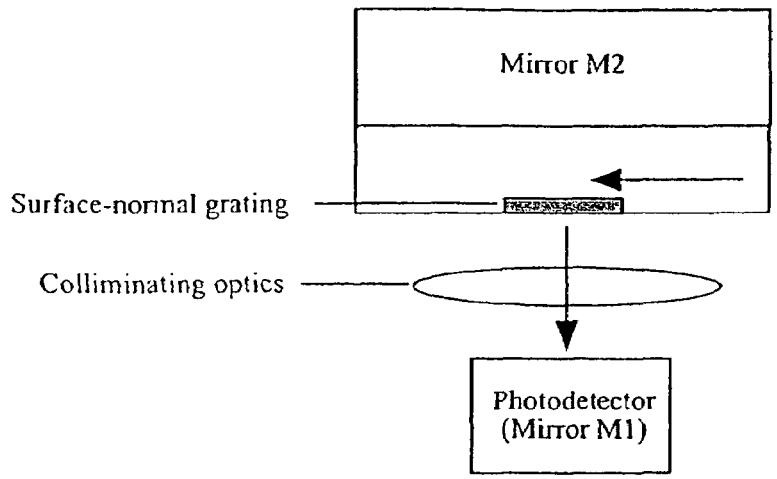
Figure 3: A hybrid RCE photodetector/waveguide grating coupler
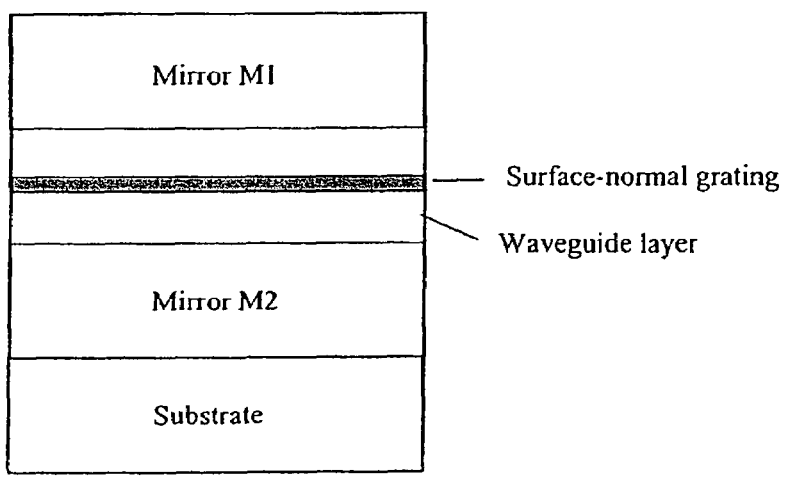
Figure 4: A monolithic RCE waveguide grating coupler.

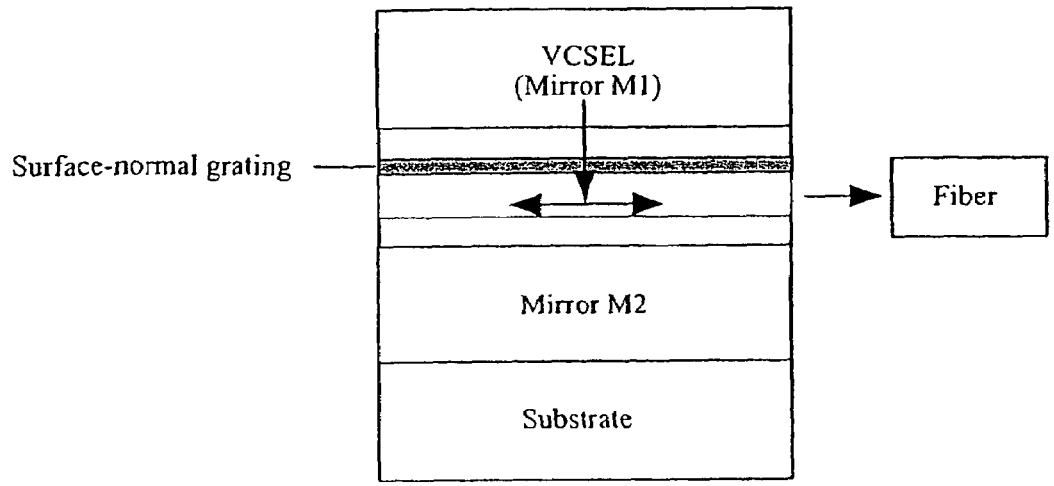
Figure 5: A monolithic RCE VCSEL/waveguide grating coupler fabricated using an epitaxial regrowth technique.
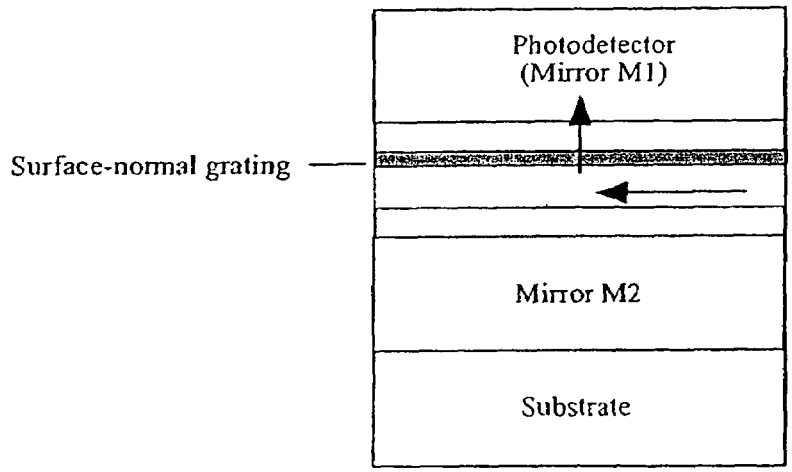
Figure 6: A monolithic RCE photodetector/waveguide grating coupler fabricated using an epitaxial regrowth technique.

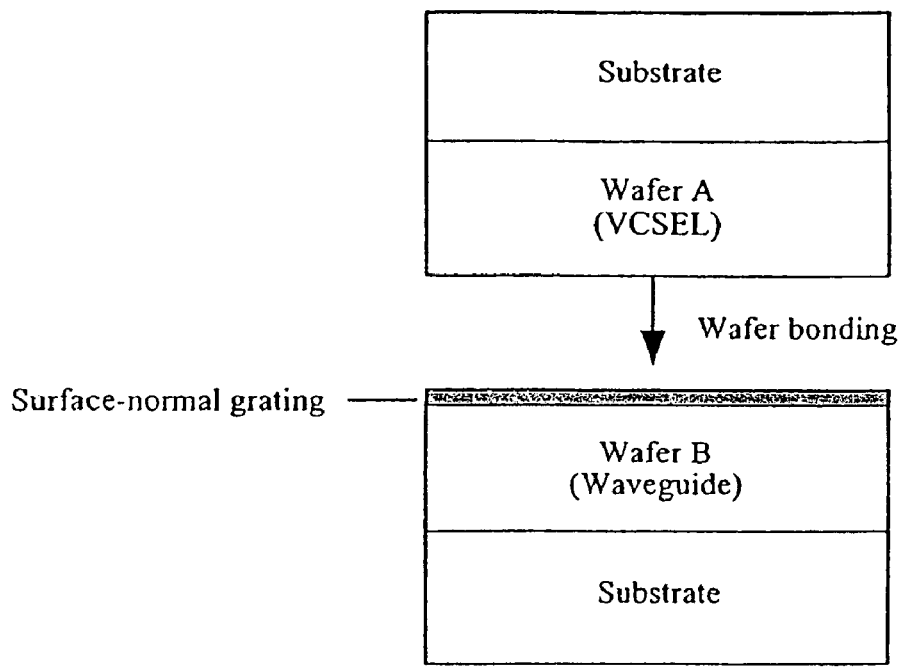
Figure 7: A monolithic RCE VCSEL/waveguide grating coupler fabricated using a wafer bonding technique.
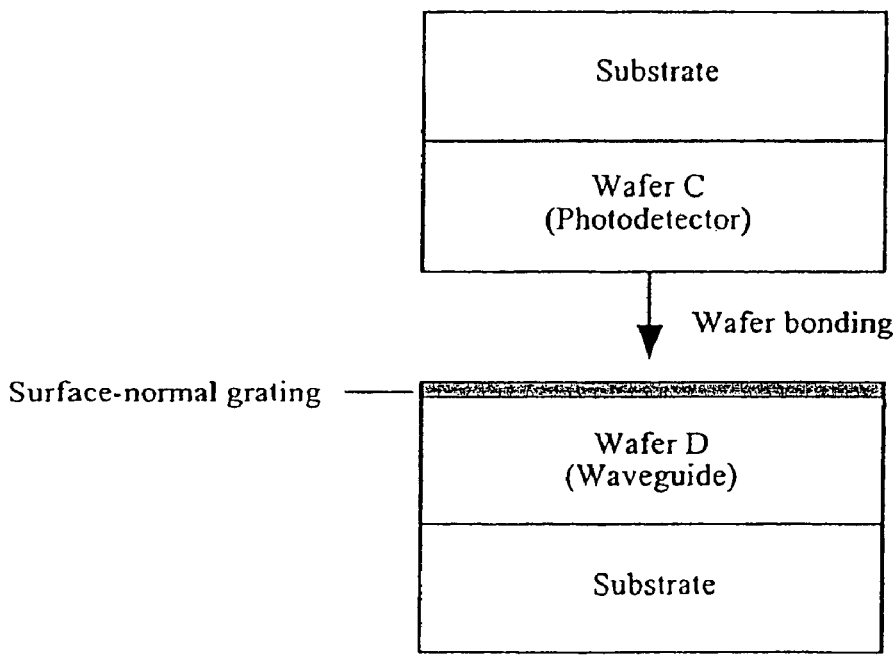
Figure 8: A monolithic RCE photodetector/waveguide grating coupler fabricated using a wafer bonding technique.

| Voltage | 4 v | 4.5 v | 5 v | 5.5 v | 6 v | 6.5 v |
|---|---|---|---|---|---|---|
| Current | 4.5 mA | 5.55 mA | 6.63 mA | 7.73 mA | 8.85 mA | 9.95 mA |

Table 1: Voltages and currents that were applied to VCSELs.

|  | Peak Wavelengths at Various Voltages | | | | | |
|---|---|---|---|---|---|---|
| VCSEL Location | 4v | 4.5v | 5v | 5.5v | 6v | 6.5v |
| VCSEL 1 | 843.41 nm | 844.94 nm | 845.24 nm | 845.59 nm | 845.96 nm | 846.41 nm |
| VCSEL 2 | 843.39 nm | 844.70 nm | 844.99 nm | 845.39 nm | 845.75 nm | 846.16 nm |
| VCSEL 3 | 844.30 nm | 844.56 nm | 844.92 nm | 845.28 nm | 845.68 nm | 846.07 nm |
| VCSEL 4 | 843.91 nm | 844.18 nm | 844.49 nm | 844.81 nm | 845.24 nm | 845.74 nm |
| VCSEL 5 | 843.47 nm | 843.73 nm | 843.93 nm | 844.37 nm | 844.65 nm | 845.13 nm |

Table 2: Peak wavelengths of the 1 x 5 VCSEL array.

FIGURE 29

|  | Mean Wavelengths at Various Voltages | | | | | |
|---|---|---|---|---|---|---|
| VCSEL Location | 4v | 4.5v | 5v | 5.5v | 6v | 6.5v |
| VCSEL 1 | 844.87 nm | 844.70 nm | 845.15 nm | 845.50 nm | 845.68 nm | 846.09 nm |
| VCSEL 2 | 844.39 nm | 844.98 nm | 844.98 nm | 845.34 nm | 845.66 nm | 846.09 nm |
| VCSEL 3 | 844.79 nm | 844.57 nm | 844.92 nm | 845.28 nm | 845.68 nm | 846.05 nm |
| VCSEL 4 | 844.21 nm | 844.18 nm | 844.49 nm | 844.81 nm | 845.24 nm | 845.66 nm |
| VCSEL 5 | 843.63 nm | 843.80 nm | 843.93 nm | 844.37 nm | 844.65 nm | 845.13 nm |

Table 3: Mean wavelengths of the 1 x 5 VCSEL array.

FIGURE 30

| Layer | Material | Mole Fraction | Thickness | Doping |
|---|---|---|---|---|
| 5 | $Al_xGa_{1-x}As$ | x = 0.15 +/- 0.02 | 0.5 μm +/- 0.02 μm | undoped |
| 4 | $Al_xGa_{1-x}As$ | x = 0.4 +/- 0.02 | 2.25 μm +/- 0.25 μm | undoped |
| 3 | GaAs | | 0.01 μm | undoped |
| 2 | AlAs | | 0.1 μm | undoped |
| 1 | GaAs | | Substrate | |

Table 6: Epitaxial structure for a single mode waveguide.

FIGURE 31

| Layer | Material | Mole Fraction | Thickness | Doping |
|---|---|---|---|---|
| 5 | $Al_xGa_{1-x}As$ | x = 0.15 +/- 0.02 | 8 μm +/- 2 μm | undoped |
| 4 | $Al_xGa_{1-x}As$ | x = 0.4 +/- 0.02 | 4 μm +/- 0.5 μm | undoped |
| 3 | GaAs | | 0.01 μm | undoped |
| 2 | AlAs | | 0.1 μm | undoped |
| 1 | GaAs | | Substrate | |

Table 7: Epitaxial structure for a multi mode waveguide.

FIGURE 32

| Grating | Grating pitch (Å) |
|---|---|
| OSU-884-1 | 2412.8 |
| OSU-884-2 | 2429.3 |
| OSU-884-3 | 2450.4 |
| OSU-884-4 | 2469.3 |
| OSU-884-5 | 2487.9 |
| OSU-884-6 | 2409.1 |
| OSU-884-7 | 2432.2 |
| OSU-884-8 | 2452.9 |
| OSU-884-9 | 2473.6 |
| OSU-884-10 | 2493.2 |

Table 6: Series of grating pitches evaluated

Defect

Two-dimensional photonic crystal coupler with two-dimensional defect

Defect

POLARIZATION CONTROL USING DIFFRACTION GRATINGS IN VCSEL WAVEGUIDE GRATING COUPLERS

RELATED APPLICATIONS

The present application is a Continuation-in-Part of U.S. patent application Ser. No. 10/860,607, filed Jun. 3, 2004, now U.S. Pat. No. 7,535,944, which is a Continuation-in-Part of U.S. patent application Ser. No. 10/136,953, filed May 1, 2002, now U.S. Pat. No. 6,829,286, which is a continuation of U.S. patent application Ser. No. 09/867,719, filed May 29, 2001, now abandoned, which claims priority under 35 U.S.C. §119(e) from provisional application No. 60/207,525, filed May 26, 2000.

GOVERNMENT INTERESTS

The United States Government has a paid-up license in this invention and the right in limited circumstances to require the patent owner to license others on reasonable terms as provided by the terms of Contract No. F29601-03-C-0074 awarded by the United States Air Force Research Laboratory.

TECHNICAL FIELD

The present invention is directed generally to coupling light from one location to another, and more particularly to efficiently coupling light out of a VCSEL using a waveguide and diffraction gratings.

BACKGROUND ART

Coupling of light from one point to another or one location to another presents several challenges, particularly in optical transmission of information, production of high power coherent light, pump sources for lasers, and the like. The challenges presented are illustrated, for example, in the context of developing high power vertical cavity surface emitting lasers (VCSELs).

High-power VCSEL arrays have been demonstrated by several research groups. Grabherr et al. reported VCSEL power densities exceeding 300 W/cm$^2$ from a 23-element array [M. Grabherr et. al., Electron. Lett., vol. 34, p. 1227, 1998]. Francis et al. demonstrated VCSEL power in excess of 2-W continuous wave and 5 W pulsed from a 1000-element VCSEL array [D. Francis, et. al., IEEE Int. Semiconductor Laser Conf. (ISLC), Nara, Japan, October 1998]. Chen et al. also reported the power density of about 10 kW/cm$^2$ Steradian from an array of 1600 VCSELs using a microlens array to individually collimate light from each laser [H. Chen, et. al., IEEE Photon. Technol. Lett., vol. 11, No. 5, p. 506, May 1999]. However, their beam quality at high power is still poor. A high quality beam requires a narrow linewidth single mode with high spatial and temporal coherence.

In order to produce coherent, single-frequency, high-power arrays of VCSELs, the elements of one or two dimensional VCSEL arrays should be phase-locked. Although the light from each individual VCSEL is coherent, the phase and frequencies (or wavelengths) of the light from each VCSEL are slightly different and therefore uncorrelated. For such an incoherent array comprising N elements producing the same power P, the on-axis power in the far-field is ~NP. However, if the array as a whole can be made coherent, in phase, and with a single frequency, the on-axis power in the far-field is N$^2$P and the width of the radiation pattern is reduced by ~1/N. Previous efforts to phase-lock arrays of VCSELs have used diffraction coupling [J. R. Legar, et. al., Appl. Phys. Lett., vol. 52, p. 1771, 1988]. and evanescent coupling. [H. J. Yoo, et. al., Appl. Phys. Lett., vol. 56, p. 1198, 1990]. Diffraction coupling depends on geometrical scattering of light and evanescent coupling requires that the optical field of adjacent array elements overlap. Both approaches impose restrictions on the array architecture. More importantly, these existing approaches have had very limited success, even in 1D edge-emitting arrays where both approaches have been extensively investigated. Recently, Choquette et al. has demonstrated phase locking in a VCSEL array using an anti-guide approach [D. K. Serkland, et. al., IEEE LEOS Summer Topical Meeting, p. 267, 1999].

A further challenge involves coupling light out of a source, such as a VCSEL. Such coupling may, for example, adversely affect the amount of light which is available to be coupled out of the VCSEL. Accordingly, it would be desirable to provide an efficient waveguide coupling structure, particularly for use with a VCSEL.

SUMMARY OF THE INVENTION

The present invention solves the aforementioned problems by using diffraction gratings to control polarization in a VCSEL waveguide grating coupler.

In an embodiment of the present invention, a waveguide grating coupler having first and second mirrors positioned to define a resonant cavity between them is provided. Within such embodiment, a waveguide includes a first grating formed as a part of the waveguide to couple light of a first polarization mode into the waveguide. The waveguide further includes a second grating positioned within the resonant cavity, wherein the second grating is orthogonal to the first grating and so that light coupled to the waveguide is enhanced by reducing light of a second polarization mode, which is different from the first polarization mode.

In another aspect of the present invention, a waveguide grating coupler having first and second mirrors is provided. Within such embodiment, the first mirror is positioned with respect to the second mirror so that light travels within a resonant cavity defined between the first and second mirrors. A waveguide having a core and cladding is also provided, wherein a first grating is formed as a part of the waveguide and proximate to the waveguide core, and wherein the first grating couples light in a first polarization mode to the waveguide. A second grating, formed as a part of the waveguide and within the cladding, is also provided to create a loss of light in a second polarization mode different from the first polarization mode within the resonant cavity, which results in an enhancement of the first polarization mode.

A method for coupling light is also provided, which includes the steps of positioning a resonant cavity between a first and second mirror; positioning a waveguide to couple light out of the resonant cavity; forming a first grating as a part of the waveguide core, wherein the first grating couples light having a first polarization mode to the waveguide; and forming a second grating, wherein the second grating is orthogonal to the first grating, and wherein the second grating reduces light having a second polarization mode different from the first polarization mode within the resonant cavity.

In another aspect of the present invention, a waveguide grating coupler includes a VCSEL with a waveguide incorporated into one of the VCSEL's Distributed Bragg Reflectors (DBR). Within such embodiment, two orthogonal gratings are integrated into the waveguide, wherein one of the gratings couples light into the waveguide and the other gratings control VCSEL polarization by introducing more loss to the polarization mode that does not couple to the waveguide than the polarization mode that does couple to the waveguide.

In yet a further aspect of the present invention, a waveguide grating coupler again includes a VCSEL with a waveguide incorporated into one of the VCSEL's Distributed Bragg Reflectors (DBR). Within this embodiment, however, a single two-dimensional grating is integrated into the waveguide to accomplish both polarization control and waveguide coupling.

In accordance with another embodiment of the present invention, a loss difference is imposed between the coupled polarization mode and the polarization mode that does not couple to the waveguide. Such loss differences may be in the form of diffraction loss differences between the coupled polarization mode and the polarization mode that does not couple to the waveguide.

In a preferred embodiment of the present invention, the polarization mode that is coupled to the waveguide is the TE mode, and the polarization mode that does not couple to the waveguide is the TM mode.

In accordance with the present invention, in an embodiment of the waveguide grating coupler using a single two-dimensional grating, an asymmetry in the duty cycles for the coupled polarization mode, versus the polarization mode that does not couple to the waveguide, can be employed to enable the desired loss difference to be achieved. In two-grating embodiments of the present invention, desired loss differences may be achieved through differences in duty cycle between the TE grating (the mode that is coupled) and the TM (the mode that is not coupled) grating.

In accordance with the present invention, desired loss differences may be achieved through differences in index contrast between TE and TM gratings.

In accordance with the present invention, desired loss differences may be achieved through differences in the thicknesses of TE and TM gratings.

In accordance with the present invention, desired loss differences may be achieved through differences in shape (grating profile) between TE and TM gratings.

In accordance with the present invention, desired loss differences may be achieved through differences in the position on the standing wave peak between TE and TM gratings.

In accordance with the present invention, desired loss differences may be achieved through differences in the position on the optical standing wave envelope between TE and TM gratings.

In accordance with the present invention, desired loss differences may be achieved in embodiments employing two grating through differences in reflectivity between TE and TM gratings, and in single two-dimensional embodiments through differences in reflectivity between TE and TM modes.

In accordance with the present invention, the waveguide may be positioned either inside or on top of the upper DBR, or inside the lower DBR of a VCSEL.

In accordance with the present invention, the waveguide and gratings may be composed of semiconductor materials.

In accordance with the present invention, the waveguide and gratings may be composed of dielectric materials.

A preferred embodiment of the present invention comprises a VCSEL with polarization control implemented with a grating integrated inside the cavity.

Another preferred embodiment of the present invention comprises a VCSEL with polarization control implemented with a grating integrated inside the upper DBR.

A further preferred embodiment of the present invention comprises a VCSEL with polarization control implemented with a grating integrated inside the lower DBR.

As will be appreciated upon consideration of the following detailed description of the invention and accompanying drawings, there are many advantages and features of the present invention, which in turn lead to many new and useful applications of the invention.

BRIEF DESCRIPTION OF THE DRAWINGS

FIG. 1 is an illustration of a resonant cavity enhance (RCE) waveguide grating coupler in accordance with the present invention.

FIG. 2 is an illustration of a hybrid RCE VCSEL/waveguide grating coupler in accordance with the present invention.

FIG. 3 is an illustration of a hybrid RCE photodetector/waveguide grating coupler in accordance with the present invention.

FIG. 4 is a schematic of a monolithic RCE waveguide grating coupler in which a mirror M1 is monolithically integrated with a waveguide structure and a mirror M2 on a semiconductor substrate in accordance with the present invention.

FIG. 5 is a simplified monolithic RCE VCSEL/waveguide grating coupler which can be realized using an epitaxial regrowth technique in accordance with the present invention.

FIG. 6 is a simplified monolithic RCE photodetector/waveguide grating coupler which can be realized using an epitaxial regrowth technique in accordance with the present invention.

FIG. 7 is a simplified monolithic RCE VCSEL/waveguide grating coupler which can be realized using a wafer bonding technique in accordance with the present invention.

FIG. 8 is a simplified monolithic RCE photodetector/waveguide grating coupler which can be realized using a wafer bonding technique in accordance with the present invention.

FIG. 29 is a diagram of peak wavelengths of a 1×5 VCSEL array in accordance with the present invention.

FIG. 30 is a diagram of mean wavelengths of a 1×5 VCSEL array in accordance with the present invention.

FIG. 31 is a diagram of an epitaxial structure for a single mode waveguide in accordance with the present invention.

FIG. 32 is a diagram of an epitaxial structure for a multi-mode waveguide in accordance with the present invention.

DETAILED DESCRIPTION OF THE INVENTION

Figure 9:
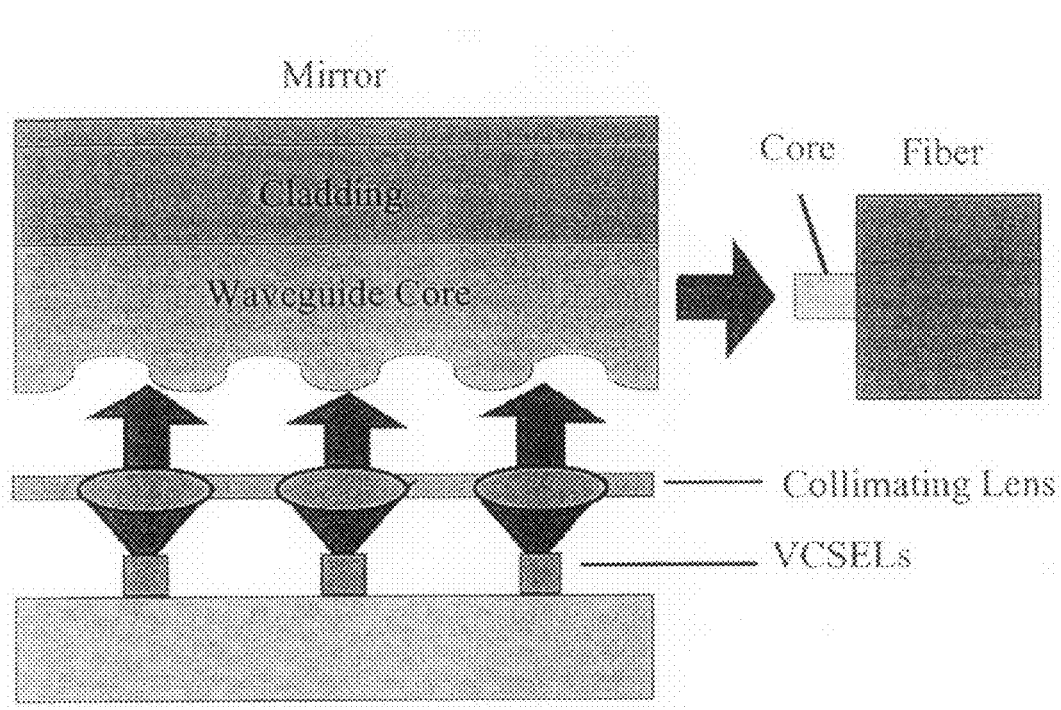
FIG. 9 is a simplified hybrid system with VCSELs coupled through a surface normal grating into a waveguide in accordance with the present invention.

A resonant cavity enhanced (RCE) waveguide grating coupler includes a surface-normal waveguide grating inserted into a Fabry-Perot cavity (FIG. 1). The Fabry-Perot cavity has two mirrors and, between them, a cavity which contains a waveguide grating layer. The mirror can be either a semiconductor layer, a semiconductor distributed bragg reflector (DBR) or a dielectric DBR. Semiconductor DBR mirrors can be a part of an optoelectronic device, particularly a vertical cavity surface emitting laser (VCSEL) or a photodetector. The thickness of the cavity should be designed in such a way that a phase matching condition is satisfied, for resonance. Light can be coupled into/out of an optical fiber through the surface-normal waveguide grating. A coupling efficiency into the waveguide layer can be greatly enhanced due to the large increase of the resonant optical field introduced by the Fabry-Perot cavity. Two approaches can be used to realize the RCE waveguide grating coupler: hybrid and monolithic.

FIG. 2 shows an example of a simplified hybrid RCE VCSEL/waveguide grating coupler which comprises a VCSEL and a waveguide structure which contains a waveguide layer with a surface-normal grating in combination with a mirror M2. The VCSEL serves as a mirror M1 as well as a light source. Collimating optics can be used to capture light from the VCSEL more efficiently and direct it into the waveguide.

The output of the VCSEL is coupled through a grating into a waveguide for edge emission from the waveguide structure. By incorporating a highly reflective mirror M2 into a VCSEL/waveguide grating system, waveguide coupling can be greatly enhanced by multiple reflections between the mirror M2 and the mirror M1. The multiple reflections cause the light to be continually directed back into the waveguide. The waveguide grating coupler then redirects this vertical light horizontally into the waveguide. Hence, by superposition, the waveguide coupled output power can be considerably increased.

FIG. 3 shows a simplified hybrid RCE photodetector/waveguide grating coupler which comprises a photodetector and a waveguide structure which contains a waveguide layer with a surface-normal grating in combination with a mirror M2. The photodetector can be served as a mirror M1. The photodetector can be either a non-resonant photodetector or an RCE photodetector.

Light from the waveguide is outcoupled through the surface-normal grating and then illuminated onto the photodetector. The waveguide grating coupler functions as a beam router which directs the horizontal light into the vertical light.

FIG. 4 shows a schematic of a monolithic RCE waveguide grating coupler in which a mirror M1 is monolithically integrated with a waveguide structure and a mirror M2 on a semiconductor substrate. The waveguide structure can be a part of M1 and inserted into any positions in M1. A monolithic RCE waveguide grating coupler has several advantages over the hybrid counterpart, including no need for external optics, easy alignment, and a simple package. This monolithic structure can be implemented using two technical approaches: epitaxial regrowth technique and wafer bonding technique.

FIG. 5 shows a simplified monolithic RCE VCSEL/waveguide grating coupler which can be realized using an epitaxial regrowth technique. The surface-normal grating is first fabricated into the waveguide layer using an etching technique. Then, an epitaxial regrowth is performed to grow the VCSEL structure using an epitaxial growth machine.

FIG. 6 shows a simplified monolithic RCE photodetector/waveguide grating coupler which can be realized using an epitaxial regrowth technique. The surface-normal grating is first fabricated into the waveguide layer using an etching technique. Then, an epitaxial regrowth is performed to grow the photodetector structure.

FIG. 7 shows a simplified monolithic RCE VCSEL/waveguide grating coupler which can be realized using a wafer bonding technique. Two epitaxial wafers are separately grown on semiconductor substrates using an epitaxial growth machine, a wafer A and a wafer B. The wafer A contains a waveguide structure and M2 while the wafer B contains a VCSEL (M1). The surface-normal grating is first fabricated on the wafer A using an etching technique. Then, wafer bonding is performed to fuse the wafers A and B. The wafer-fused monolithic RCE VCSEL/waveguide grating coupler has air/semiconductor gratings. These gratings are embedded between the wafers A and B. The efficiency of the grating can be enhanced by enclosing air in its grooves during the fabrication process. The air/semiconductor gratings have a large coupling efficiency due to the large difference between the refractive index of air and that of a semiconductor.

FIG. 8 shows a simplified monolithic RCE photodetector/waveguide grating coupler which can be realized using a wafer bonding technique. Two epitaxial wafers are separately grown on semiconductor substrates using an epitaxial growth machine, a wafer C and a wafer D. The wafer C contains a waveguide structure and M2 while the wafer D contains a photodetector (M1). The surface-normal grating is first fabricated on the wafer C using an etching technique. Then, wafer bonding is performed to fuse the wafers C and D. The wafer-fused monolithic RCE photodetector/waveguide grating coupler has air/semiconductor gratings. These gratings are embedded between the wafers C and D. The efficiency of the grating can be enhanced by enclosing air in its grooves during the fabrication process.

The monolithic RCE VCSEL/WGC structure offers a method to monolithically integrate active VCSELs and passive waveguide devices. This structure has the inherently bi-directional nature which enables simultaneous coupling into two opposite directions in the waveguide. In addition, by incorporating the photodetectors into the VCSEL/waveguide grating structure, the bi-directional coupling capability can further increase the flexibility in the design of complex optical devices and circuits, allowing entirely new hardware architectures to be implemented. These bi-directional devices can be utilized in applications such as optical communications, optical signal processing, and optical networks. Some of the specific applications are optical transceivers; distributed crossbar switches; coherent high power sources; multiplexers and demultiplexers.

Resonant Cavity Enhanced VCSEL/Waveguide Grating Coupler

In accordance with one embodiment of the present invention, a hybrid VCSEL/waveguide architecture is provided by which, for example, coherent high-power light sources can be achieved. The hybrid VCSEL/waveguide structure comprises a VCSEL array and a single waveguide with a periodic grating in combination with a substrate reflector (FIG. 9). The waveguide is attached to the VCSEL array through mechanical spacers. Optical coupling between the array elements is provided by the grating coupled waveguide. An optical waveguide with a series of gratings allows the distribution and coupling of light into and out of individual VCSEL elements, thereby locking each element into a coherent, single frequency array mode.

By incorporating a highly reflective substrate reflector into a VCSEL/waveguide grating system, waveguide coupling can be greatly enhanced by multiple reflections between the substrate reflector and the top VCSEL mirror. The multiple reflections cause the light to be continually directed back into the waveguide. The waveguide grating coupler then redirects this vertical light horizontally into the waveguide. Hence, by superposition, the waveguide coupled output power can be considerably increased. Unlike previous phase locking approaches, the distribution waveguide method can provide phase locking by controlling a precise amount of coupling between array elements independent of the element size and element spacing. The grating coupled waveguide provides a linear array of elements which can be extended into a 2D array with the integration of a waveguide coupler.

Theoretical Background

The waveguide grating coupler is a key component of the VCSEL/waveguide grating system. The performance of the system depends largely on the grating coupler. It is of considerable interest to develop predictions of the efficiency of the diffraction process in terms of the waveguide and grating parameters. The coupling efficiency of a grating coupler is dependent on several parameters such as the grating depth, the index modulation of the grating, and the type of grating.

Several theoretical models have been developed to calculate the waveguide-grating interactions in FIG. 9: Simplified hybrid system with VCSELs coupled through a surface normal grating into a waveguide. Waveguide Core VCSELs Collimating Lens Cladding Mirror Fiber Core 3 Patent terms of the tooth profile, composition, and position of the grating with respect to the optical waveguide. One model uses a modal formulation based on a Floquet-Bloch approach [Hadjicostas, et. el., IEEE JQE, Vol. 26, No. 5, p. 893, May 1990]. Another model relies on a boundary element method [Evans, et. al., IEEE JQE, Vol. 27, No. 6, p. 1594, June 1991] and allows analysis of arbitrary grating profiles. The predictions of the Floquet-Bloch model have been compared to a complete, self-consistent experimental measurement of the wavelength dependence of reflection, transmission, and outcoupling from a Bragg second-order grating. Comparisons were made with the calculations for 50% duty cycle square-wave gratings with tooth depths equal to the experimentally measured values ranging from 40 nm to 600 nm. Close agreement between the theoretical and experimental results were obtained [Ayekavadi, et. al., SPIE meeting, Los Angeles, January 1991].

Several potential waveguide structures were evaluated in terms of the compositions and thicknesses of the waveguide layers using models mentioned above. A detailed design process can be found in provisional patent application Ser. No. 60/207,590, filed May 26, 2000, entitled "High-Power Coherent Arrays of Vertical Cavity Surface Emitting Lasers", and non-provisional patent application, filed on even date herewith, entitled "High-Power Coherent Arrays of Vertical Cavity Surface Emitting Lasers", inventors Peter Guilfoyle, Gary S. Evans, and Cheng C. Ko, and assigned to the same assignee as the present application, the subject matter of both is incorporated herein by reference. The waveguide structures were based on GaAs and AlGaAs semiconductor materials. They were designed for single mode and multimode operations at 850 nm. A simple model was developed to describe the coupling process in a VCSEL/waveguide grating system. This model does not require rigorous mathematical descriptions and thus gives better understanding of the coupling process. The coupling characteristics were studied as a function of the diffraction efficiency and the reflectivities of the VCSEL and the waveguide substrate.

Waveguide and Grating Design

Figure 10:
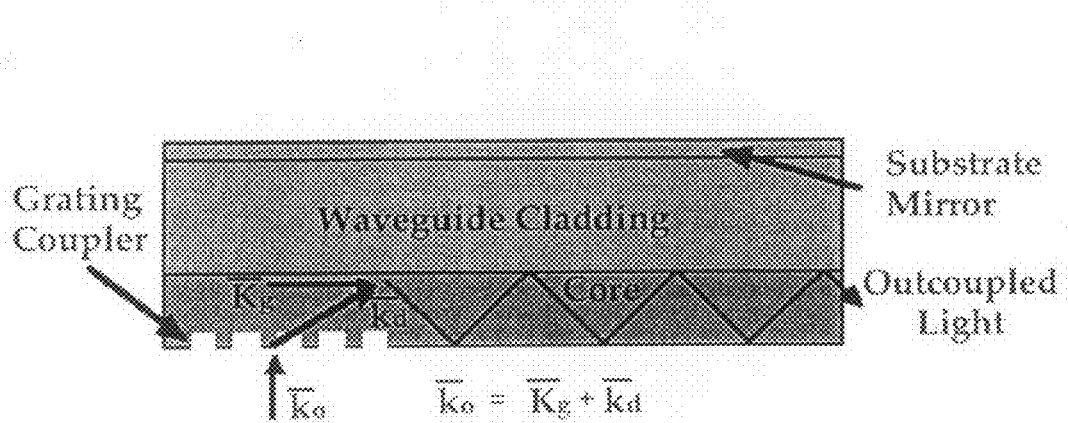
FIG. 10 is a schematic drawing of a waveguide structure where the VCSEL light is coupled through the surface-normal second-order grating coupler and showing the phase-matching condition in accordance with the present invention.

FIG. 10 shows a schematic drawing of a waveguide structure where the VCSEL light is coupled through the surface-normal second-order grating coupler. The phase matching condition dictates that the difference between the wavevector of the incident beam and the wavevector of the diffracted beam has to be conserved through the wavevector of the surface grating. As a result of the phase matching condition, the grating period, $\Lambda$, for the surface normal grating coupler is chosen to be $\Lambda = \lambda_O / \eta_{\mathit{eff}}$, where $\lambda_O$ is the wavelength of the incident light and $\eta_{\mathit{eff}}$ is the effective index of the guided mode [Gary A. Evans and J. M. Hammer, "Surface Emitting Semiconductor Lasers and Arrays", Academic Press, 1993.]

Figure 11:
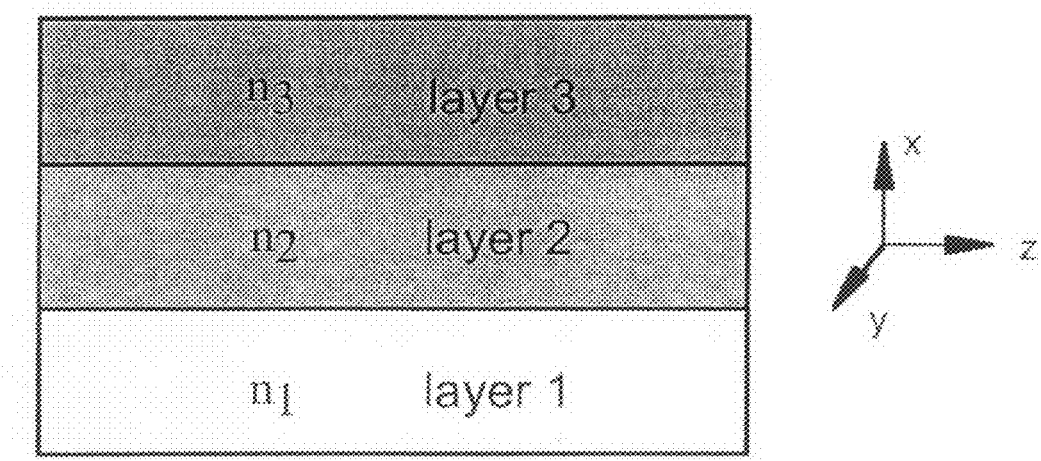
FIG. 11 is a schematic diagram of a three-layer waveguide structure in accordance with the present invention.

A typical three-layer waveguide is shown in FIG. 11. Layer 2 is the waveguide core and layers 1 and 3 are the cladding layers. $n_i$ is the refractive index of layer i. Two different waveguide structures were initially examined; asymmetric and symmetric. An asymmetric waveguide has different refractive indices in the cladding layers ($n_1 \neq n_3$), while the refractive indices in the cladding layers are the same in a symmetric waveguide ($n_1 = n_3$). However, an asymmetric waveguide structure was chosen for this program. It was found from the design process that a symmetric waveguide has several disadvantages over an asymmetric waveguide structure. These include the requirement of an extra epitaxial layer growth and a low optical coupling efficiency due to low index difference at the grating interface. The waveguide were designed for both singlemode and multimode operations. The number of modes in the waveguide is dependent on the thickness of the waveguide core layer as well as the index difference between the waveguide and cladding layers. A detailed description of the waveguide and grating structures can be found in the above-referenced provisional and non-provisional patent applications.

Coupling of a VCSEL/Waveguide Grating System

In order to analyze the coupling behavior in a VCSEL/waveguide grating system, a relatively simple model is also developed. This model does not require rigorous mathematical descriptions and thus gives better understanding of the coupling process. Such a model can help in elucidating the basic mechanisms of the coupling process and allows the calculation of the waveguide-coupled output power in this structure. The coupling characteristics are studied as a function of the diffraction efficiency and the reflectivities of the VCSEL and the waveguide substrate. For simplicity, we initially calculate the coupling of a single cell of the VCSEL/waveguide grating system. They are then used to expand the calculation to a two element VCSEL/waveguide grating system. The calculations performed for a single and a two element VCSEL/waveguide grating system can be easily expanded to an N VCSEL/waveguide grating system.

Single VCSEL/Waveguide Grating System

Figure 12:
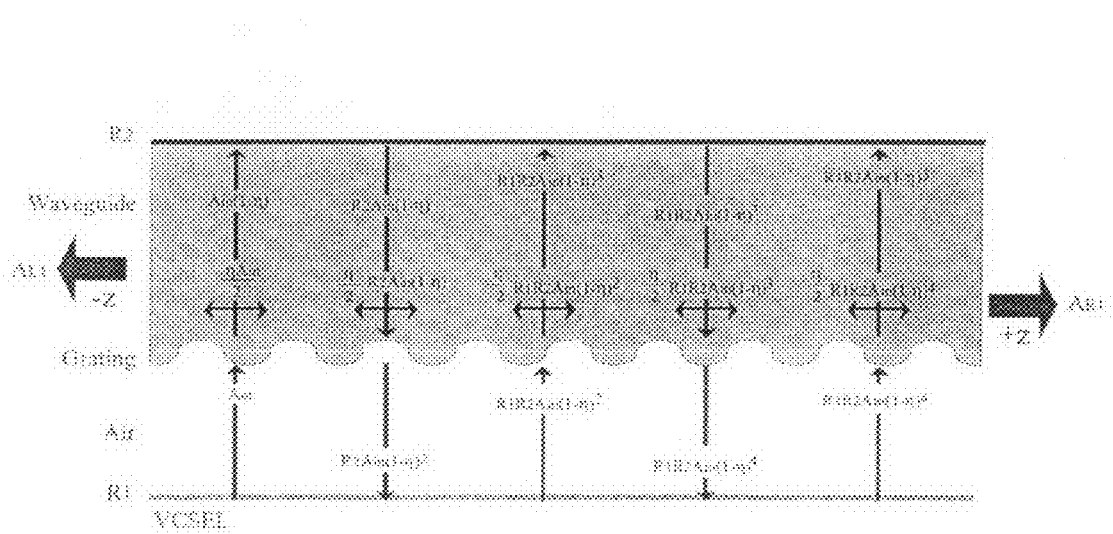
FIG. 12 is a diagram illustrating a mathematical model showing the coupling of a single VCSEL output into a waveguide through the surface normal grating in accordance with the present invention.

FIG. 12 is a mathematical model showing the coupling of a single VCSEL output into a waveguide through the surface normal grating. Collimated light from the VCSEL is emitted in transverse electromagnetic mode $TEM_{00}$ ($A_{in}$). This is depicted by the arrows in FIG. 12. The surface normal grating is designed to separate first-order modes and couple these modes into the waveguide. The zero-order mode (undiffracted light) is reflected back by the reflection from the mirror on the waveguide. Through reflections of $R_1$ and $R_2$ the zero-order mode sustains the amplitude of the first-order modes. This is achieved through superposition.

The waveguide-coupled output power is calculated by summing all the contributions resulting from the multiple reflections at the interfaces $R_1$ and $R_2$ as shown in FIG. 12. The output power coupled into the +z direction $A_{R1}$ is given by:

$$\begin{aligned} A_{R1} &= \frac{\eta}{2} + \frac{\eta}{2} R_2(1-\eta) + \frac{\eta}{2} R_1 R_2 (1-\eta)^2 + \frac{\eta}{2} R_1 R_2^2 (1-\eta)^3 + \\ & \quad \frac{\eta}{2} R_1^2 R_2^2 (1-\eta)^4 + \cdots \\ &= \frac{\eta}{2} [1 + R_1 R_2 (1-\eta)^2 + R_1^2 R_2^2 (1-\eta)^4 + R_1^3 R_2^3 (1-\eta)^6 + \\ & \quad \cdots ] + \frac{\eta}{2} [R_2(1-\eta) + R_1 R_2^2 (1-\eta)^3 + R_1^2 R_2^3 (1-\eta)^5 + \cdots ] \\ &= \frac{\eta}{2} \left[ \frac{1}{1 - R_1 R_2 (1-\eta)^2} + \frac{R_2(1-\eta)}{1 - R_1 R_2 (1-\eta)^2} \right] \\ &= \frac{\eta}{2} \frac{1 + R_2(1-\eta)}{1 - R_1 R_2 (1-\eta)^2}. \end{aligned} \quad (1)$$

where $R_1$ and $R_2$ are the reflectivities of the VCSEL and the substrate reflector; $A_{R1}$ is normalized to the incident beam $A_{in}$; $\eta$ is the diffraction efficiency of the surface-normal grating coupler. To simplify the equation, infinite numerical series are approximated using the following relation;

$$\sum_{k=0}^{\infty} aq^k = \frac{a}{1-q} \quad |q| < 1 \quad (2)$$

Equation (1) is derived by assuming that the diffraction efficiency from the waveguide is the same as that from the VCSEL and there is no reflection at the grating coupler. It is also assumed that the zero-order mode reflected from the substrate mirror is in phase with the component diffracted into the waveguide. The phase matching condition is determined by the thickness of the cladding layers below the waveguide. In addition, the absorption and scattering losses in the waveguide are assumed to be minimal.

The output power coupled into the −z direction $A_{1L}$ can be calculated in a similar way to $A_{R1}$. However, it is easily seen that $A_{L1}=A_{R1}$, since, in this calculation, a symmetric grating is assumed. When the grating is symmetric, the coupling processes are also symmetric. Therefore, light from the VCSEL is coupled by the surface normal grating coupler and is split into two different directions at the same time with the same magnitude.

Figure 13A:
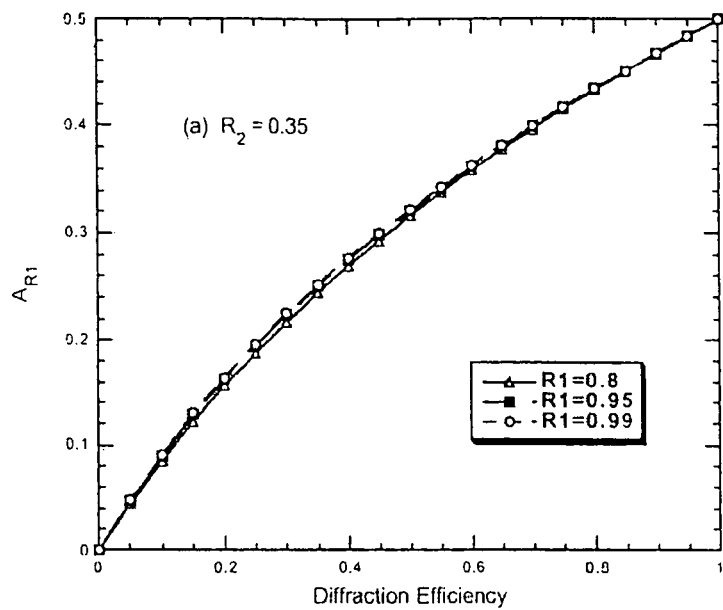
FIGS. 13A and 13B are graphs of the calculated output power coupled into the waveguide as a function of diffraction efficiency in accordance with the present invention.
Figure 13B:
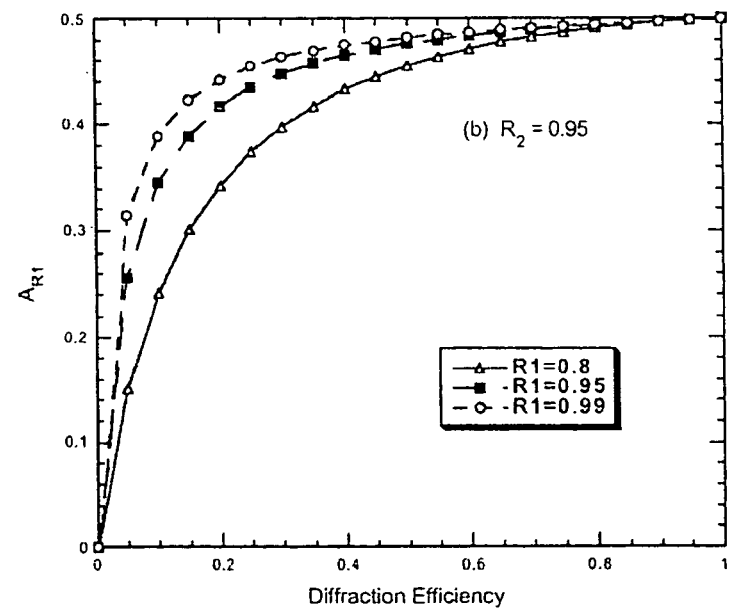

FIGS. 13(A) and 13(B) shows the calculated output power coupled into the waveguide as a function of the diffraction efficiency for different values of $R_1$. For an $R_2$ of 0.35, which is shown in FIG. 13(A), the normalized output power approximately exhibits a linear dependence on the diffraction efficiency for all values of $R_1$. A reflectivity of $R_2=0.35$ is typical of a GaAs-air interface. In order to increase the guided output, a large $\eta$ is required, which is difficult to realize due to the problems of waveguide materials and grating fabrication technology. The coupling characteristics can be substantially changed if a substrate mirror is used. The coupled output power can be increased by incorporating a highly reflective mirror into the backside of the waveguide structure. This can be accomplished using a simple gold mirror or a semiconductor (dielectric) mirror such as an epitaxially grown distributed bragg reflector (DBR).

FIG. 13(B) shows the calculated output power for a large $R_2$ of 0.95. Unlike the previous example in FIG. 13(A), the coupled output exhibits a nonlinear dependence on $\eta$ in which the output becomes saturated rapidly with $\eta$. For example, for $\eta$ of 0.1, the normalized output power is >0.4 for $R_1=0.99$. This is four times larger than that of $R_2=0.35$. Therefore, the waveguide grating structure with a highly reflective mirror allows the use of low diffraction efficiency for large coupling efficiency of the VCSEL into the waveguide. As can be seen in FIG. 5, the effect of the substrate reflector on the coupled output power becomes smaller as $\eta$ increases. This is because for high $\eta$, a large amount of VCSEL light is diffracted into the waveguide before it reaches the substrate mirror. For $\eta$ of 1, the coupled output approaches 0.5 normalized power, which is the theoretical maximum. In this case, all the light from the VCSEL is converted into the first-order modes in the waveguide in a single pass.

Two Element VCSEL/Waveguide Grating System

Figure 14:
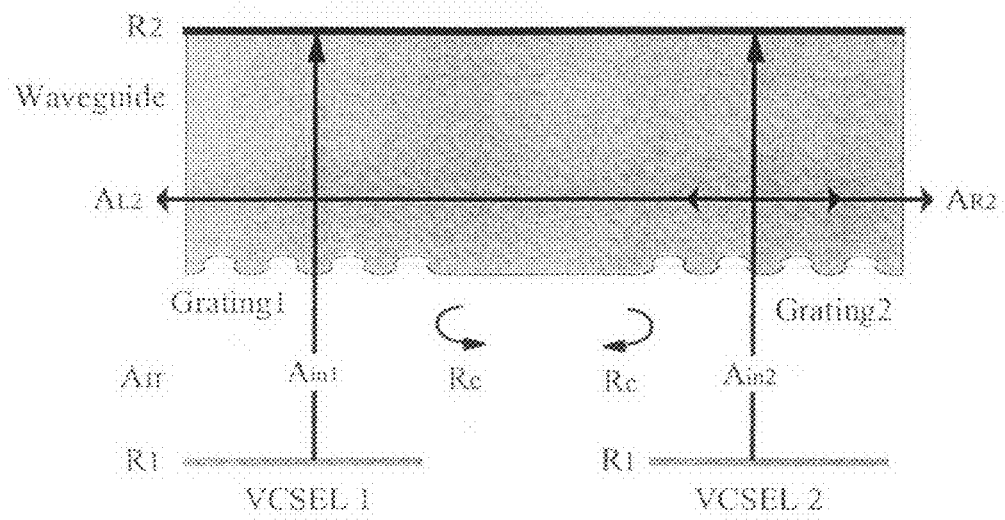
FIG. 14 is a schematic diagram of a two VCSEL/waveguide system in accordance with the present invention.

A two element VCSEL/waveguide grating structure is shown in FIG. 14. Light from each source (VCSEL 1 and VCSEL 2) is coupled by the grating coupler and diffracted equally to the left and to the right of each grating (Grating 1 and Grating 2). The waveguide allows the light to travel in either direction. The first-order diffracted light can be transmitted through the grating and reflected back from the grating. The light can be also coupled back into the VCSELs. It is estimated that only a small amount of optical power is required to achieve phase-locking in the longitudinal direction (z). The light inputs to the gratings from the VCSELs are defined by $A_{in1}$ and $A_{in2}$. The light output on the right (left) side of the waveguide is designated as $A_{R2}$ ($A_{L2}$). It includes the following optical contributions: light from VCSEL 2 through Grating 2, light from VCSEL 1 through Gratings 1 and 2; and light from VCSELs 1 and 2 which experiences multiple reflections due to the in-plane reflections of the gratings. The in-plane reflectivity from the waveguide grating is designated as $R_c$.

The waveguide-coupled output power is calculated by summing all the contributions described above and is given by:

$$A_{R2} = M_2 M_1 A_{in1} + (1 + M_2 S) A_{in2} \quad (3)$$

$$A_{L2} = (1 + M_2 S) A_{in1} + M_2 M_1 A_{in2} \quad (4)$$

where $$M_1 = \frac{n}{2} \frac{1 + R_2(1-\eta)}{1 - R_1 R_2 (1-\eta)^2} \quad (5)$$

$$M_2 = \frac{K}{1 - S^2} \quad (6)$$

$$K = (1 - R_c)[(1-n) + M_1 R_1 \eta] \quad (7)$$

$$S = R_c + (1 - R_c) M_1 R_1 \eta \quad (8)$$

$M_1$ is the output power for a single VCSEL/waveguide structure and $M_2$ is a coupling coefficient due to multiple reflections between Gratings 1 and 2. K and S are the transmission and reflection coefficients of the grating, respectively. It is assumed in this calculation that all the gratings are symmetric and their properties are the same.

Figure 15A:
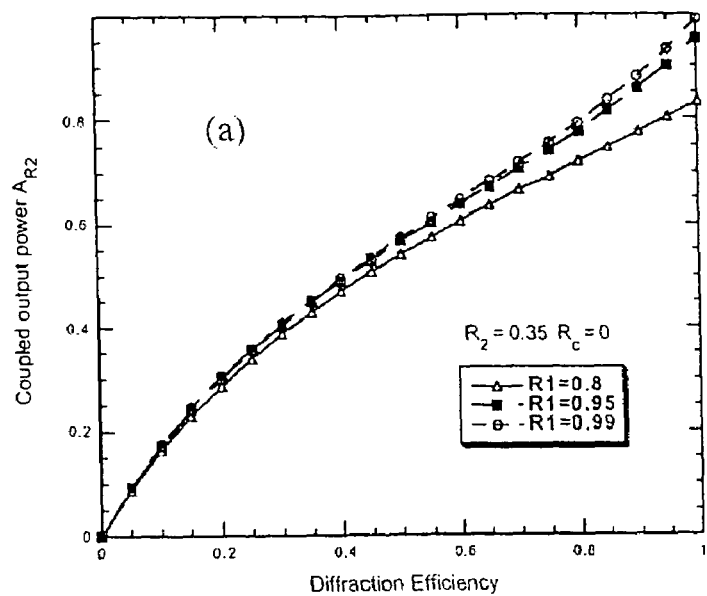
FIGS. 15A and 15B are graphs of the calculated waveguide output for a two VCSEL/waveguide grating system as a function of diffraction efficiency in accordance with the present invention.
Figure 15B:
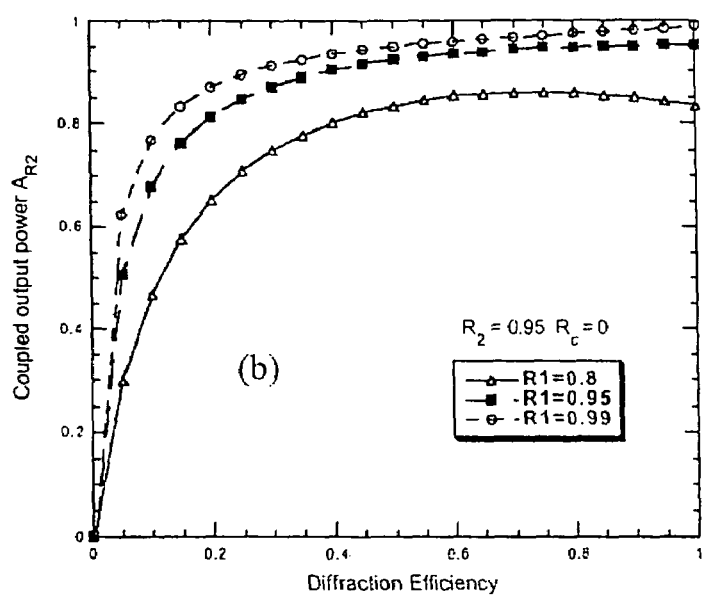

In FIG. 15, the output for $A_{2R}$ has been calculated for various $R_1$ values for two different $R_2$ of 0.35 (a) and 0.95 (b). The light output is plotted versus the diffraction efficiency of the waveguide grating. In this calculation, it is assumed that $A_{in1}$ is equal to $A_{in2}$. The values have been normalized to $A_{in1}$. The in-plane grating reflectivity, $R_c$ is assumed to be zero. As shown in FIG. 15, the output power shows a trend similar to the case of a single VCSEL/waveguide structure. Waveguide coupling can be considerably enhanced by using a highly reflective mirror on the backside of the waveguide. As $\eta$ increases, the output is increased rapidly, and is saturated with a small value of $\eta$ for $R_2$=0.95. The output power becomes approximately twice larger in magnitude than that of the single cell. This is because of an increase in the number of VCSELs. The coupling efficiency is also increased with an increase in VCSEL reflectivity. It is expected that when $R_1$ increases, the amount of reflected light from the VCSELs will be enhanced, giving rise to the increase in the coupled power. The output power coupled into the $-z$ direction, $A_{L2}$ can be calculated using Equation (4). However, it is easily seen that $A_{L2}$=$A_{R2}$, since $A_{in1}$=$A_{in2}$ is assumed.

N VCSEL/Waveguide Grating System

The calculations performed for a single and a two VCSEL/ waveguide grating systems can be expanded to an N VCSEL/ waveguide grating system. FIG. 8 shows an N VCSEL/ waveguide grating structure. The light inputs to the gratings from the VCSELs are defined by $A_{in1}$, $A_{in2}$, and $A_{inN}$. The light output on the right (left) side of the waveguide is designated as $A_{RN}$ ($A_{LN}$).

Figure 16:
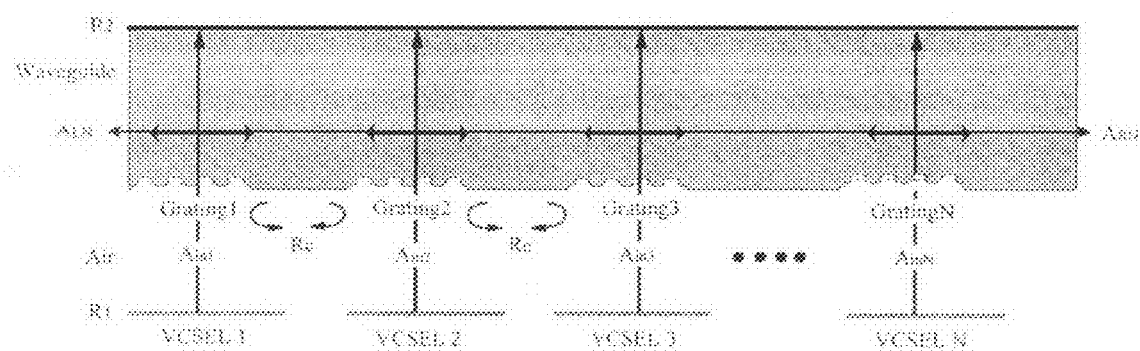
FIG. 16 is a schematic diagram of an N VCSEL/waveguide grating structure in accordance with the present invention.

The light outputs from the VCSELs will travel bidirectionally in the waveguide. In one direction, for example +z direction, the light may encounter from 1 to N gratings before reaching the right end of the waveguide. The light in the other direction ($-z$) may also experience more than one grating. In the structure shown in FIG. 16, each VCSEL makes different contributions to the output power depending on the position of the VCSEL. For example, the VCSEL N makes the most contribution to $A_{RN}$, while VCSEL 1 makes the least contribution to $A_{RN}$. This is because light output from VCSEL 1 should travel through N gratings to reach the right end of the waveguide, while light from VCSEL N encounters only one grating. When a light beam goes through a grating, the transmitted light output is decreased due to in-plane reflections at the grating as well as radiation losses into the VCSEL and the substrate mirror. If there is no in-plane reflection from the grating and the reflectivities of the VCSEL and substrate mirror are unity, then there will be no loss in the waveguide grating system. Hence, the light outputs from all the VCSELs will be diffracted into the waveguide and travel in the waveguide without loss.

The output power coupled into the waveguide in +z direction, $A_{RN}$ can be given by:

$$A_{RN} = \prod_{i=1}^{N} M_i A_{in1} + \prod_{i=3}^{N} M_i(1 + M_2 b_1) M_1 A_{in2} + \qquad (9)$$
$$\prod_{i=4}^{N} M_i(1 + M_3 b_2) M_1 A_{in3} +$$
$$\prod_{i=5}^{N} M_i(1 + M_4 b_3) M_1 A_{in4} + \cdots + \prod_{i=N}^{N} M_i(1 +$$
$$M_{N-1} b_{N-2}) M_1 A_{inN-1} + (1 + M_N b_{N-1}) M_1 A_{inN}$$

-continued
$$A_{LN} = (1 + M_N b_{N-1}) M_1 A_{in1} + \prod_{i=N}^{N} M_i(1 + \qquad (10)$$
$$M_{N-1} b_{N-2}) M_1 A_{in2} + \cdots + \prod_{i=4}^{N} M_i(1 +$$
$$M_3 b_2) M_1 A_{inN-2} + \prod_{i=3}^{N} M_i(1 + M_2 b_1) M_1 A_{inN-1} +$$
$$\prod_{i=1}^{N} M_i A_{inN} \text{ where}$$

$$M_i = \frac{K}{1 - b_{i-1} S} \text{ for } i \geq 2 \qquad (11)$$

$$b_1 = S \qquad (12)$$

$$b_i = b_1 + K M_i b_{i-1} \text{ for } i \geq 1 \qquad (13)$$

Here, $b_i$ is the reflection coefficient of the waveguide with i gratings. $M_i$ is the coupling coefficient due to multiple reflections in an i waveguide grating system. K and S, which are given in equations 7 and 8, are the transmission and reflection coefficients of a single grating, respectively.

Figure 17:
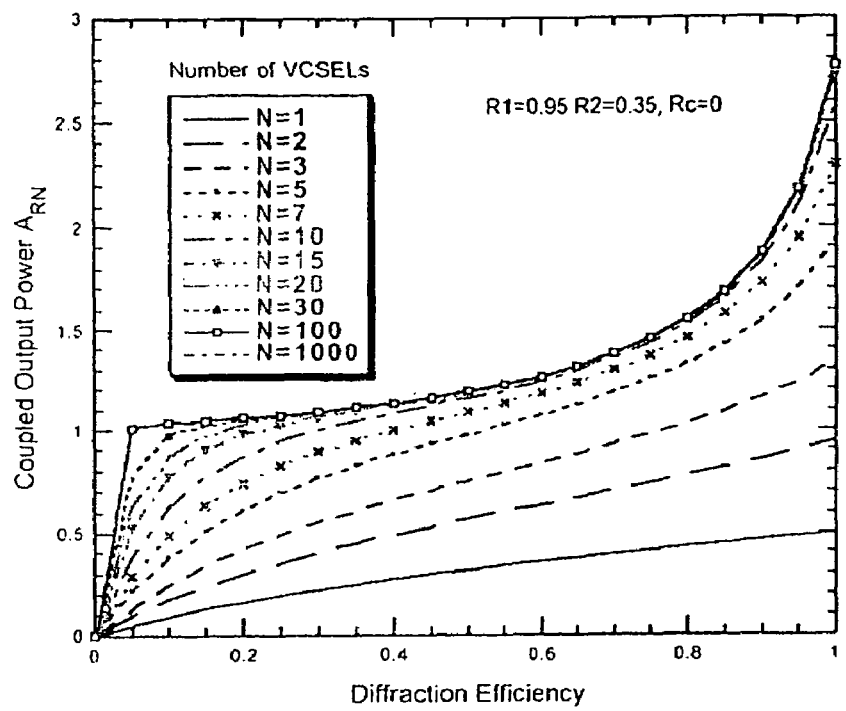
FIG. 17 is a graph of the calculated waveguide output for an N VCSEL/waveguide grating system as a function of diffraction efficiency for different number of VCSELs in accordance with the present invention.

The calculation was performed using a Mathcad program to obtain the coupled output power for various parameters. In FIG. 17, the waveguide coupled output power is plotted as a function of diffraction efficiency of the grating coupler. The simulations were performed for the number of VCSELs from 1 to 1000 for $R_1$=0.95, $R_2$=0.35, and $R_c$=0. It was assumed that all the VCSEL outputs are the same; $A_{in1}$=$A_{in2}$= ... = $A_{inN}$. As shown in the graph, the coupled output power is increased with the number of VCSELs as well as with the diffraction efficiency. A larger number of VCSELs produce more diffracted light coupled into the waveguide and hence increase the out-put power. However, as seen in the figure, the coupled output is saturated to a small value with a small number of VCSELs. For example, the output is saturated with only 10 VCSELs for $\eta$ of >~0.5. Increasing the number of VCSELs beyond 10 will not cause the output power to be further increased. As the number of VCSELs or gratings is increased, the more loss is introduced into the system. Since the reflectivities of the VCSELs and the substrate mirror are not unity, there are always radiation losses into the air via the waveguide substrate and the VCSEL.

When the number of VCSELs increases, the waveguide coupled light from those VCSELs will be increased. In order for the light generated from those VCSELs to contribute to the output, the coupled light should be larger than the loss that is introduced into the system by those VCSELs. As previously mentioned, the optical contributions of the VCSELs to $A_{RN}$ is position dependent. Therefore, the light will experience more loss as it travels through more gratings in the waveguide. For this case of $R_2$=0.35, most of the light is lost through the waveguide substrate into the air.

Figure 18:
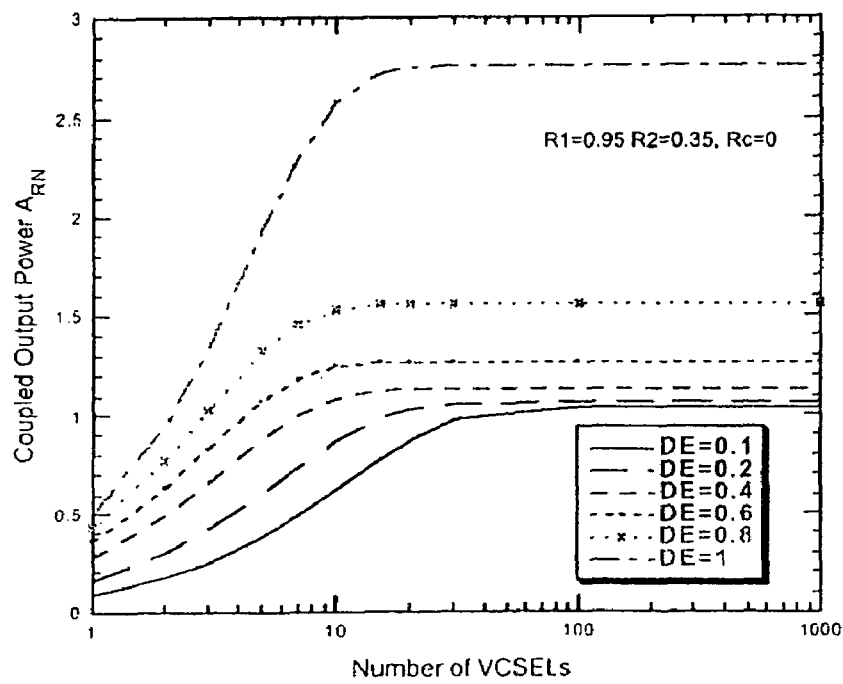
FIG. 18 is a graph of the coupled output power for an N VCSEL/waveguide grating system as a function of diffraction efficiencies in accordance with the present invention.

In FIG. 18, the coupled output power $A_{RN}$ is replotted as a function of the number of VCSELs for different diffraction efficiencies of 0.1, 0.2, 0.4, 0.6, 0.8, and 1. The figure shows clearly the effect of the number of VCSELs on the output power. The output is rapidly saturated for a small number of VCSELs. $A_{RN}$ has a maximum value of ~2.8 for $\eta$=1. As $\eta$ decreases, the number of VCSELs limiting the output becomes larger. For example, the number of VCSELs is increased from ~10 for $\eta$=1 to ~30 for $\eta$=0.1.

Figure 19:
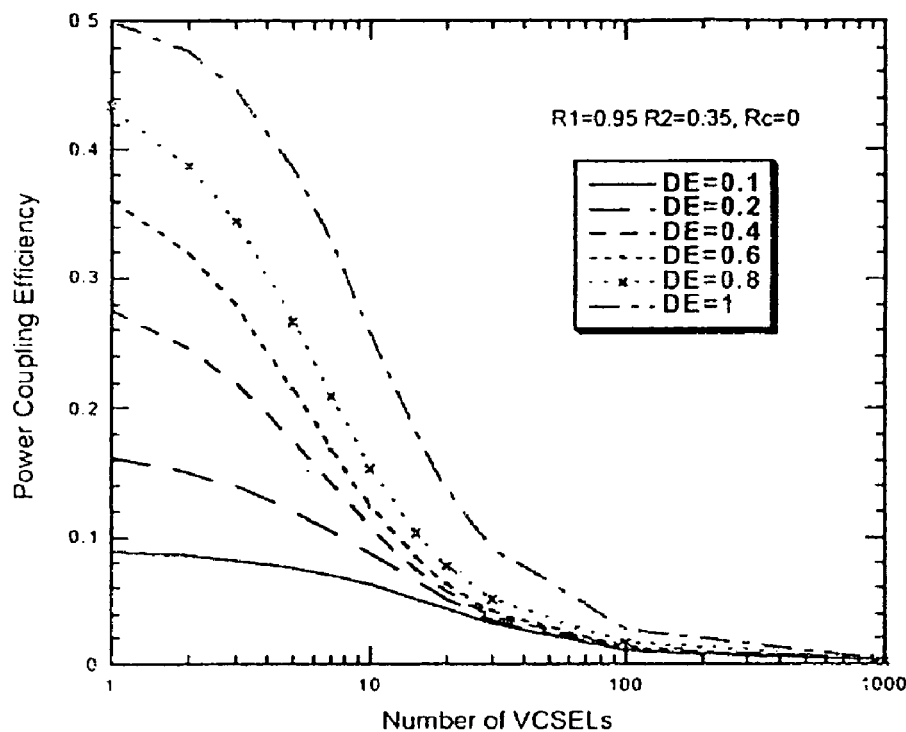
FIG. 19 is a graph of the power coupling efficiency for an N VCSEL/waveguide grating system as a function of the number of VCSELs for different diffraction efficiencies in accordance with the present invention.

FIG. 19 shows the power coupling efficiency plotted as a function of the number of VCSELs for $R_1$=0.95, $R_2$=0.35, and $R_c$=0. The power coupling efficiency of a VCSEL/waveguide grating system is defined as the waveguide coupled output power divided by the number of VCSELs. This can be used as a figure-of-merit to determine an optimum number of VCSELs in an array in order to produce a coherent high power laser output. As can be seen in the graph, the coupling efficiency is strongly dependent on the diffraction efficiency of the grating. As the diffraction efficiency increases, the coupling efficiency increases. The maximum of the coupling efficiency becomes 0.5 for a single VCSEL/waveguide system with $\eta$=1. This is because the half of the first-order diffracted light is equally split into two directions. In addition, an increase in the number of VCSELs causes the power coupling efficiency to be reduced. This is mainly due to the radiation loss into the air resulting from the low reflectivity of the substrate mirror of 0.35. From this calculation, it is expected that to produce the output power of 0.87 mW, 10 VCSELs are required for the case of $\eta$=0.2.

Figure 20:
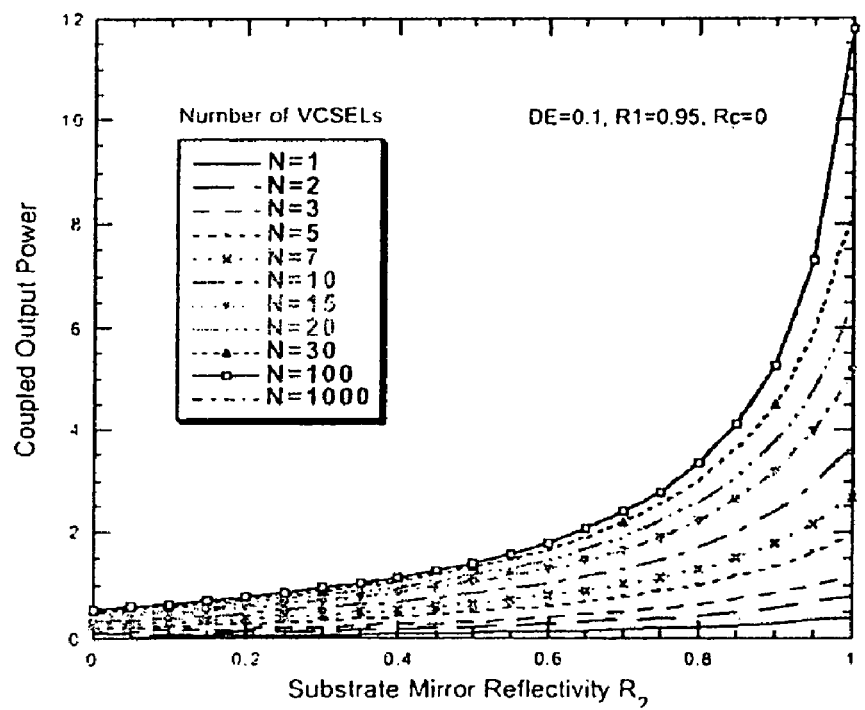
FIG. 20 is a graph of the coupled output power for an N VCSEL/waveguide grating system as a function of the substrate mirror reflectivity for a different number of VCSELs in accordance with the present invention.

As discussed previously, waveguide coupling can be considerably enhanced by incorporating a highly reflective mirror into the waveguide structure. The substrate mirror redirects light emitted toward the substrate, thereby increasing the coupling into the waveguide. FIG. 20 shows the coupled output power as a function of the substrate mirror reflectivity $R_2$. In this calculation, it is assumed that $\eta$=0.1, $R_1$=0.95, and $R_c$=0. From this figure, it is clearly seen that there is a strong dependence of the coupling efficiency into the waveguide on the substrate mirror reflectivity. The coupled output power is increased with the substrate mirror reflectivity. For the case of 100 VCSELs, it increases from ~1 for $R_2$=0.35 up to ~7.5 for $R_2$=0.95.

Figure 21:
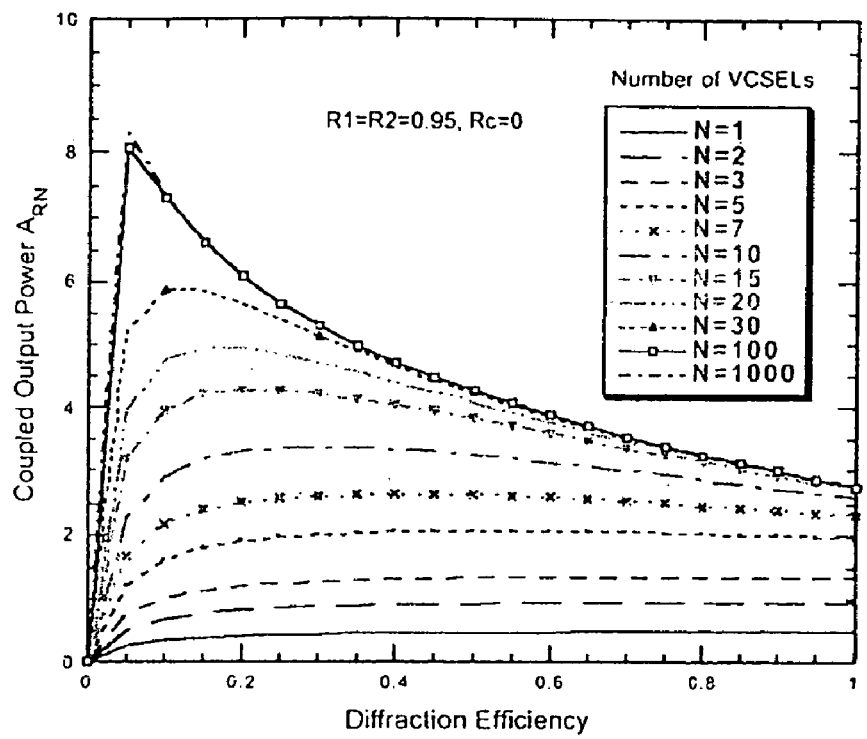
FIG. 21 is a graph of the calculated waveguide output for an N VCSEL/waveguide grating system as a function of diffraction efficiency for different number of VCSELs in accordance with the present invention.

FIG. 21 shows the output power coupled into the waveguide versus the diffraction efficiency of the grating for different number of VCSELs. The calculation is performed for $R_1$=0.95, $R_2$=0.95, and $R_c$=0. The number of VCSELs is varied from 1 to 1000. The output power is increased with the number of VCSELs. However, for a large value of $\eta$, the coupled output is rapidly saturated to a small value with a small number of VCSELs. This is similar to the case of $R_1$=0.95, $R_2$=0.35, and $R_c$=0, which is shown in FIG. 17. This is mainly because the effect of the substrate mirror on the coupling efficiency becomes smaller as $\eta$ increases. For a large $\eta$, a large amount of VCSEL light is coupled into the waveguide before it reaches the substrate mirror. For a small $\eta$, the output power is considerably increased with the number of VCSELs. This is compared to the case for $R_2$=0.35 (see FIG. 17).

Figure 22:
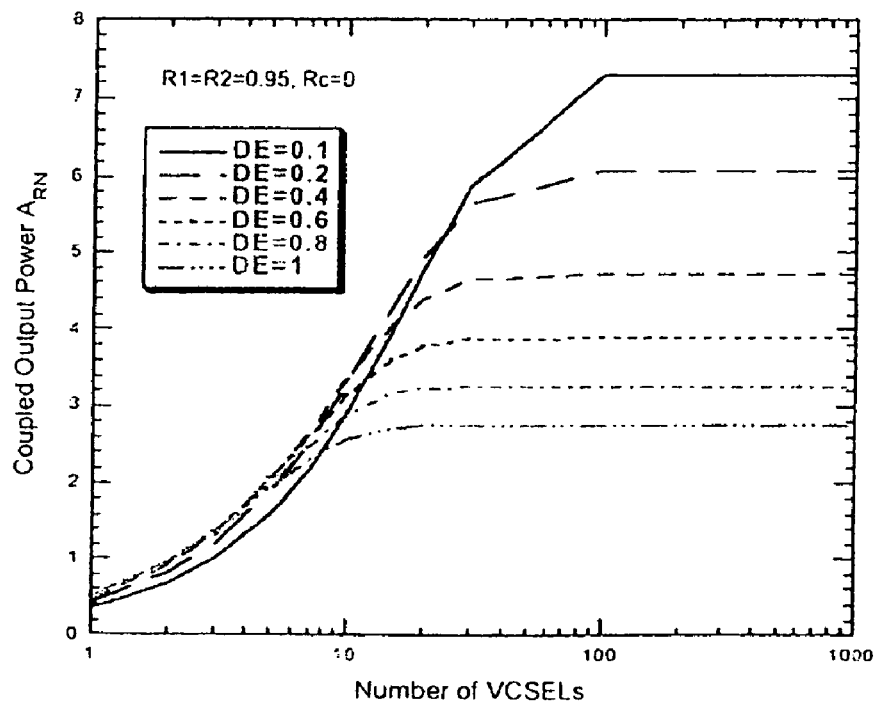
FIG. 22 is a graph of the coupled output power for an N VCSEL/waveguide grating system as a function of different diffraction efficiencies in accordance with the present invention.

In FIG. 22, the coupled output power is replotted versus the number of VCSELs for different diffraction efficiencies. The number of VCSELs has a pronounced effect on the coupling efficiency. The output is saturated with increasing the number of VCSELs. For a small $\eta$, the output is slowly saturated for a large number of VCSELs. However, as $\eta$ increases, the number of VCSELs limiting the output becomes smaller. Unlike the previous example in FIG. 18, the coupled output exhibits a monotonous decrease with $\eta$ for a large number of VCSELs. The output power approaches ~7.5 for $\eta$=0.1 with ~100 VCSELs, while it reaches only ~2.8 for $\eta$=1 with ~15 VCSELs.

Figure 23:
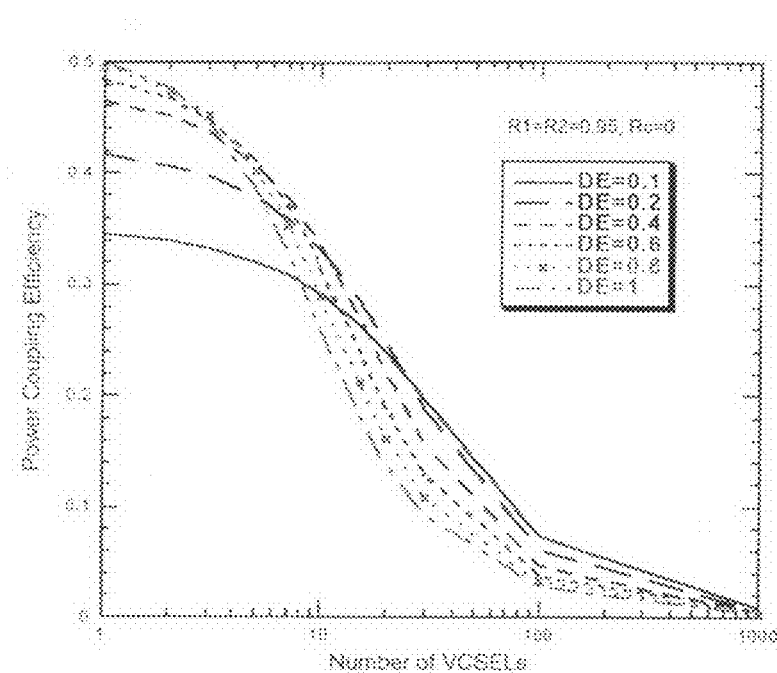
FIG. 23 is a graph of the power coupling efficiency for an N VCSEL/waveguide grating system as a function of the number of VCSELs for different diffraction efficiencies in accordance with the present invention.

FIG. 23 illustrates the power coupling efficiency versus the number of VCSELs for $R_1$=0.95, $R_2$=0.95, and $R_c$=0. The coupling efficiency has a strong dependence on the number of VCSELs. As the number of VCSELs increases, the power coupling efficiency decreases. However, as expected, the coupling efficiency is much higher than that for $R_2$=0.35 as shown in FIG. 19. For $\eta$ of 0.2, the coupling efficiency is 0.33 for 10 VCSELs. This is compared to 0.087 for $R_2$=0.35. Therefore, a 10 element VCSEL/waveguide grating system can produce the output power of 3.3 mW for $\eta$ of 0.2. As a result, large coupling efficiency of the VCSEL into the waveguide can be realized using the waveguide grating structure with a highly reflective mirror.

Although waveguide coupling can be enhanced by using a highly reflective mirror on the backside of the waveguide structure, the power coupling efficiency is still relatively low. There are several ways to enhance the coupled output power. One possible method is to put a highly reflective coating on one of the facets of the waveguide structure, which is not the output port. As previously discussed, the coupled output powers into +z and −z directions are the same if all VCSEL inputs ($A_{in1}$, $A_{in2}$, and $A_{inN}$) are the same. That is, $A_{RN}=A_{LN}$. The idea is to use a highly reflective mirror to reflect back $A_{LN}$ to the waveguide. The output power coupled into +z direction can be enhanced by multiple reflections between the facet reflector and the waveguide gratings. The waveguide structure should be designed in such a way that the reflected light from the facet of the waveguide is added in phase with the guided modes in the waveguide.

Figure 24:
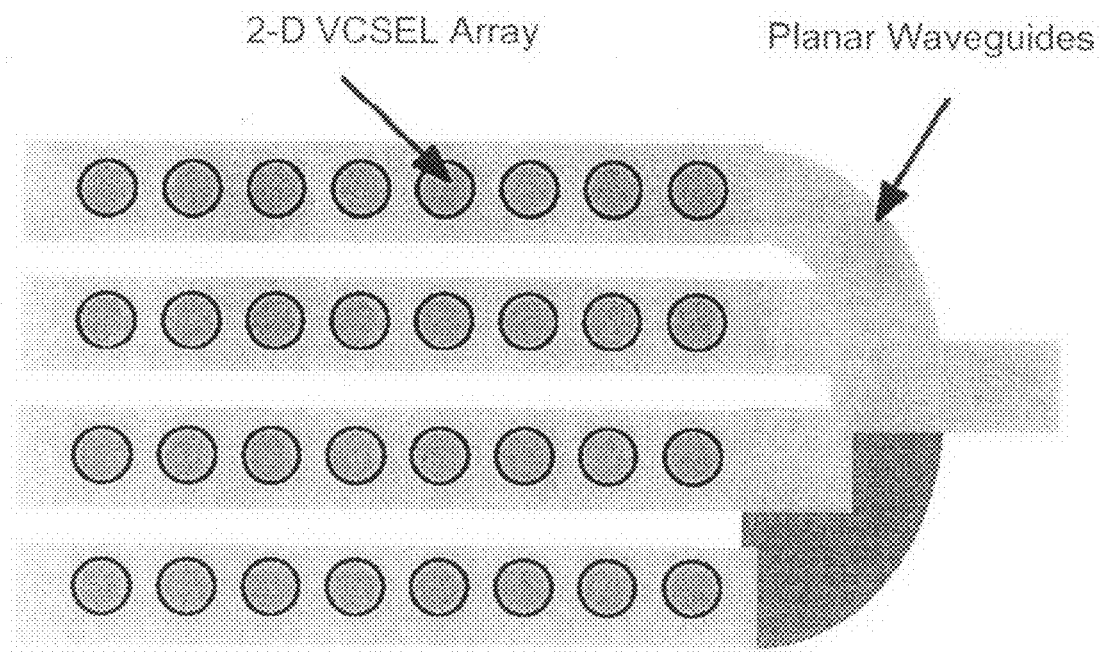
FIG. 24 is a diagram of a 2D array of a VCSEL/waveguide grating structure in accordance with the present invention.

The coupled output power can be also enhanced by using two dimensional (2D) arrays of the VCSEL/waveguide structure, as shown in FIG. 24. The planar waveguides for each row of VCSELs are connected together using a waveguide coupler. From the calculations, there is an optimum number of VCSELs that can be used to obtain a reasonable coupling efficiency. By increasing the array size, the output power can be greatly increased.

Integrate and Demonstrate a Hybrid Waveguide Structure

A hybrid waveguide structure was integrated with a diffractive optical interconnect element or DOIE array and a 1×5 VCSEL array. The single element coupling demonstration was crucial in determining the optimal waveguide structure. A series of waveguide structures were fabricated with various periods and grating depths. Grating depths and spacings were based on a spectral evaluation and characterization of candidate set of VCSELs. An 8×8 VCSEL ion implanted VCSEL array was used in the evaluation with a 1×5 array of elements selected. The spectral analysis was carried out at Opticomp Corporation (OCC) on selected VCSELs and the results were then forwarded to SMU where a candidate set of epitaxial gratings were determined and fabricated. Gratings were then bracketed around the mean average wavelength.

Figure 25:
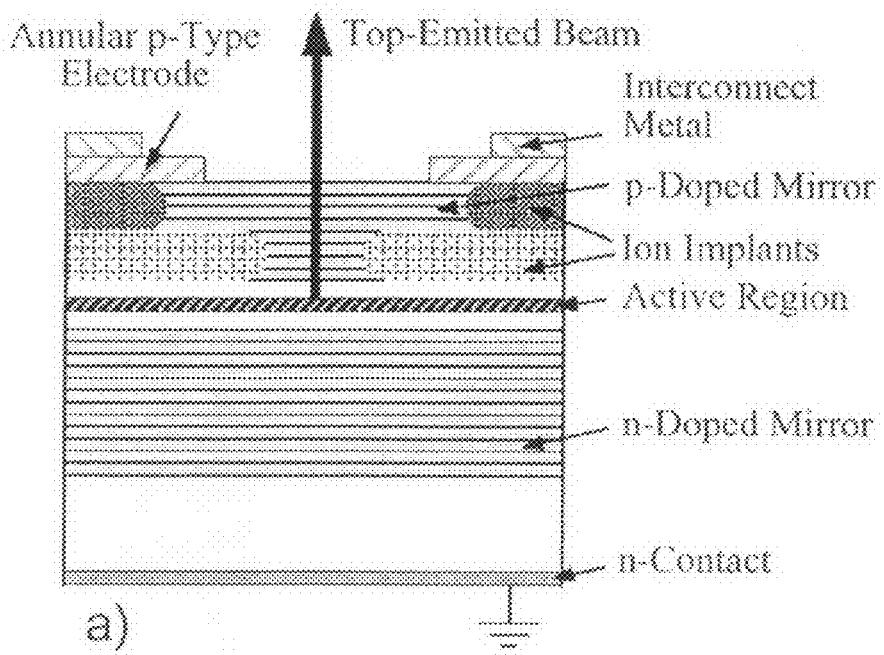
FIG. 25 is a diagram of an ion implanted VCSEL in accordance with the present invention.
Figure 26:
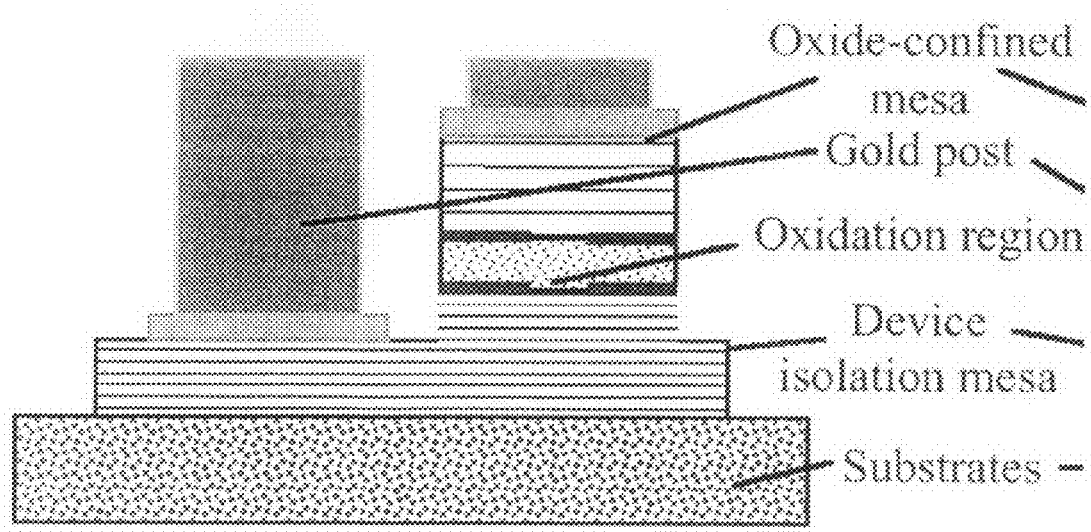
FIG. 26 is a diagram of an oxide confined VCSEL in accordance with the present invention.

FIG. 25 shows 850 nm VCSEL structures which were developed by OCC for optoelectronic integrated circuit (OEIC) integration. Arrays have been fabricated in 8×8 and 16×16 configurations. The lasers were processed from a GaAs/AlGaAs p-i-n distributed Bragg reflector (DBR) structure, which was grown by using metal organic chemical vapor deposition (MOCVD). The ion implanted VCSEL shown in FIG. 25 is a gain guided top-surface emitting device in which current confinement and electrical isolation of adjacent lasers is accomplished through hydrogen ion implantation. The oxide confined VCSEL structure (FIG. 26) uses flip-chip bonding to CMOS and subsequent substrate removal. The oxide confined VCSELs offer improved operational characteristics such as lower threshold or "turn on" currents and improved conversion efficiency. Although either device could be incorporated into the VCSEL/waveguide structure, a top emitting ion implanted VCSEL array was used for this demonstration.

Spectral Analysis of VCSELs

Figures 27, 28:
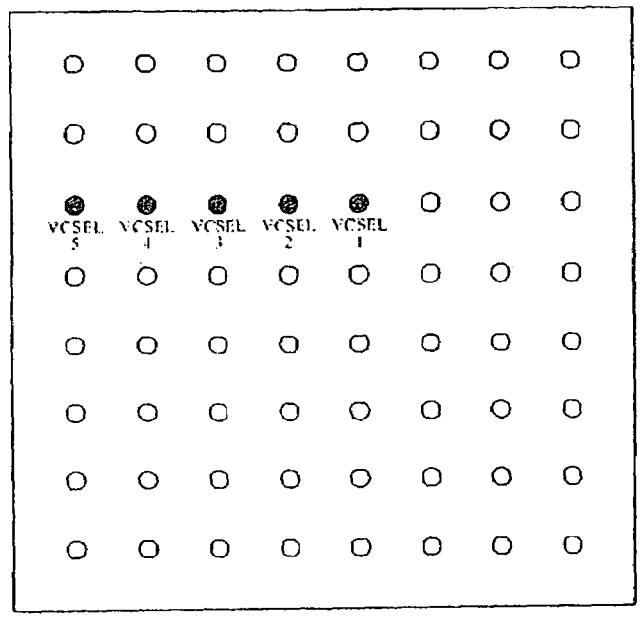
FIG. 27 is a diagram of an 8×8 VCSEL array in accordance with the present invention.
FIG. 28 is a diagram of voltages and currents applied to VCSELs in accordance with the present invention.

This spectral analysis was required in order to determine grating periods. After the data was recorded the results were submitted to SMU for grating period design. Spectral data measurements were obtained for a 1×5 linear array of VCSELs (FIG. 27). The lasers were all "powered-on" at the same time using a printed circuit board with eight channel CMOS driver chips. Output radiation was coupled into a multimode fiber and transmitted into a HP model 70950B optical spectrum analyzer.

FIG. 28 shows the voltages of (VddMOD) used to drive the eight channel CMOS driver chips and the output drive current recorded operate a single VCSEL. FIGS. 29 and 30, summarize the spectral results of the five element VCSEL array evaluation. FIG. 29 shows a comparison of the peak wavelengths at various voltages. The voltages refer to the VddMOD applied to the eight channel CMOS driver chips. FIG. 30 shows a comparison of the mean wavelengths at various voltages.

Grating Fabrication

Two waveguide epitaxial wafers were grown using molecular beam epitaxy (MBE) at Ohio State University by Robert Sacks. FIGS. 31 and 32 show the epitaxial structures. The epitaxial wafers are based on GaAs and AlGaAs semiconductor materials. An AlAs layer was first grown on a GaAs substrate. This AlAs layer serves as an etch-stop layer for the removal of the GaAs substrate. A thin GaAs layer was then grown and followed by an AlGaAs cladding layer. Finally, an AlGaAs waveguide core layer was grown. The thickness of the waveguide core was determined to be 0.5 µm and 8 µm for single mode and multi mode waveguides, respectively.

The GaAs epitaxial samples were cleaved into 10 samples. The samples were cleaned with acetone and rinsed with methanol and DI water and dried. The samples were then spin coated with a Shipley resist at 4500 rpm for 20 seconds and then softbaked for 90 seconds. The holographic grating fabrication process at SMU which was modified from a previous sequence [Evans, Carson, Hammer, Butler, Grating Surface Emitting Lasers, Academic Press, New York, 1993; Heflinger, Kirk, Corero, and Evans, Proceeding of SPIE, Vol. 269, 1981] comprises splitting a laser beam into two beams which are recombined at an angle, producing an interference pattern which is recorded in the photoresist. The light source used in this holographic process is an ultraviolet argon ion laser with an emission wavelength of 351.1 nm. The beam is spatially filtered, expanded using 4-inch diameter optics, and then collimated. By adjusting the angle between the two beams, the period of the resulting standing wave can be adjusted from ~180 nm to >1000 nm. After exposure, the wafer containing the photoresist is developed and the resulting photoresist grating pattern is replicated in the wafer surface using a dry etching process using a reactive ion etcher. The dry etching process does not limit the orientation of the device relative to crystal planes. It has several advantages over other processing techniques such as uniformity, control, and the capability for increased grating depths.

Figures 33, 34:
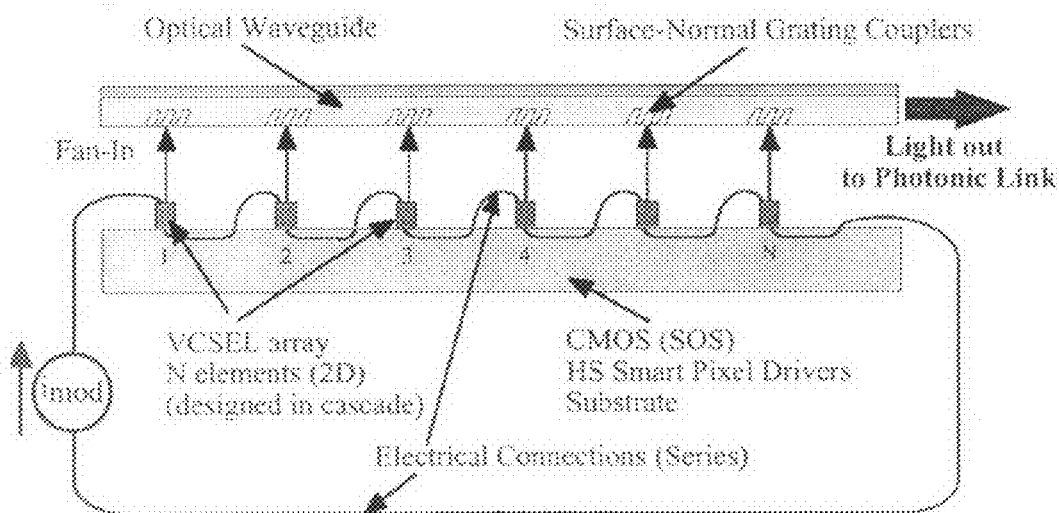
FIG. 33 is a diagram of a series of grating pitches in accordance with the present invention.
FIG. 34 is a diagram of a cascade VCSEL array coupled into an optical waveguide in accordance with the present invention.

The samples were placed in an oxygen plasma ash to remove any remaining photoresist. The samples were lapped and edges cleaved for ease of evaluation and coupling. Gratings were fabricated with the following periods as shown in FIG. 33. The pitch was varied every 20 Å, in order to bracket the optimal performance given a specific λ of 844.8 nm.

Testbed

A testbed was fabricated to evaluate the waveguide grating structures. The testbed used a specialized PCB board which contains integrated laser drivers and filtering components to drive VCSEL arrays. The output radiation was then collimated with an diffractive optical interconnect element (DOIE). The DOIE was mounted to a carrier and mounted to a multiaxial positioner. The collimated laser beam was incident on the waveguide. The VCSELs were set to 5.0 V. A 400× microscope was placed to examine the cleaved edge of the waveguide. The beam was incident on the waveguide 1 mm from the edge of the waveguide. A CCD camera was placed so as to resolve the microscope image. All gratings were taken at the same power levels and angular positions.

The waveguides were attached to a glass slide and mounted. Incident VCSEL radiation was positioned at 500 mm, 1.5 µm, and 2.5 mm. An image was then recorded at each distance for evaluation.

Results

Ten waveguide gratings were evaluated (OSU-884-1: OSU-884-10). The grating OSU-884-10 shows the best waveguide results. The grating periods were not optimized for the OCC VCSEL. The output VCSEL light is faintly visible to the CCD camera in both photos. Gratings OSU-884-1:9 show markedly poor results due to the fact that not enough light could be coupled. However, the OSU-884-10 grating demonstrates that waveguiding is being accomplished through the displayed increase in intensity. The OSU-884-10 grating shows the corner of the waveguide, while the OSU-884-8 grating shows the middle of the waveguide. The OSU-884-10 grating also shows scattering at the cleaved interface due to surface imperfections. The OSU-884-9 grating shows a series of the same grating with a different beam position. All of the samples were tested at the same positions and VCSEL power levels. It was determined from these results that another set of waveguides should be generated with grating pitches 100 Å beyond the grating spacing of 2493.2 Å. This will further confirm which gratings are optimally suited for the OCC VCSEL array.

Applications

Photonic Sources

A well known approach to increase the performance in an RF photonic link is to use the method of cascading lasers [C. Cox, "RF Photonic Testbed and Direct Modulation of Cascaded Laser," MURI on RF Photonic Materials and Devices, Review, Oct. 22, 1998] when implementing direct modulation. Laser relative intensity noise (RIN) dominates over other laser noises and must be minimized. The method of cascading lasers increases the signal power for a given current linearly while adding noise sources orthogonally. For the direct modulation topology, the gain in an optical link is determined by several parameters:

$$G \propto \eta_L^2 L^2 \eta_D^2$$

where $\eta_L$ is the RF-to-optical conversion efficiency (laser slope efficiency); L is the total loss in the fiber link; and $\eta_D$ is the optical-to-RF conversion efficiency (detector efficiency) at the receiver end. The noise figure is proportional to $1/\eta_L^2$.

A method is provided which utilizes a VCSEL cascade coupled to a waveguide as a hybrid structure (FIG. 34). The system decreases RIN and increases power. The VCSEL array outputs are collimated with a DOIE lens and coupled through surface-normal grating couplers to generate the optical source. The VCSELs are flip-chip bonded to a silicon on sapphire (SOS) CMOS smart pixel array in order to drive the lasers at high speeds. The cascade VCSEL/waveguide may be coupled to a single mode fiber using V-groove methods for attachment.

High Resolution Time Delay for RADAR Beam Forming

Figure 35:
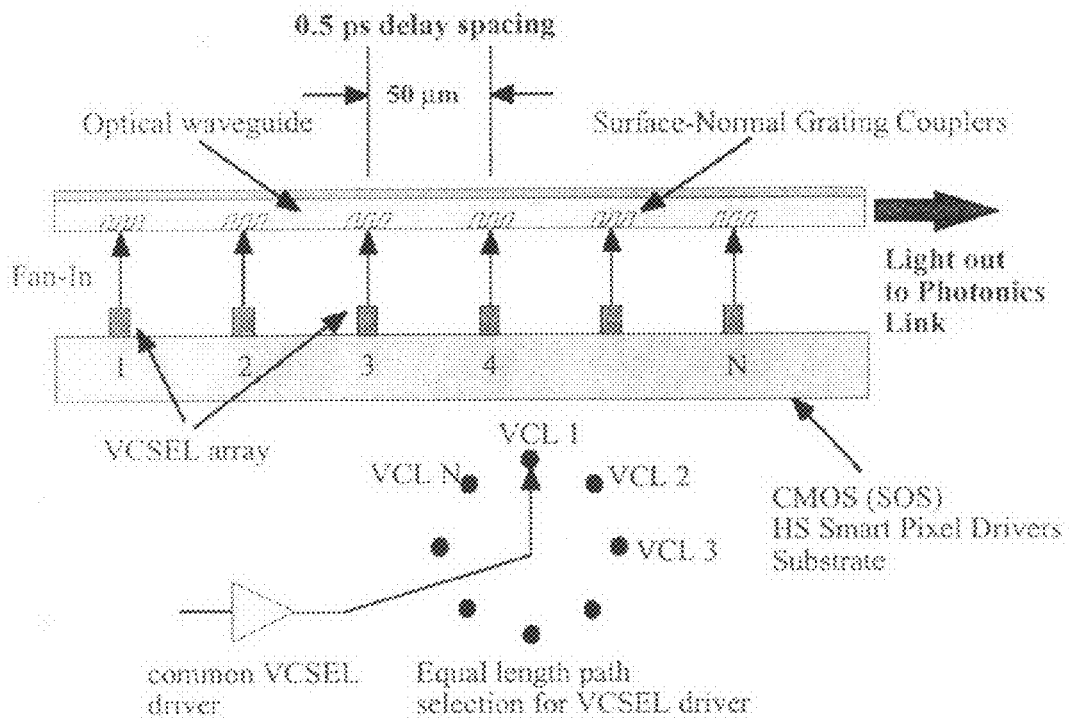
FIG. 35 is a diagram of a VCSEL array on a smart pixel substrate with a common driver and equal path length delays to the VCSEL in accordance with the present invention.

Another major challenge in RF photonics is the generation of high resolution (0.5 ps) reliable, time delays for RADAR beam forming [Private Communication with W. M. Miceli, ONR, September, 1998]. Current approaches that utilize different lengths of fiber are cumbersome for military applications. A more efficient solution uses a VCSEL/waveguide with large fan-in to achieve a reliable time delay for RADAR beam forming (FIG. 35). Given the index of refraction of a semiconductor waveguide is ~3.3, the required VCSEL spacing can be obtained by multiplying the speed of light in the waveguide by the required time delay ($300 \times 10^6/3.3*0.5 \times 10^{-12}$). This gives the required VCSEL spacing of 50 μm in order to achieve a time delay of 0.5 ps. If the VCSELs are flip-chip bonded onto SOS CMOS smart pixels, the VCSEL output signals can be simultaneously produced, which will cause a reliable time delay within the optical waveguide. FIG. 34 illustrates a Cascade VCSEL array coupled into an optical waveguide. SOS technology may currently be designed for 5 GHz applications. With future reductions in gate widths, 10 GHz applications can be expected.

EDFA 980 nm VCSEL/Waveguide Pump Arrays

By coupling one-dimensional and two-dimensional VCSEL arrays into a waveguide, the power level at the optical output of the waveguide may ideally approach the sum of all VCSEL inputs. This is attractive for a number of applications which involve coupling multiple VCSEL sources into a single mode fiber. The application of free-space optical interconnect solutions for the coupling of single mode lasers into a single mode fiber is tenuous. However, the superposition of VCSEL emission sources utilizing optical waveguides appears attractive especially when coupling into a single mode fiber is required.

Figure 36:
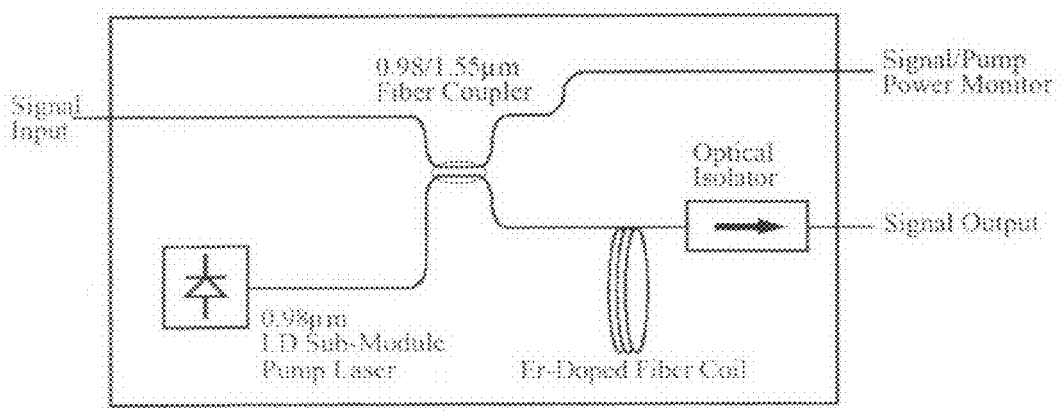
FIG. 36 is a diagram of an EDFA pump module in accordance with the present invention.
Figures 37, 38:
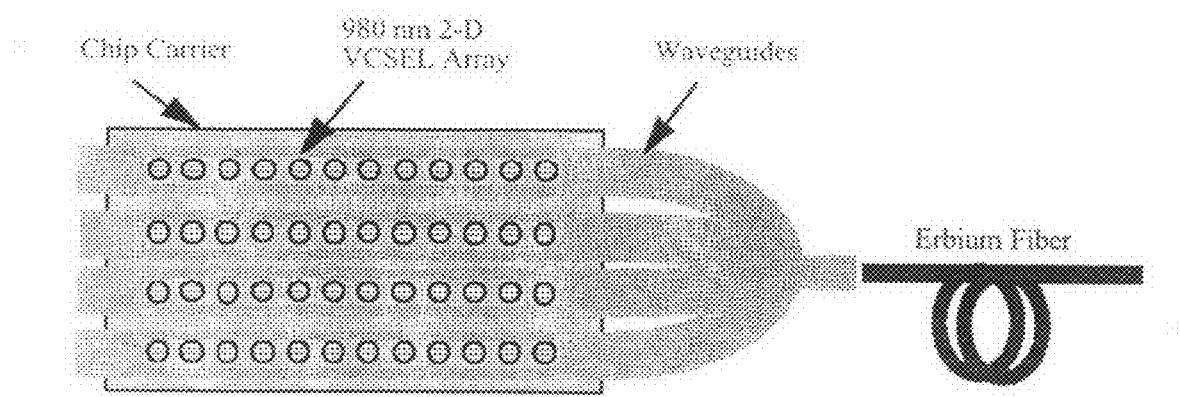
FIG. 37 is a diagram of the EDFA pump amplifier characteristics in accordance with the present invention.
FIG. 38 is a diagram of a parallel array for an optical pump in accordance with the present invention.

Of particular interest is the EDFA pump laser. A schematic drawing of a complete EDFA pump module with the laser source is shown in FIG. 36. A partial list of EDFA specifications is summarized in FIG. 37 [Private discussion: Dr. Steve Bashden, OptiGain, October, 1998]. The 200 mW power levels are currently satisfied with single stripe edge-emission devices. Multiple VCSELs connected in parallel, in one or two dimensions as shown in FIG. 38, may potentially achieve similar or higher power levels. For example, an array geometry of 10×10 VCSELs each having an output power of 2 mW could theoretically achieve 200 mW output into the fiber through the waveguide, assuming 100% coupling efficiency. Regarding the physical size, if the VCSELs are spaced on 50 mm centers, the entire array would occupy a space 500 μm×500 μm to achieve 200 mW. Initial calculations indicate that the hybrid waveguide configuration can achieve 65% coupling efficiency. This would require more power from each VCSEL (~3 mW) or an additional 30 VCSELs. Substantially higher power levels should be achievable out of the waveguide. Initial calculations indicate that the 1550 nm single-mode fiber (multimode at 978) has a capacity of 500 mW before undesired nonlinear effects become significant.

This pump source configuration potentially offers increased reliability. In general, ion implanted VCSELs demonstrate >$1 \times 10^6$ hours mean time to failure (MTTF) [R. A. Morgan et al., "Reliability study of 850 nm VCSELs for data communications," 34th Annual Proceedings of International Reliability Physics Symposium, pp. 203-10, 1996]. Should one or more VCSELs stop lasing, the decrease in output power is not significant. In fact, several devices would have to fail before the amplifier performance is degraded below the required specifications. This "slow" failure mode would not be considered catastrophic. Consequently, significant "down time" may be avoided and the pump laser replacement may be scheduled. Infant mortality and yield are also substantially improved thereby reducing cost. For example, if 10% of the VCSELs do not meet the required specifications when fabricated, the array may still be used. Another advantage is increased thermal stability. VCSELs have approximately a 3:1 decrease in thermal drift compared to stripe designs. On the basis of pump wavelength and required tolerances, VCSELs can be utilized as 980 nm pump sources for conventional EDFAs.

On-Chip/Chip-to-Chip Communications

Figure 39:
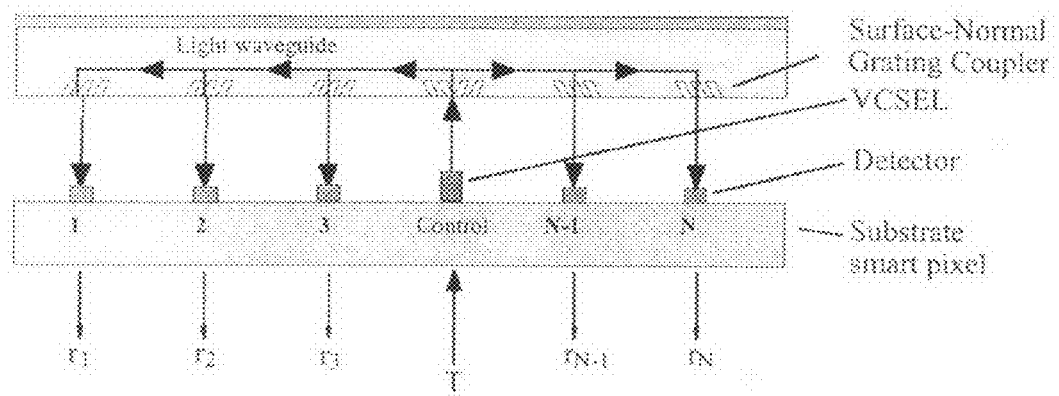
FIG. 39 is a diagram of a one-point-to-many points fan-out utilizing VCSEL/waveguide interconnects in accordance with the present invention.
Figure 40:
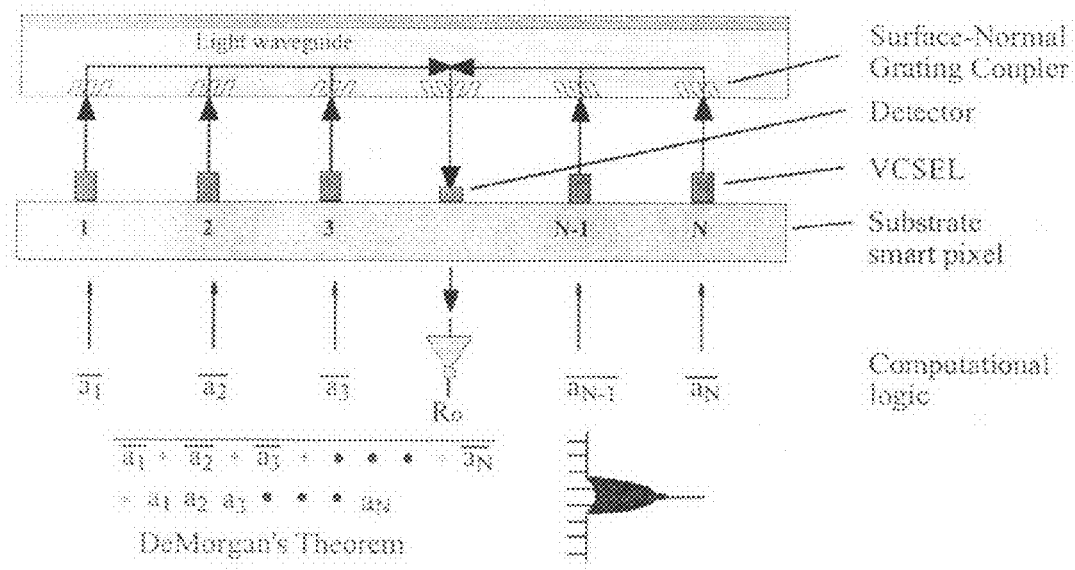
FIG. 40 is a diagram of a many-points-to-one point fan-out utilizing VCSEL/waveguide interconnects and smart pixel devices in accordance with the present invention.
Figure 41A:
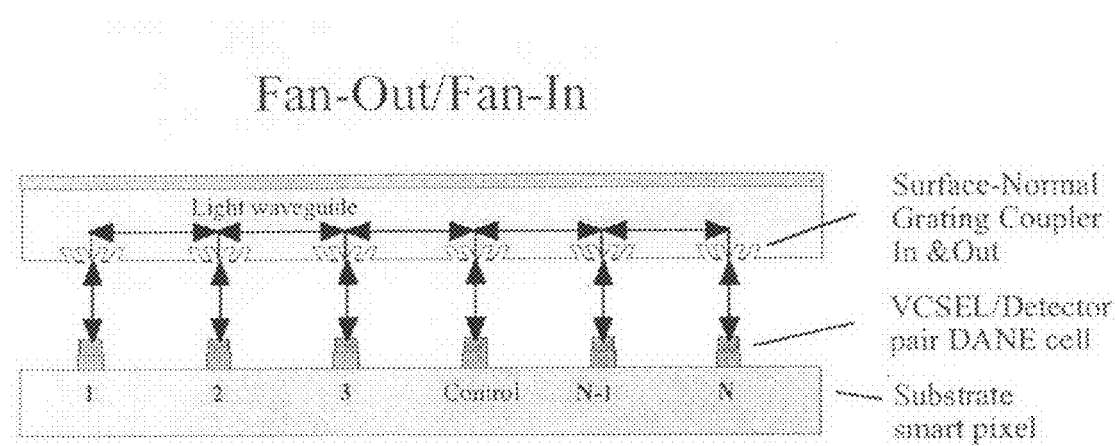
FIG. 41A is a diagram of a global waveguide optical interconnects for many-points-to-many points fan-out/fan-in utilizing VCSEL/waveguide interconnects and smart pixel devices in accordance with the present invention.
Figure 41B:
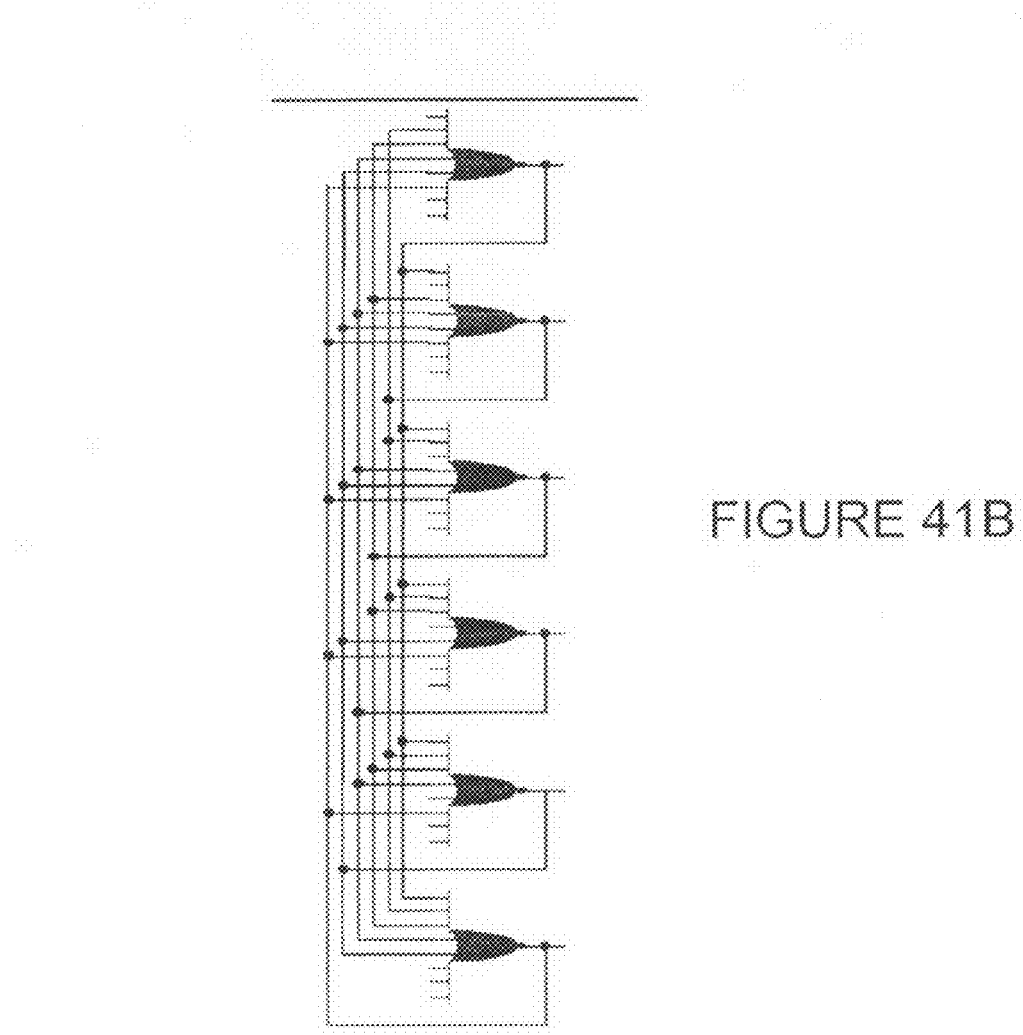
FIG. 41B is a schematic diagram of an equivalent logic circuit demonstrating feedback of the global waveguide optical interconnects of FIG. 41A.

The VCSEL/waveguide structure can be used in commercial applications which implement fan-out and fan-in architectures (FIGS. 39, 40, 41A, 41B). Using a one-point-to-many-points architecture (fan-out), clock signals can be distributed on a single chip or between chips (FIG. 39). Logic NOR gates can be realized with the many-points-to-one-point architecture: fan-in (FIG. 40). By combining fan-in and fan-out in the same waveguide a many-points-to-many-points architecture can be achieved (FIGS. 41A & 41B). This fan-in/fan-out represents a programmable gate array which can implement feedback.

On-Chip Data Distribution (e.g. Clock) and Chip-to-Chip Interconnect (Fan-Out)

Similar utilization of fan-out, as depicted in FIG. 39, has been proposed for VCSEL/waveguide interconnects for on-chip data/clock distribution and die-to-die interconnects for board level or MCM (multi-chip-module) level interconnects [Chen et al., "1-to-12 surface normal three-dimensional optical interconnects," APL, Vol. 63, No. 14, October 1993; Chen et al., "Equal Fanout Optical Interconnects Using Dupont Photopolymer Films," SPIE Vol. 3005, February 1997; Distribution," IEEE PTL, Vol. 8, No. 8, pp. 1038-40, August 1996] This configuration represents a one-to-many interconnect scheme. It is predicted that the fan-out VCSEL/waveguide interconnect systems will represent the next generation of commercialized optoelectronic interconnect products. By comparison, today's commercially available "state-of-the-art" VCSEL/waveguide interconnect structures, such as the POLO interconnect developed under DARPA sponsorship, demonstrate a one-point-to-one-point parallel interconnect (8-32 channels).

Processor/Memory I/O and Crossbar Switching (Fan-In)

Figure 42:
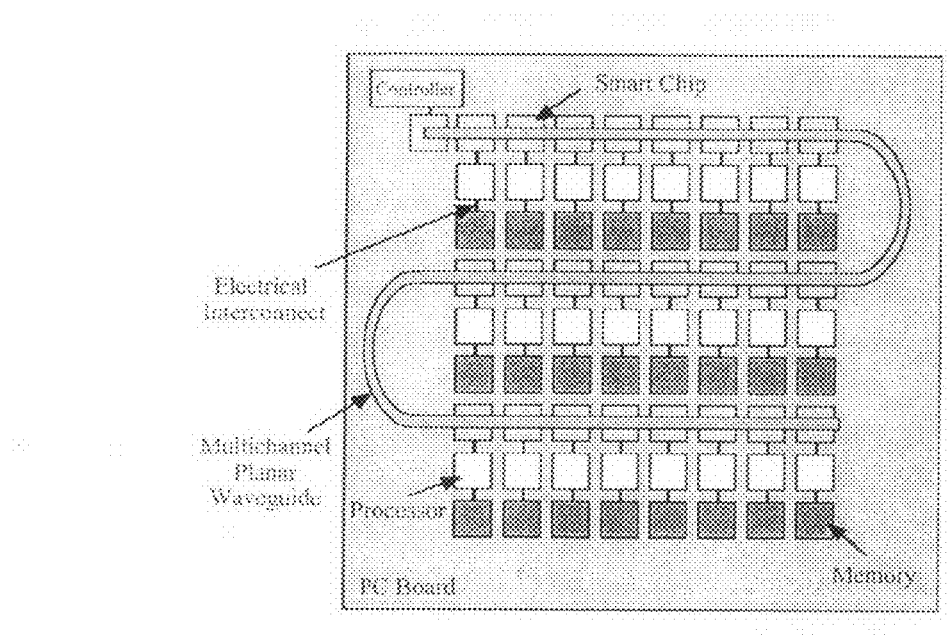
FIG. 42 is a diagram of a processor/memory interconnect via parallel optical waveguide bus configured as a crossbar switch in accordance with the present invention.

The many-points-to-one-point fan-in topology, which is shown in FIG. 40, may in fact represent the next architectural evolution after the one-point-to-many-points configuration. This is referred to, for digital signals, as a "smart" interconnect. If the input signals or bits are represented in complementary notation, and the output is inverted, then the system is effectively an N-input AND gate by DeMorgan's Theorem [OptiComp patent "Global Interconnect Architecture for Optical Computer," U.S. Pat. No. 5,297,068, 1994; OptiComp patent "General Purpose Optical Computer," U.S. Pat. No. 5,267,183; 1993; OptiComp patent "Combinatorial Logic-Based Optical Computing Method", U.S. Pat. No. 4,864,524, 1989]. Consider the parallel optical bus configuration shown in FIGS. 42 and 43. Utilizing the fan-in only optical scheme, the system may be configured as a non-blocking, multichannel Gigabit Ethernet crossbar, which requires a separate controller channel.

Figure 43:
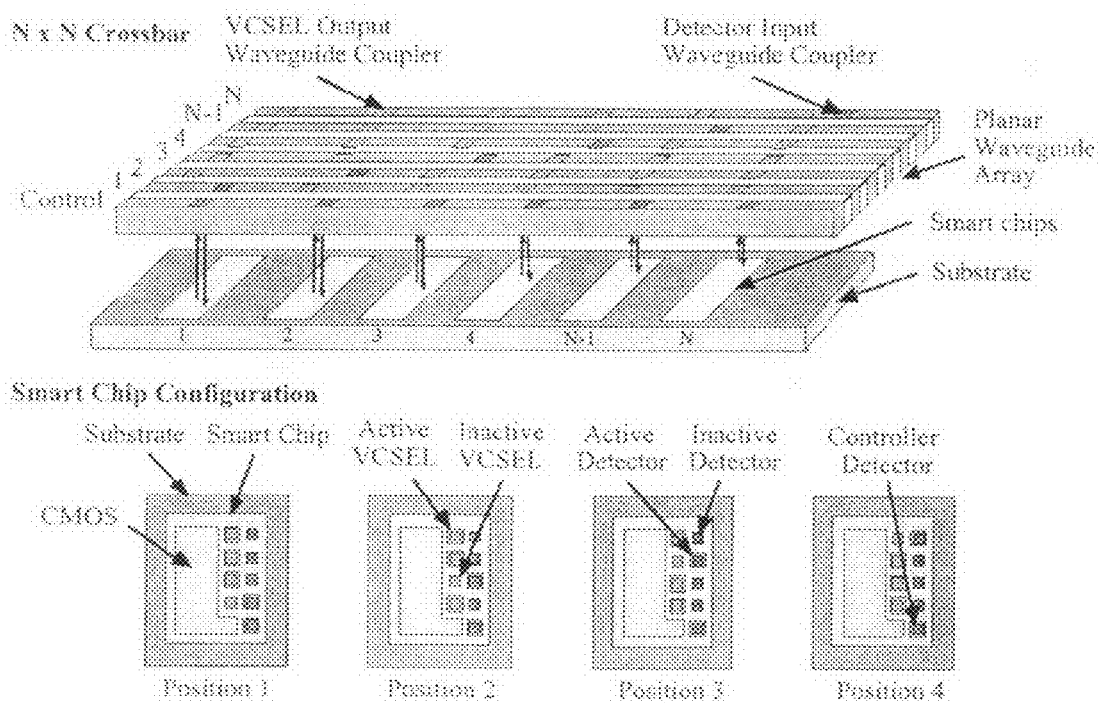
FIG. 43 is a diagram of a smart pixel set utilized in a parallel crossbar in accordance with the present invention.

Each processor/memory subsystem has a dedicated receiver and its own dedicated waveguide channel as shown in FIG. 43. All waveguide channels cross over each processor/memory smart pixel chip. Each processor memory smart pixel chip has N-transmitter VCSELs, one for each waveguide channel except for the receive and the control channel. In this configuration, the controller can route the signal from any "transmit" processor/memory element to any "receive" processor/memory element. Note that none of the receivers fully utilize DeMorgan's Theorem due to the fact that there is only one signal on each channel at any time.

Fully Non-Blocking Gigabit Ethernet Crossbar Anarchy (Global Fan-In/Fan-Out)

The complete fan-in/fan-out system, shown in FIGS. 41A & 41B, configures the crossbar to be able to become "controller free." This architecture could be configured as a fully non-blocking gigabit Ethernet crossbar anarchy. Each channel senses every other channel and effectively waits for a "go" signal. Many other applications may be implemented with the global waveguide interconnect system, which is effectively a programmable gate array with feedback.

SUMMARY

Resonant cavity enhanced VCSEL/waveguide grating coupler was proposed to achieve coherent high-power light sources. The surface-normal grating is utilized to achieve the desired coupling light from the VCSEL into the waveguide. The waveguide structures were based on GaAs and AlGaAs semiconductor materials. They were designed for both singlemode and multi-mode operations at 850 nm.

A mathematical model has been presented to describe diffraction into a waveguide from a normally incident light from the VCSEL. From the calculations, it was found that the coupling efficiency can be considerably enhanced by using a substrate mirror. The coupling efficiency has a pronounced dependence on the reflectivity of the substrate mirror. The substrate mirror redirects light emitted toward the substrate, thereby increasing the coupling into the waveguide. Therefore, the waveguide grating structure with a highly reflective mirror allows the use of low diffraction efficiency for large coupling efficiency of the VCSEL into the waveguide.

Embodiments described above advantageously include a waveguide and surface normal gratings. Accordingly, an optical coupler has been provided comprising first and second mirrors, wherein the first mirror is positioned with respect to the second mirror so that a resonant cavity is defined between them, a waveguide structure positioned in the resonant cavity and including a surface-normal grating structure, and wherein a thickness of the resonant cavity is selected so that a phase matching condition is satisfied for resonance in the resonant cavity.

In one embodiment, at least one of the first and second mirrors is formed from a structure in an optoelectronic device. Alternatively, at least one of the first and second mirrors is formed from a semiconductor layer.

In another embodiment, at least one of the first and second mirrors is formed as a semiconductor distributed bragg reflector. Alternatively, at least one of the first and second mirrors is formed as a dielectric distributed bragg reflector.

At least one of the first and second mirrors can be a mirror in a vertical cavity surface emitting laser (VCSEL) structure. Also, at least one of the first and second mirrors is a mirror in a photodetector structure, in a different embodiment.

The first and second mirrors and waveguide structure can be formed in a hybrid structure, or a monolithic structure.

The surface-normal grating structure is shaped so that first order modes of light incident upon the surface-normal grating structure are coupled into the waveguide while zero-order modes are reflected out into the resonant cavity and reflected by the mirror.

Coupling into and out of a waveguide using a grating is a method provided and described above involving transfer of free space data to waveguides in optoelectronic integrated circuits (OEICs). Waveguide gratings can perform a large variety of functions such as reflection, filtering, deflection, and input/output coupling. A periodically modulated grating can perform holographic-wavefront conversion. As a coupler, the grating converts a waveguide mode into a radiation mode, or vice versa. Surface-normal grating couplers direct light perpendicularly into and out of the waveguide. The combination of the waveguide and surface normal grating couplers permits arrays of VCSELs to be used to create an optical source with high right angle mode output power. Arrays of VCSELs can then be used as high-power light sources for use in a variety of military and commercial applications, such as free-space optical communications, on-chip/chip-to-chip communications, RF photonics, laser radar, and optical pump sources for solid-state and fiber lasers.

Photonic Crystals

In addition to the methods described above, other techniques can be used to couple light from a device into a waveguide, and vice versa. Another method involving photonic crystals, as opposed to diffraction gratings, is described below with reference to FIGS. 44-51. The description above relating to coupling light from a device into a waveguide involving diffraction gratings is incorporated here, and not repeated, as being applicable to this discussion and the present invention involving photonic crystal couplers.

Light from a vertical-cavity, surface-emitting laser (VCSEL) can be coupled into a waveguide using a photonic crystal coupler. The photonic crystal coupler comprises a structure with a periodic index variation, usually formed by etching features within the semiconductor, in either one or two dimensions. The photonic crystal coupler also includes a defect, comprising a spatial shift in the index variation, either in one or two dimensions. For example, a photonic crystal coupler can be realized by forming a simple one-dimensional grating with a defect.

Figure 44:
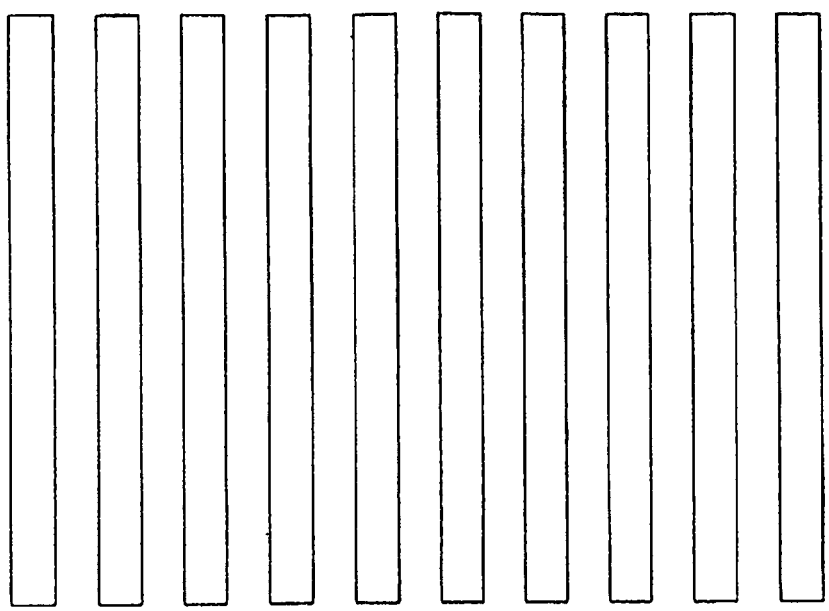
FIG. 44 schematically illustrates a one-dimensional grating coupler.
Figure 45:
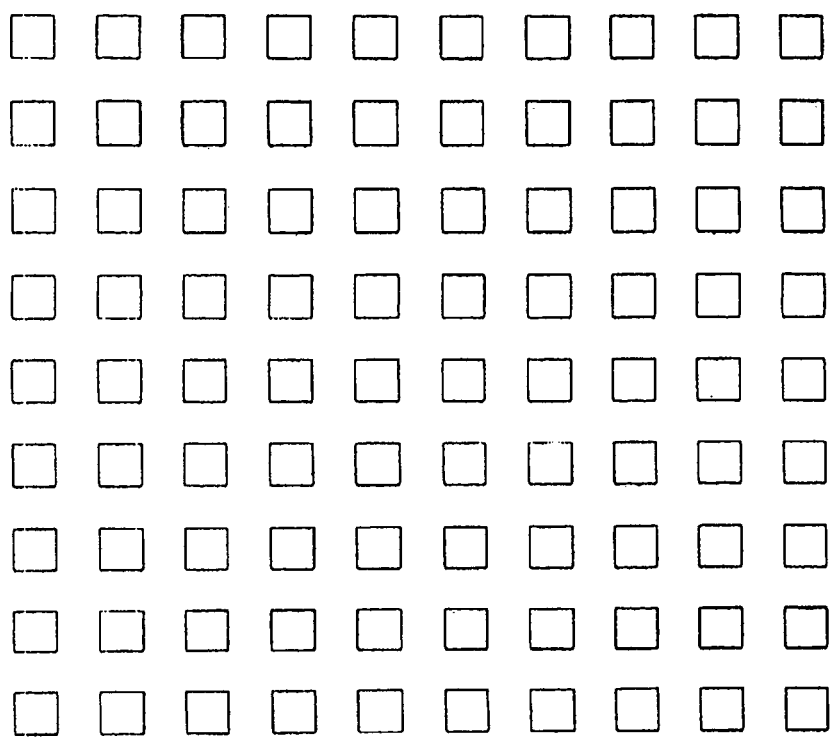
FIG. 45 schematically illustrates a two-dimensional grating coupler.
Figure 46:
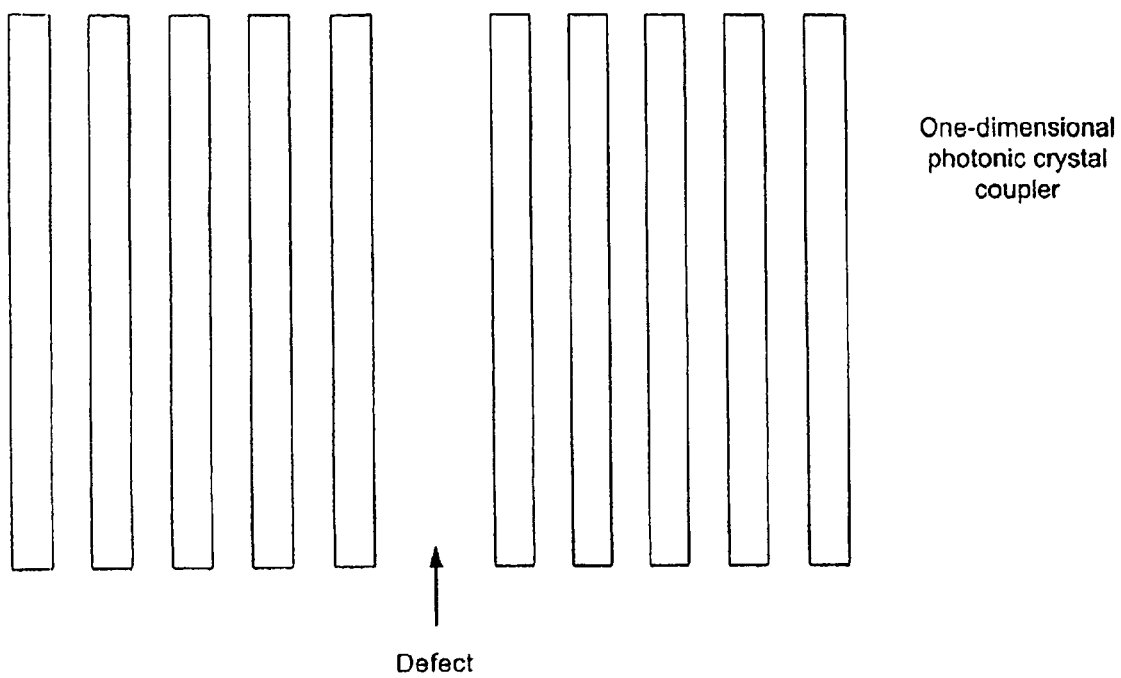
FIG. 46 schematically illustrates a one-dimensional photonic crystal coupler with a one-dimensional defect.
Figure 47:
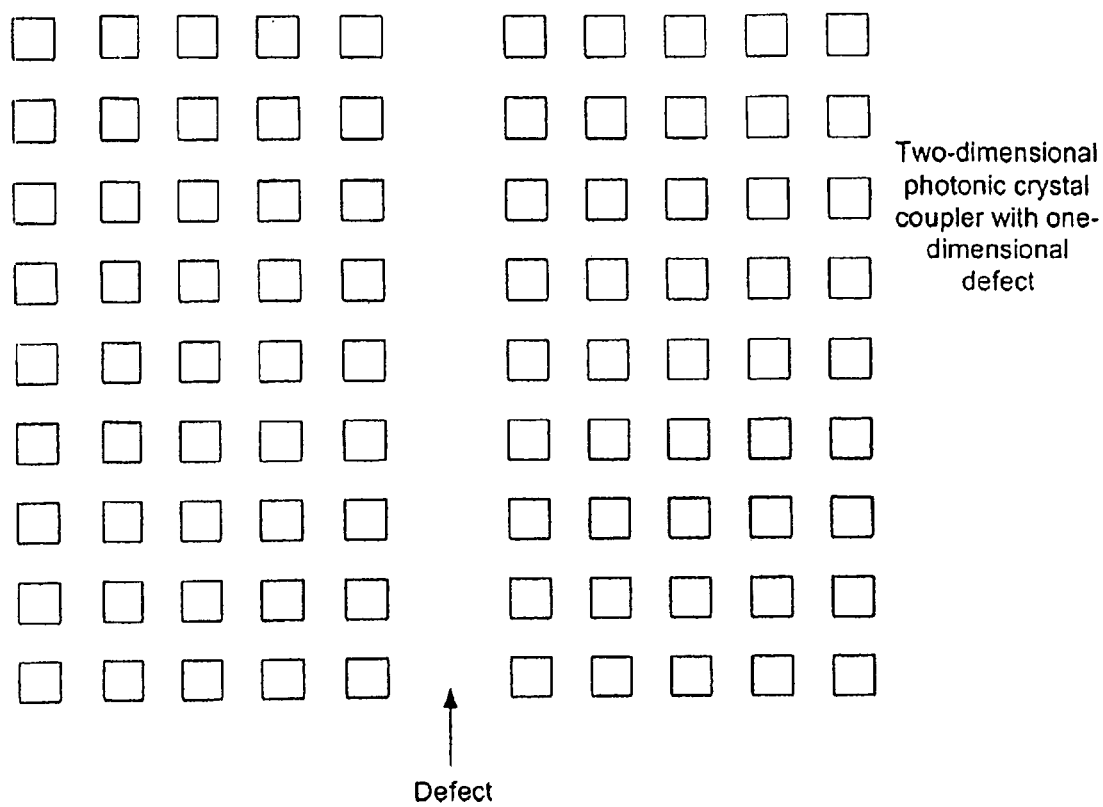
FIG. 47 schematically illustrates a two-dimensional photonic crystal coupler with a one-dimensional defect.
Figure 48:
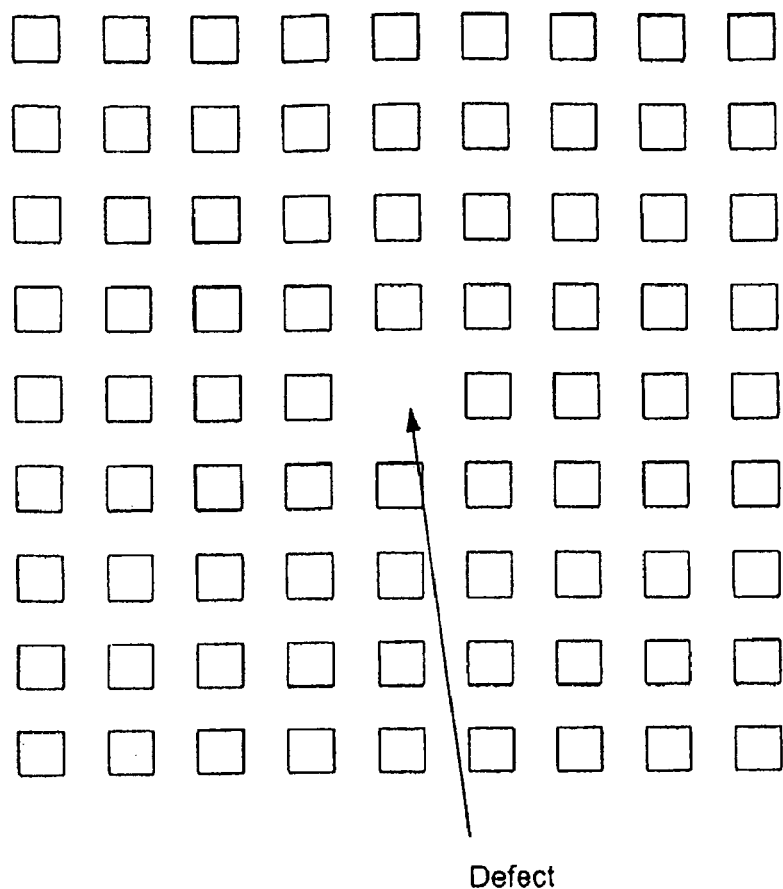
FIGS. 48-49 schematically illustrate two dimensional photonic crystal couplers with two-dimensional defects.
Figure 49:
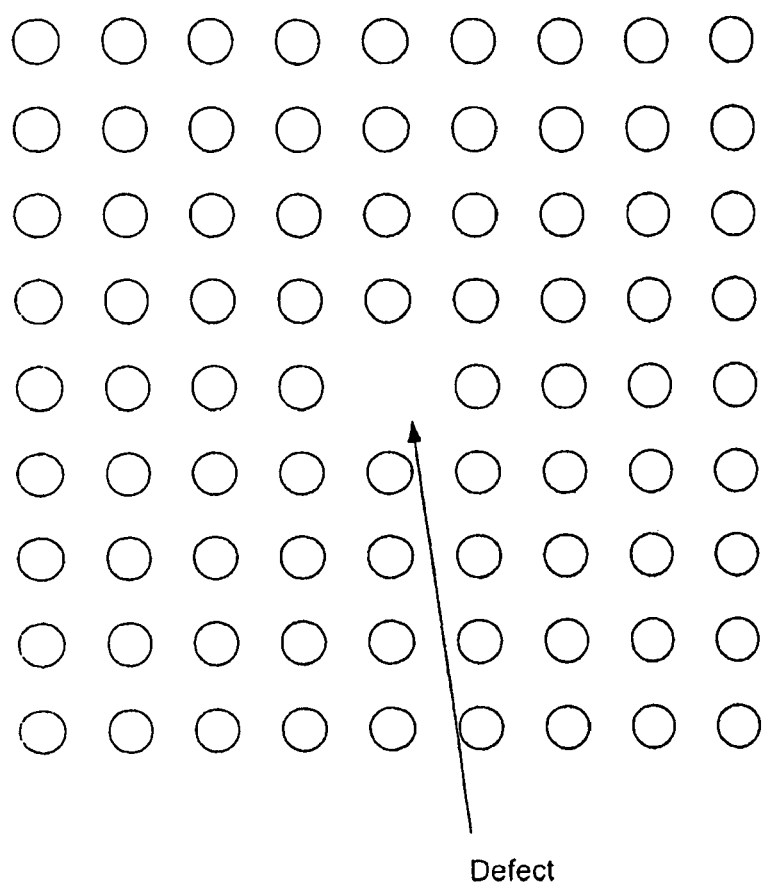

FIGS. 44 and 45 schematically illustrate a one-dimensional and a two-dimensional grating coupler, respectively, such as have been described above. As with a grating coupler, the periodic index variation of a photonic crystal coupler can be implemented by etching patterns into the waveguide. For example, FIG. 46 schematically illustrates a one-dimensional photonic crystal coupler with a one-dimensional defect. In addition, photonic crystal couplers can be made using other patterns, such as cubic or hexagonal, in both the grating pattern and the geometrical arrangements. For example, a photonic crystal coupler could comprise square etched patterns arranged in a cubic geometry or circular patterns formed in a hexagonal geometry. Additionally, photonic crystal couplers can be formed with either one-dimensional or two-dimensional defects. FIG. 47 schematically illustrates an example of a two-dimensional photonic crystal coupler with a one dimensional defect. FIGS. 48 and 49 schematically illustrate examples of two-dimensional photonic crystal couplers with two-dimensional defects.

Figure 50:
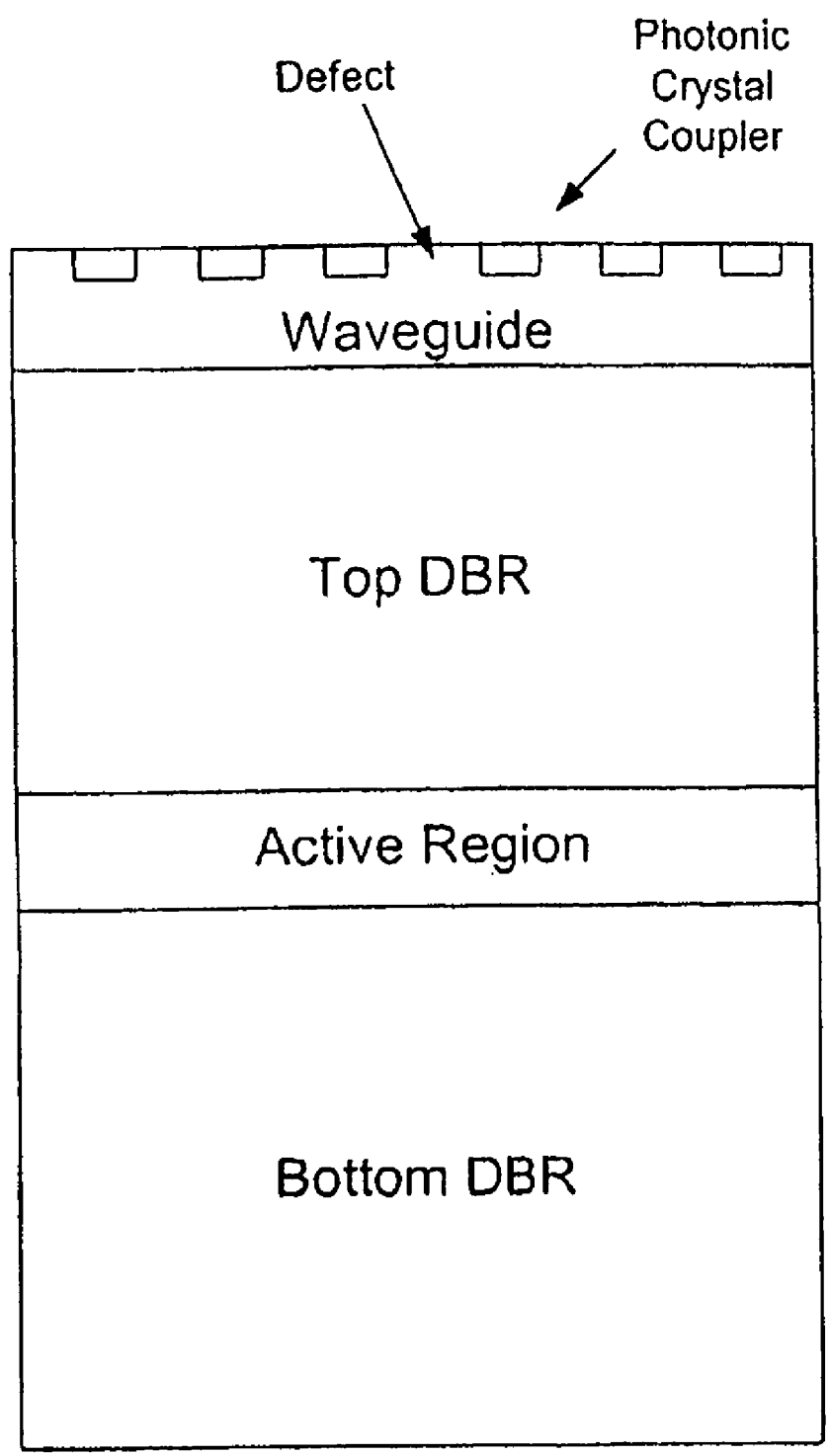
FIG. 50 schematically illustrates a photonic crystal coupler with a waveguide placed on the top surface of the VCSEL.
Figure 51:
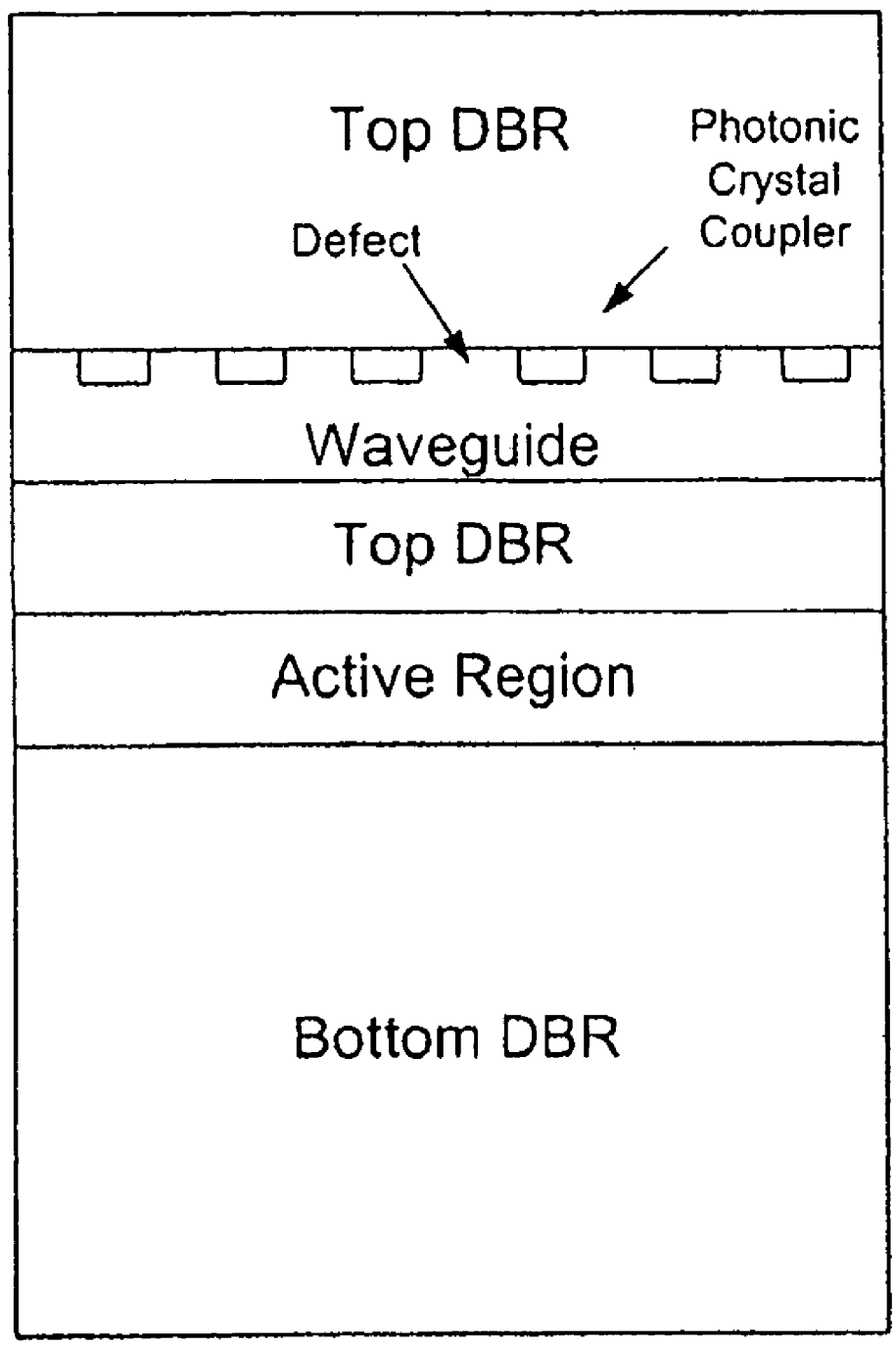
FIG. 51 schematically illustrates a photonic crystal coupler with a waveguide placed internally within the top DBR.

Altering the design of the structure can change the characteristics of the photonic crystal coupler. Typically, the periodic index variations are chosen to have a period of the free-space wavelength divided by the effective index of the waveguide. Thus, the operating wavelength of the coupler is determined by the period of the index variations. The duty cycles of these periodic index variations are chosen to provide the desired operating characteristics, including but not limited to coupling efficiency and polarization control. Finally, the placement of the photonic crystal coupler within the device structure can also be varied. FIG. 50 illustrates a photonic crystal coupler with the waveguide placed on the top surface of a VCSEL. The VCSEL illustrated in FIG. 50 includes top and bottom DBRs around an active region, wherein the waveguide with photonic crystal coupler are located above the top DBR. This arrangement would have advantages, specifically the removal of the epitaxial regrowth process. Alternatively, FIG. 51 illustrates a photonic crystal coupler with the waveguide placed internally within the top DBR.

The described photonic crystal coupler technology can be used for other devices, as well. The above describes a photonic crystal coupler for coupling light out of a VCSEL into a waveguide, and a photonic crystal coupler can also be used to couple light out of a waveguide into a resonant cavity detector. Also, integrated device structures can be manufactured that contain VCSELs, detectors, waveguides, and photonic crystal couplers.

Polarization Control for Efficient Coupling

In accordance with the present invention, it has been discovered that by controlling certain polarization modes of light within a VCSEL, selected polarization modes of light may be more efficiently coupled out of the VCSEL and into a waveguide.

As described earlier, VCSEL waveguide grating coupler couples light out of a VCSEL cavity via diffraction gratings formed (such as by etching) onto a waveguide. For such couplers, it has been found that the polarization of light that couples efficiently to the waveguide has its electric field orthogonal to the waveguide and parallel to the grating used for coupling. For illustrative purposes, the transverse electric (TE) polarization modes will hereinafter be referred to as the polarization modes that couple efficiently into such a waveguide. Accordingly, the VCSEL polarization modes orthogonal to the coupling grating will hereinafter be referred to as the transverse magnetic (TM) modes of the VCSEL, which do not couple efficiently to the waveguide. It should be appreciated that the present invention is not limited to the specific TE/TM relationship described here as an example of the present invention, and that other configurations, where light having other polarization modes are efficiently coupled to a waveguide, may be designed within the scope and spirit of the present invention.

Figure 52:
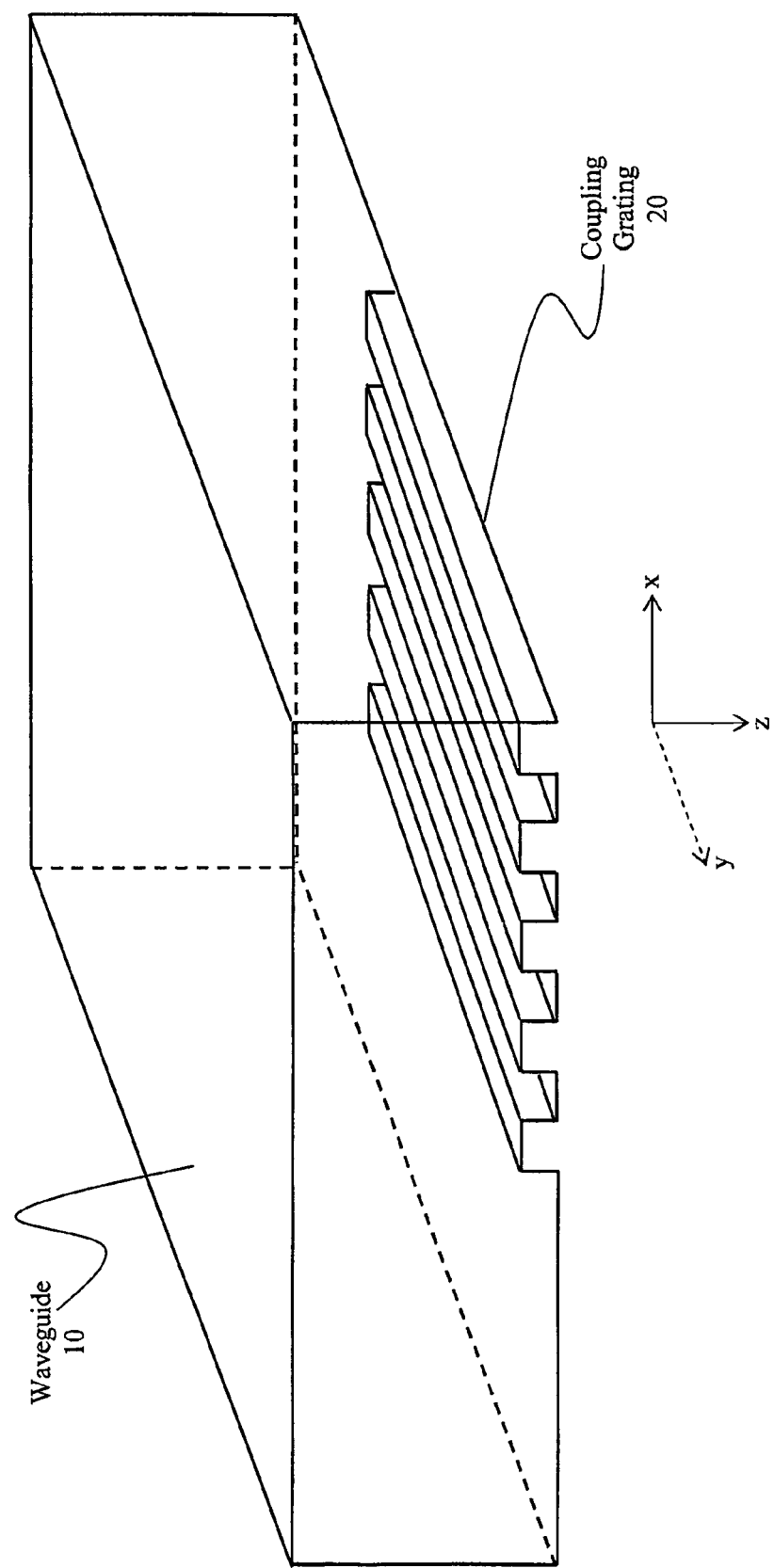
FIG. 52 is a schematic of a cross sectional perspective of a waveguide with a coupling grating oriented parallel to the x-axis.

In FIG. 52, a cross sectional perspective of a waveguide grating coupler is shown with coupling gratings oriented parallel to the x-axis. Here, for light traveling in the z-direction and having a TE component parallel to the X-axis, a TM component will be orthogonal to the TE component and thus orthogonal to the X axis. The TE component couples into the waveguide since it is parallel to the grating. Accordingly, the light that couples efficiently into the waveguide will be referred to as "TE-polarized." In turn, TM polarized light will be orthogonal to the TE polarization mode, and to coupling grating 20, and therefore will not couple efficiently through coupling grating 20 to the waveguide.

Since only TE-polarized light is efficiently coupled to the waveguide, a greater loss is introduced for TE-polarized light relative to TM-polarized light within the VCSEL cavity. As in any laser structure though, the polarization modes with the lowest loss will lase preferentially. In this example, since the TM polarization modes will lase preferentially, the TE modes are suppressed. However, because only the TE modes couple efficiently to the waveguide, and their lasing is suppressed, little light is available for coupling into the waveguide. In accordance with the present invention, to make the VCSEL waveguide grating coupler work more efficiently, polarization modes are controlled so that the VCSEL is forced to lase TE-polarized light.

Polarization control in VCSELs can be achieved by a number of different techniques, each of which introduce an anisotropic gain or loss into the VCSEL cavity. Anisotropic gain, for example, can be realized using (311) substrates [H. Uenohara, et. al., IEEE Journal of Selected Topics in Quantum Electronics, vol. 5, pp. 537-545, 1999.] or asymmetric current injection [G. Verschaffelt, et. al., IEEE Photonics Technology Letters, vol. 12, pp. 945-947, 2000.], while anisotropic cavity losses can be achieved using asymmetric cavities [K. D. Choquette, et. al., IEEE Photonics Technology Letters, vol. 6, pp. 40-42, 1994.] or surface gratings to attain anisotropic reflectivities [J. H. Ser, et. al., Applied Physics Letters, vol. 66, pp. 2769-2771, 1995]. Photonic crystal structures have also been used to control polarization. None of these techniques, however, address the need for controlling VCSEL polarization so that light may be efficiently coupled into a waveguide.

Figure 53:
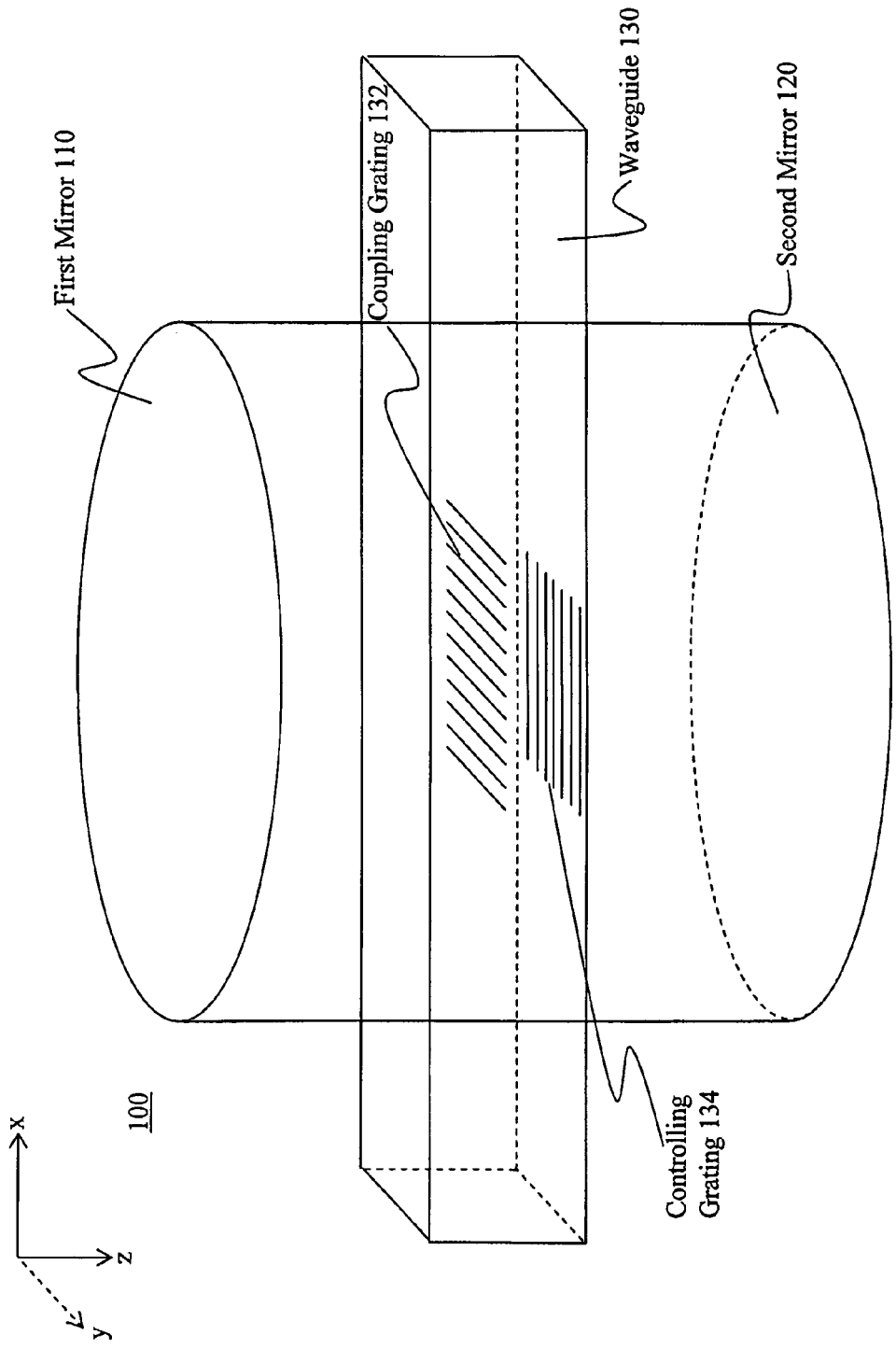
FIG. 53 schematically illustrates a cross sectional perspective of a waveguide grating coupler in accordance with the present invention.

In one embodiment of the present invention a second diffraction grating is added which forces the VCSEL to lase in one polarization mode by introducing a polarization-dependent loss into the cavity for the other polarization mode. A preferred embodiment of such a structure is illustrated in FIG. 53. In waveguide grating coupler 100 a first mirror 110 and a second mirror 120 are positioned so that a resonant cavity is defined between them. Waveguide grating coupler 100 also includes waveguide 130, wherein coupling grating 132 and controlling grating 134 are formed (such as by etching) into waveguide 130 and orthogonal to each other, as illustrated.

In a preferred embodiment, light resonates within the cavity and is coupled into waveguide 130 via coupling grating 132. Light is again assumed to propagate in the z-direction, wherein coupling grating 132 is oriented parallel to the x-axis to couple TE-polarized light into waveguide 130. Controlling grating 134 is positioned orthogonal to coupling grating 134 to diffract TM-polarized light. For this particular example, since coupling grating 132 is oriented parallel to the x-axis, controlling grating 134 is oriented parallel to the y-axis as shown. Further, controlling grating 134 is formed relative to coupling grating 130 to introduce a loss difference between the TE polarization mode and TM polarization mode, where the loss in the TM polarized light is greater than the loss in the TE polarized light.

In a preferred embodiment, controlling grating 134 is designed to diffract TM-polarized light such that the resultant loss is higher than the loss of TE-polarized light due to coupling. By making the loss of TM-polarized light relatively higher than the loss of TE-polarized light, TE-polarized light lases preferentially within the resonant cavity. This preferential lasing thus results in an increased amount of TE-polarized light within the resonant cavity, which improves the coupling efficiency of TE-polarized light into waveguide 130.

Figure 54A:
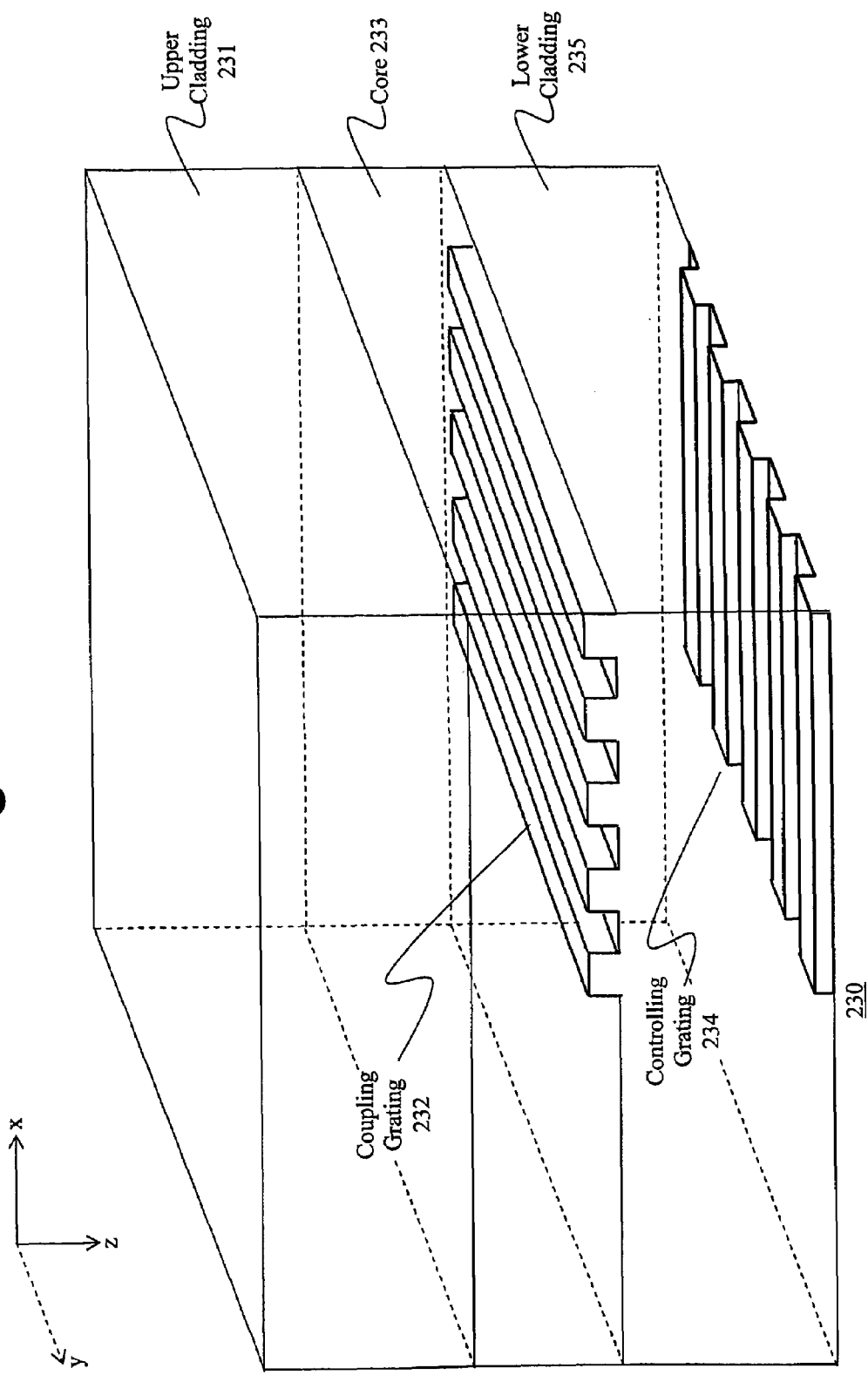
FIG. 54A is a schematic of a two diffraction grating configuration according to a preferred embodiment of the present invention.

In a preferred embodiment, the diffraction gratings are positioned as illustrated in FIG. 54A, wherein waveguide 230 is shown to have a core 233, an upper cladding 231, and a lower cladding 235. In particular, coupling grating 232 is placed in the proximity of waveguide core 233 to enable the diffracted TE-polarized light to be coupled into waveguide 230. And although controlling grating 234 can be placed anywhere in the VCSEL cavity, the preferred location is the lower cladding 235 of waveguide 230 as shown.

Figure 54B:
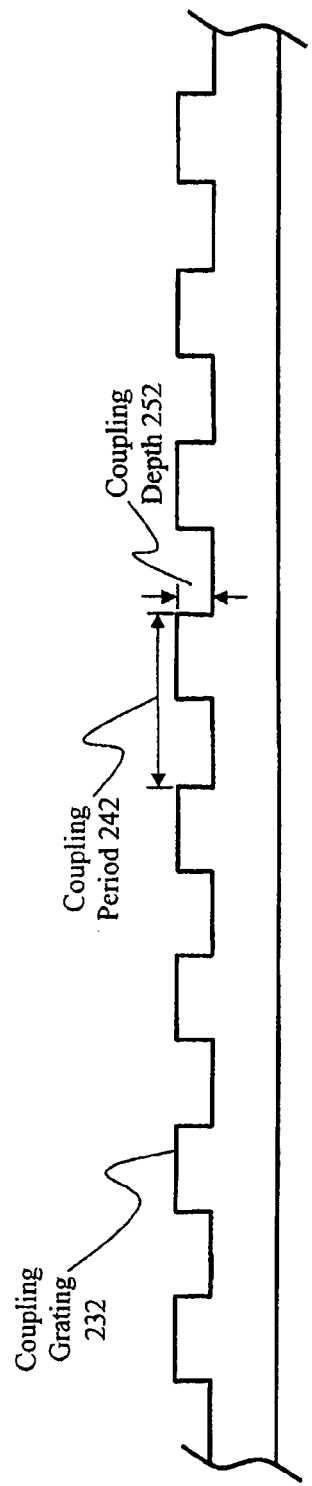
FIG. 54B is a simplified cross-sectional illustration of a coupling grating according to a preferred embodiment of the present invention.
Figure 54C:
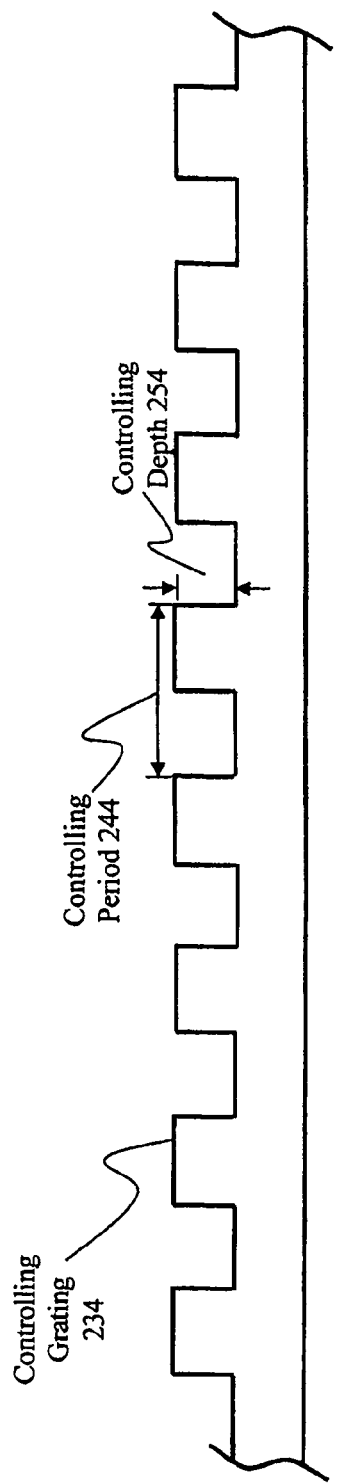
FIG. 54C is a simplified cross-sectional illustration of a controlling grating according to a preferred embodiment of the present invention.

In FIGS. 54B-C, cross-sectional views illustrating structural differences between coupling grating 232 relative to controlling grating 234 are respectively provided according to a preferred embodiment of the present invention. As illustrated, coupling grating 232 and controlling grating 234 each have a respective period, 242 and 244, and depth, 252 and 254. In a preferred embodiment, wherein coupling grating 232 and controlling grating 234 are positioned as illustrated in FIG. 54A, the respective duty cycles for each grating are designed to be about 50%, as shown. Within such embodiment, the respective depths, 252 and 254, of each grating are designed to be different. For example, individual coupling and controlling gratings may have respective depths, 252 and 254, of 20 nm and 35 nm. These depth proportions are roughly illustrated in FIGS. 54B-C. In general, for coupling and controlling gratings composed of the same material, controlling grating depth 254 should be greater than or equal to 1.5 times the coupling grating depth 252.

Figure 54D:
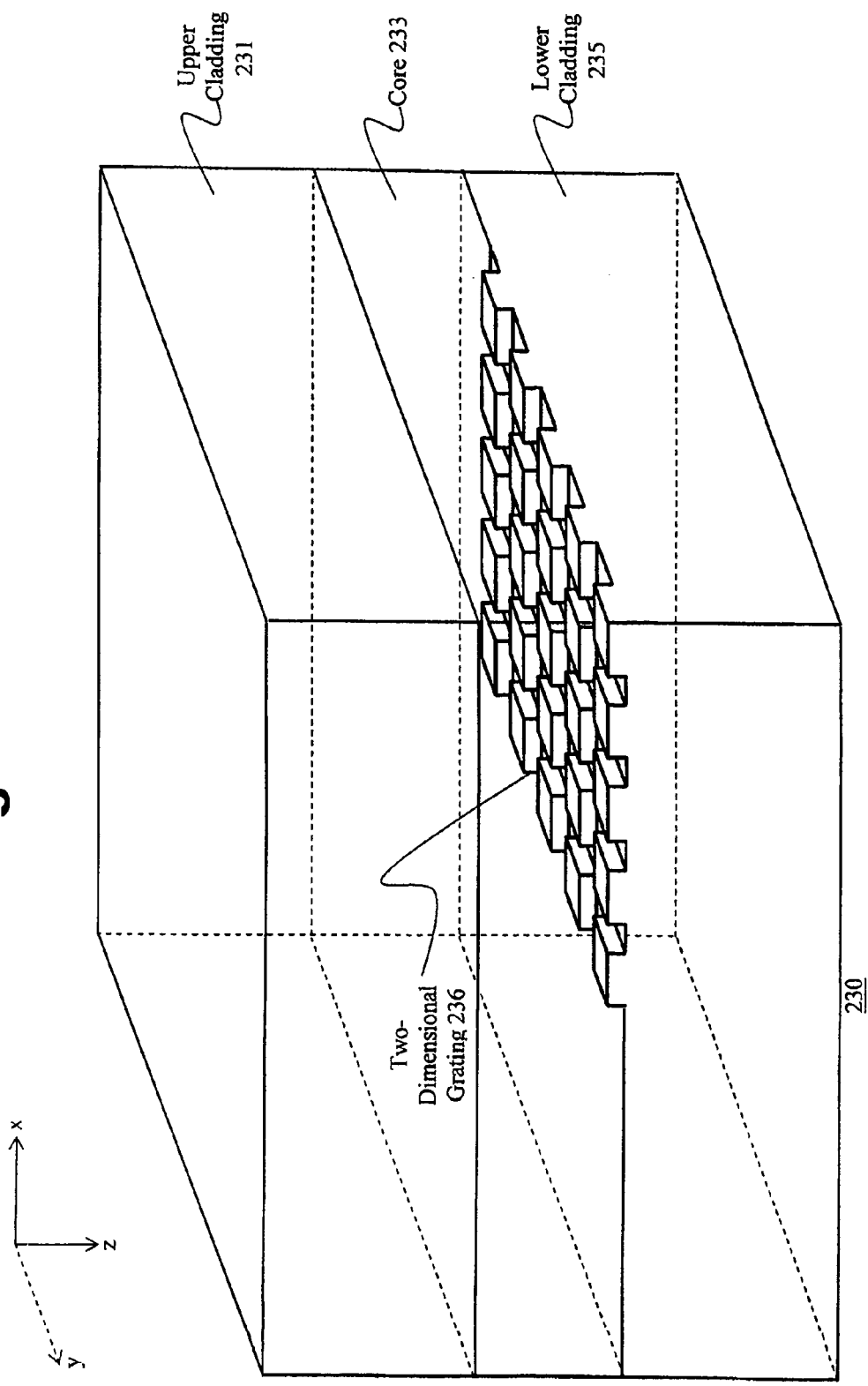
FIG. 54D is a schematic of a single two-dimensional diffraction grating positioned within the waveguide according to an alternative embodiment of the present invention.

In an alternative embodiment, the diffraction gratings may be combined (or superimposed) as illustrated in FIG. 54D. Within such embodiment, the two orthogonal gratings form a single two-dimensional grating 236, which may be placed anywhere in the proximity of waveguide core 233, but preferably on the surface of waveguide core 233. As a result, single two-dimensional grating 236 serves the dual function of both controlling polarization and coupling light into waveguide 230. Within such embodiment, the preferred loss difference between the TM and TE polarizations can be most easily achieved by selecting appropriate duty cycles for the controlling grating component and the coupling grating component of two-dimensional grating 236 (i.e., the gratings parallel to the y-axis would be the controlling grating component, whereas the gratings parallel to the x-axis would be the coupling grating), while keeping the depths equal.

It should be appreciated that a particular grating has its highest coupling or diffraction efficiency with a duty cycle of fifty percent. As the duty cycle is increased to higher than fifty percent or decreased to lower than fifty percent, the coupling efficiency will decrease. For example, a grating with a duty cycle of fifty percent will have a higher coupling efficiency than a grating with a duty cycle of either forty or sixty percent. Therefore, in a preferred embodiment of either the separate grating design shown in FIG. 54A or the single two-dimensional grating embodiment shown in FIG. 54D, the TM grating would preferably have a duty cycle of fifty percent, whereas the TE grating would preferably have a more asymmetric duty cycle of forty or sixty percent, for example.

Figure 55A:
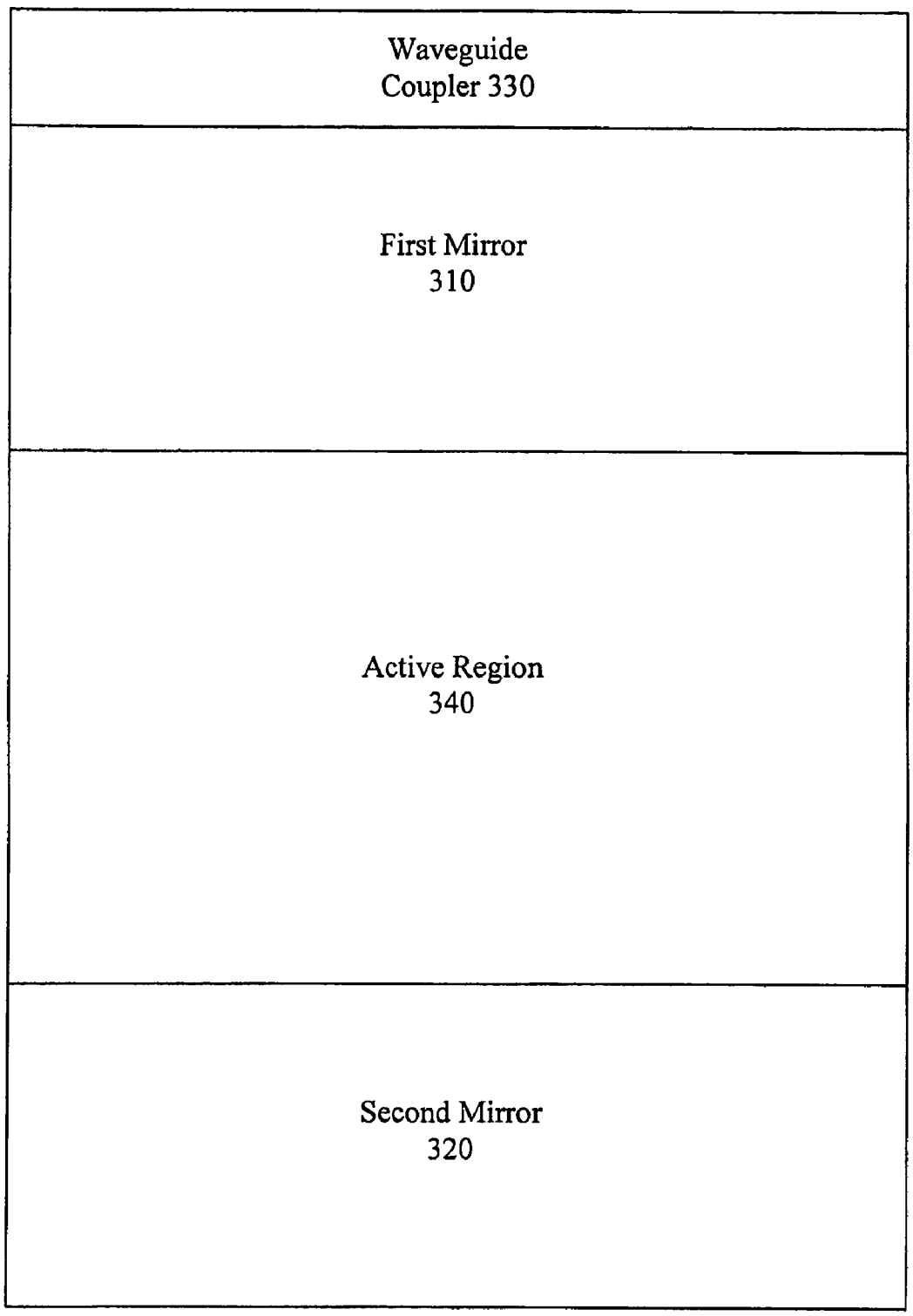
FIG. 55A schematically illustrates a waveguide grating coupler with a waveguide placed on the top surface of the first mirror of a resonant cavity.
Figure 55B:
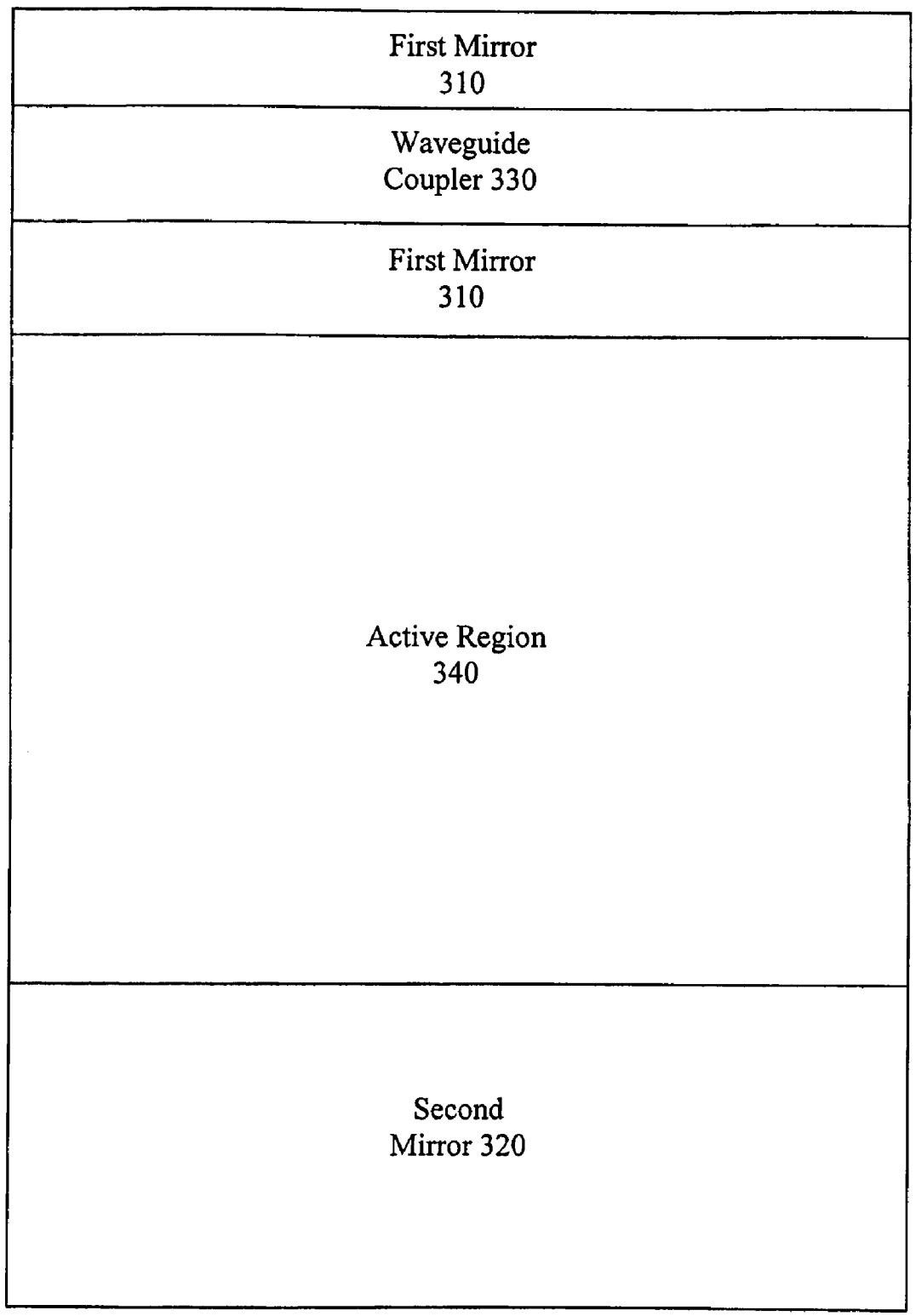
FIG. 55B schematically illustrates a waveguide grating coupler with a waveguide placed internally within the first mirror of a resonant cavity.
Figure 55C:
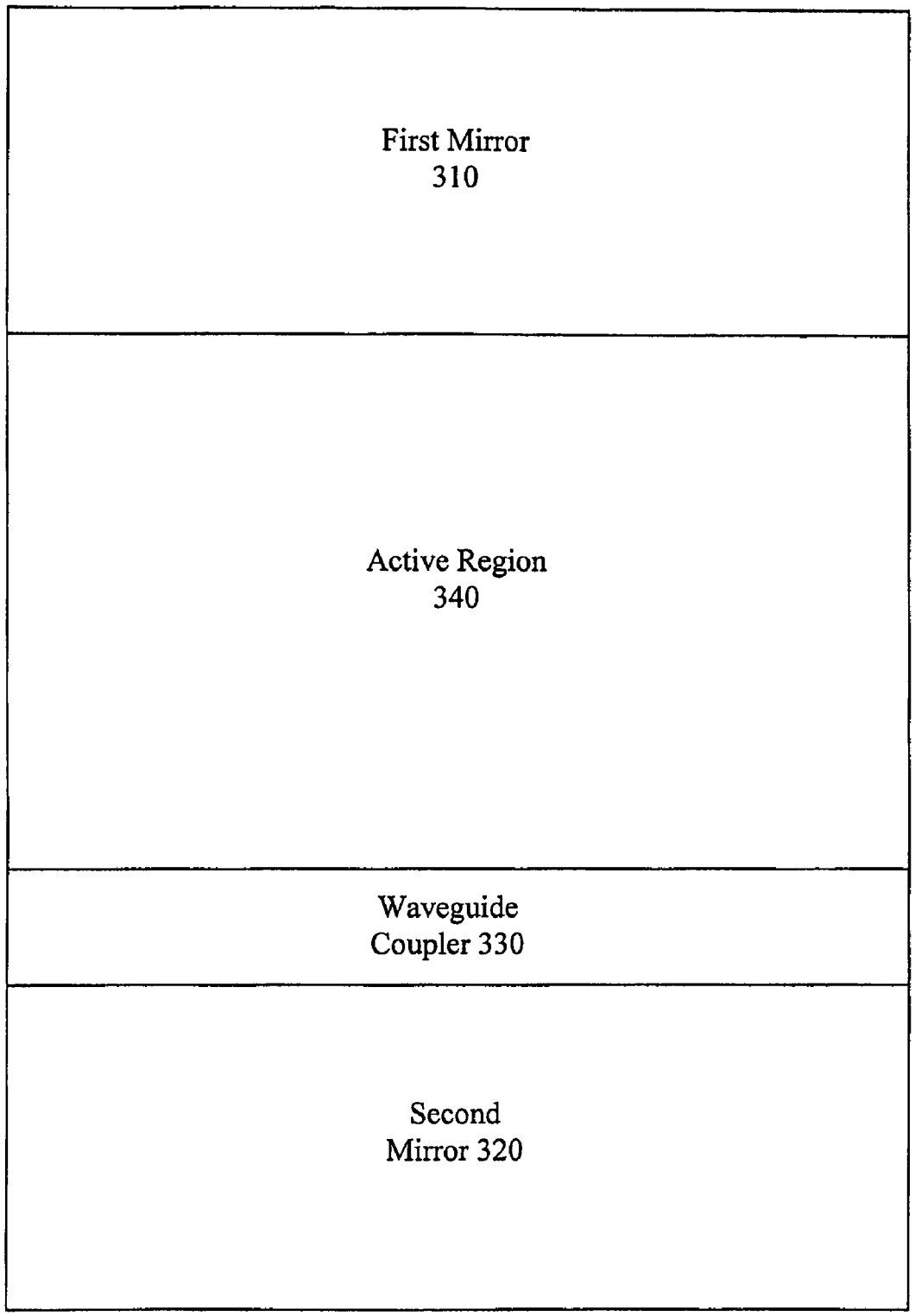
FIG. 55C schematically illustrates a waveguide grating coupler with a waveguide placed on the top surface of the second mirror of a resonant cavity.
Figure 55D:
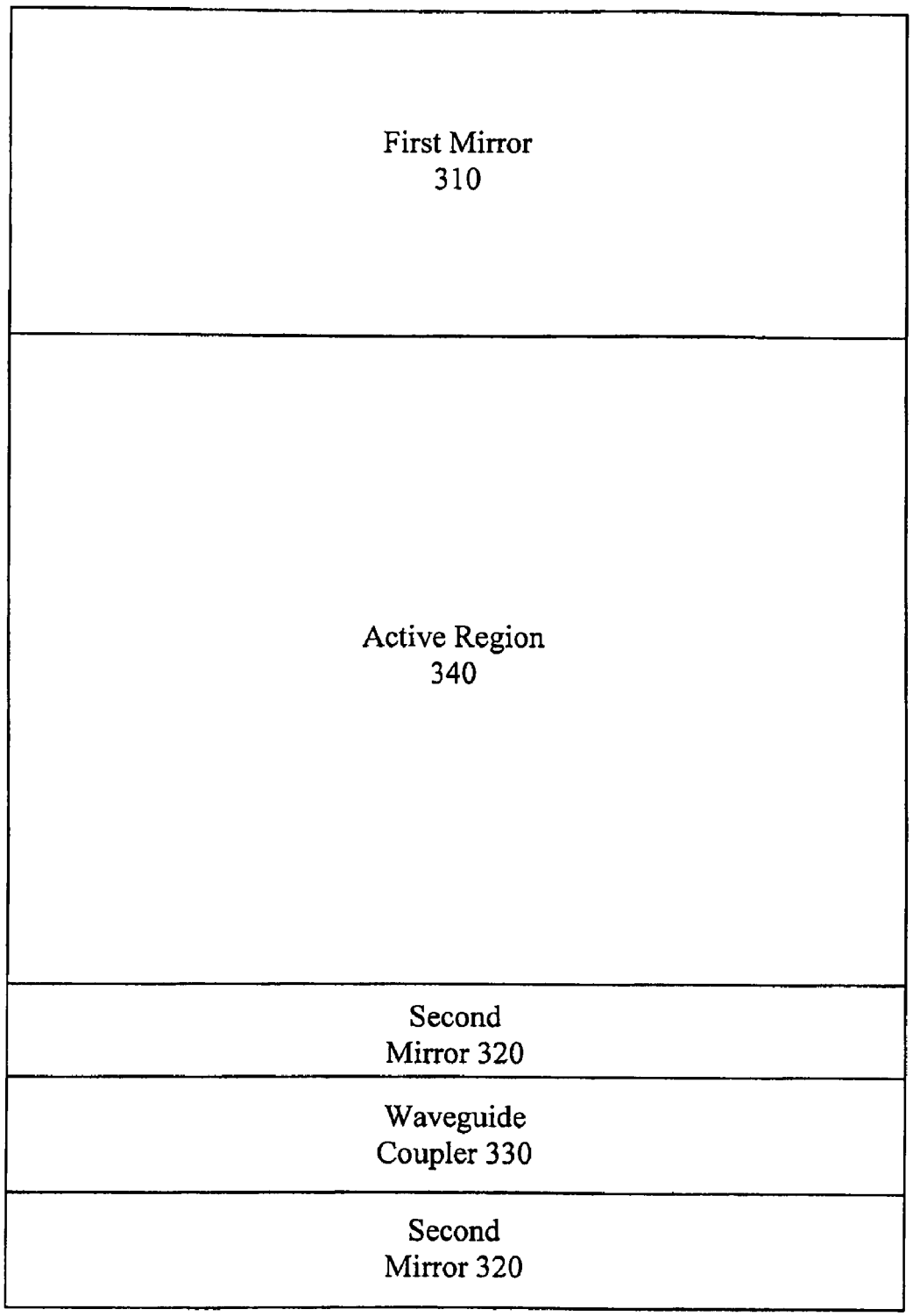
FIG. 55D schematically illustrates a waveguide grating coupler with a waveguide placed internally within the second mirror of a resonant cavity.

It should be further appreciated that alternative embodiments may exist, wherein the waveguide is not placed within the resonant cavity. Within such embodiments, the coupling grating remains formed (such as by etching) onto the waveguide to form a waveguide coupler, while the controlling grating is formed (such as by etching) somewhere in the resonant cavity to control the polarization. One such embodiment is shown in FIG. 55A, wherein first mirror 310, second mirror 320, controlled active region 340, and waveguide coupler 330, are assembled such that waveguide coupler 330 is located on top of first mirror 310 as shown. In other embodiments, however, waveguide coupler 330 may be placed within first mirror 310 as shown in FIG. 55B, on top of second mirror 320 as shown in FIG. 55C, or within second mirror 320 as shown in FIG. 55D.

Figure 56A:
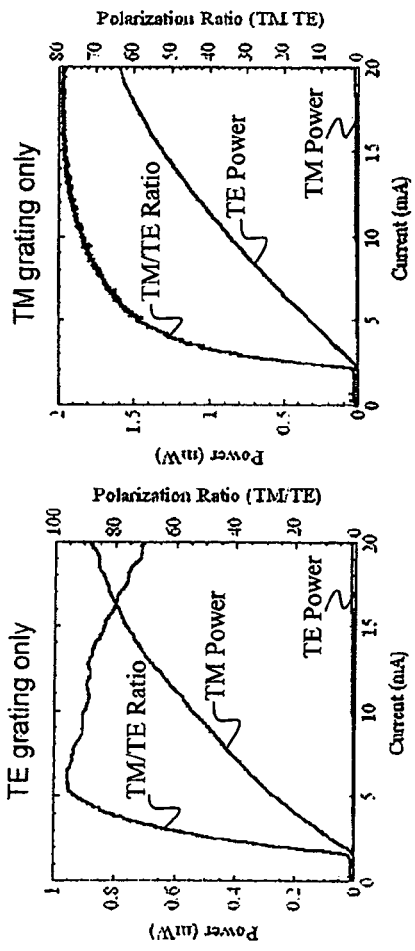
FIG. 56A is a graph of TE and TM polarization light-current characteristics for waveguide grating coupler structures with a single TE grating.
Figure 56B:
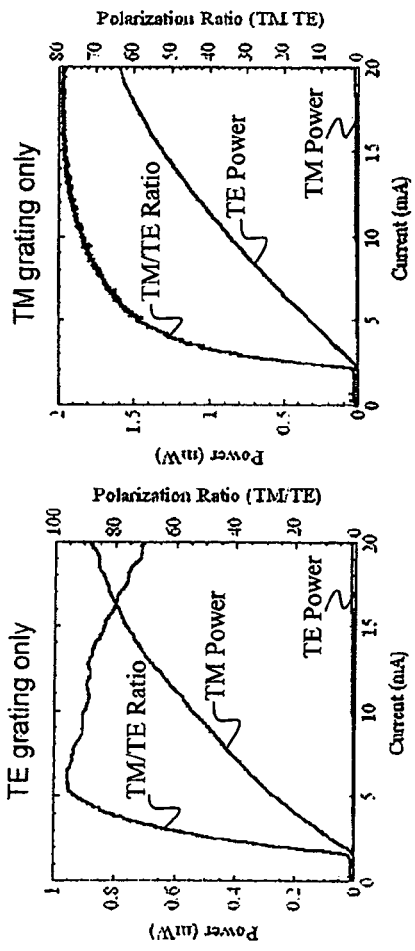
FIG. 56B is a graph of TE and TM polarization light-current characteristics for waveguide grating coupler structures with a single TM grating.
Figure 57A:
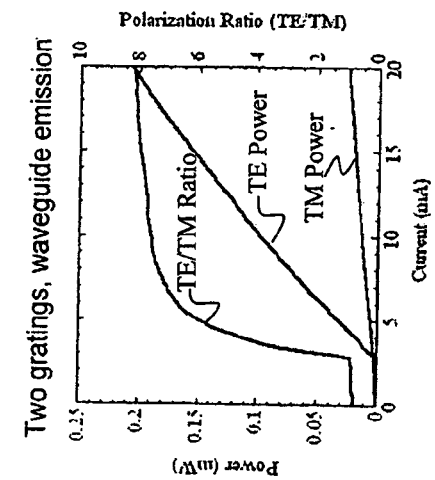
FIG. 57A is a graph of TE and TM polarization light-current characteristics for a waveguide grating coupler with two orthogonal gratings, wherein emissions were measured from the top of the waveguide grating coupler structure.
Figure 57B:
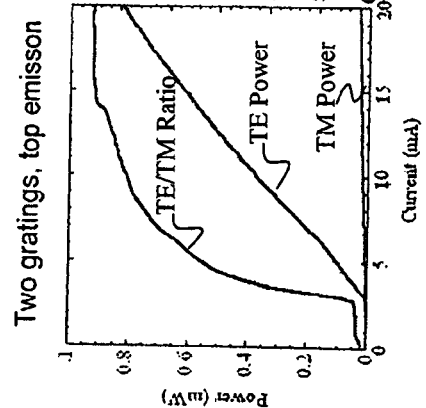
FIG. 57B is a graph of TE and TM polarization light-current characteristics for a waveguide grating coupler with two orthogonal gratings, wherein emissions were measured coming out of the waveguide.

The improved coupling efficiency of the present invention is demonstrated by comparing FIGS. 56A-B with FIGS. 57A-B. In FIGS. 56A-B, for example, TE and TM polarization light-current characteristics for waveguide grating coupler structures with a single internal TE or TM grating are shown, respectively. In each case, the polarization ratio is also provided to illustrate how one of the polarization modes is effectively suppressed by the internal grating. In FIG. 56A, for example, it is shown that a TE grating effectively suppresses the TE polarization, while FIG. 56B shows that a TM grating effectively suppresses the TM polarization.

Figure 58:
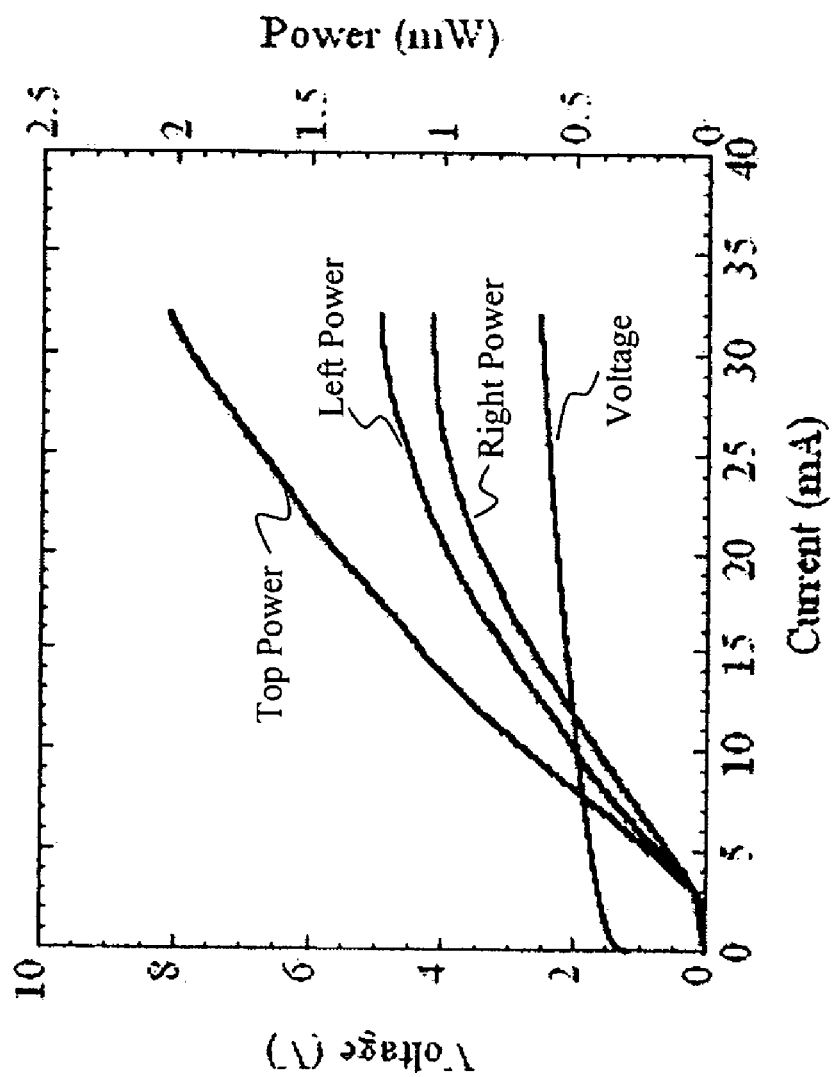
FIG. 58 is a graph of light-current characteristics for a waveguide grating coupler with two orthogonal gratings, wherein emissions were measured from the top of the waveguide grating coupler structure and coming out of the waveguide.

In FIGS. 57A-B, TE and TM polarization light-current measurements are shown for a waveguide grating coupler structure with two orthogonal gratings, wherein measurements are respectively taken from the top of the structure and out of the waveguide. In each case, the polarization ratio is also provided to illustrate how the loss difference between the two gratings effectively suppress the TM polarization. In typical VCSEL structures, round-trip loss differences in the range of 0.1% to 1% are introduced for the TM polarization as compared to the TE polarization. Since the TM polarization is suppressed, the VCSEL waveguide grating coupler lases predominately in the TE polarization, which couples efficiently to the waveguide. A further illustration of these results are shown in FIG. 58, wherein light-current-voltage measurements out the top and out the right and left sides of the waveguide are provided.

For the results summarized in FIGS. 56-57, coupling and controlling gratings having depths of 20 nm and 35 nm, respectively, were used, and each had a period of approximately 650 nm. Both gratings were composed of $TiO_2$ covered by $SiO_2$, with the coupling grating formed on silicon oxynitride, and the controlling grating formed on silicon dioxide.

In general, the loss of TM-polarized light should be greater than or equal to 1.5 times the loss of TE-polarized light in the cavity. This loss difference can be implemented by altering the design of the waveguide grating coupler structure to manipulate differences in diffraction loss and/or reflectivity. Changing the index contrast, thickness, shape, and/or duty cycle of the controlling grating relative to the coupling grating, for example, can introduce the desired loss difference. This loss difference can also be realized by using the proper positions on standing wave peak, and/or positions on optical standing wave envelope.

The present invention has been described above with reference to several different embodiments. However, those skilled in the art will recognize that changes and modifications may be made in the above described embodiments without departing from the scope of the invention. Furthermore, while the present invention has been described in connection with a specific processing flow, those skilled in the art will recognize that a large amount of variation in configuring the processing tasks and in sequencing the processing tasks may be directed to accomplishing substantially the same functions as are described herein. These and other changes and modifications which are obvious to those skilled in the art in view of what has been described herein are intended to be included within the scope of the present invention.

What is claimed is:

1. A waveguide grating coupler comprising:
   first and second mirrors positioned to define a resonant cavity between said first and second mirrors;
   a waveguide;
   a first grating formed as a part of said waveguide to couple light of a first polarization mode into the waveguide; and
   a second grating, wherein said second grating is orthogonal to the first grating, and wherein said second grating enhances the light coupled to said waveguide by reducing light of a second polarization mode different from the first polarization mode within said resonant cavity, such that light within said resonant cavity lases preferentially in said first polarization mode.

2. The waveguide grating coupler of claim 1, wherein said first grating and said second grating are integrated as a single two-dimensional grating.

3. The waveguide grating coupler of claim 1, wherein at least one of the first and second mirrors is a mirror in a vertical cavity surface emitting laser (VCSEL) structure.

4. The waveguide grating coupler of claim 1, wherein light of said second polarization mode is less than light of said first polarization mode within said resonant cavity.

5. The waveguide grating coupler of claim 1, wherein a difference in physical characteristics of said first grating relative to the physical characteristics of said second grating contributes to the enhancement of light coupled to said waveguide.

6. The waveguide grating coupler of claim 5, wherein said physical characteristics are selected from the group consisting of grating thickness, duty cycle, refractive index, reflectivity, and shape.

7. The waveguide grating coupler of claim 1, wherein a standing wave peak of light within said resonant cavity is positioned to contribute to the enhancement of light coupled to said waveguide.

8. The waveguide grating coupler of claim 1, wherein an optical standing wave envelope of light within said resonant cavity is positioned to contribute to the enhancement of light coupled to said waveguide.

9. The waveguide grating coupler of claim 1, wherein said waveguide is positioned to have a location selected from the group consisting of within said first mirror, on top of said first mirror, within said second mirror, and on top of said second mirror.

10. The waveguide grating coupler of claim 1, wherein said waveguide is composed of material selected from the group of semiconductor and dielectric materials.

11. The waveguide grating coupler of claim 1, wherein said second grating is composed of material selected from the group of semiconductor and dielectric materials.

12. A waveguide grating coupler comprising: first and second mirrors, wherein the first mirror is positioned with respect to the second mirror so that light travels within a resonant cavity defined between said first and second mirrors;
a waveguide comprising a core and a cladding;
a first grating formed as a part of said waveguide and proximate to the waveguide core, wherein said first grating couples light in a first polarization mode to the waveguide; and
a second grating, wherein said second grating creates a loss of light in a second polarization mode different from the first polarization mode within said resonant cavity, such that the light traveling within said resonant cavity lases preferentially in said first polarization mode; wherein said first grating and said second grating are orthogonal to each other.

13. The waveguide grating coupler of claim 12, wherein the first grating and the second grating are integrated into a single two-dimensional grating.

14. The waveguide grating coupler of claim 12, wherein said second grating is formed as a part of said waveguide and within said cladding.

15. The waveguide grating coupler of claim 12, wherein said loss of light in the second polarization mode is such that the light of said first polarization mode is greater than the light of said second polarization mode within said resonant cavity.

16. The waveguide grating coupler of claim 12, wherein a difference in physical characteristics of said first grating relative to the physical characteristics of said second grating contributes to the loss of light in said second polarization mode.

17. The waveguide grating coupler of claim 16, wherein said physical characteristics are selected from the group consisting of grating thickness, duty cycle, refractive index, reflectivity, and shape.

18. The waveguide grating coupler of claim 12 further comprising forming said first grating and said second grating so that a shift in position of the standing wave peak of light within said resonant cavity contributes to the loss of light of said second polarization mode.

19. The waveguide grating coupler of claim 12 further comprising forming said first grating and said second grating so that a shift in position of the optical standing wave envelope of light within said resonant cavity contributes to the loss of light of said second polarization mode.

20. The waveguide grating coupler of claim 12, wherein said second grating is formed anywhere within said resonant cavity.

21. The waveguide grating coupler of claim 12, wherein said waveguide is composed of material selected from the group of semiconductor and dielectric materials.

22. A method for coupling light comprising:
forming a resonant cavity between a first and a second mirror;
causing light to lase within said resonant cavity;
positioning a waveguide to couple light out of said resonant cavity;
forming a first grating as a part of said waveguide proximate to a core of the waveguide, wherein said first grating couples light having a first polarization mode to the waveguide; and
forming a second grating, wherein said second grating is orthogonal to the first grating, and wherein said second grating reduces light having a second polarization mode different from the first polarization mode within said resonant cavity, such that said light lasing within the resonant cavity lases preferentially in said first polarization mode.

23. The method of claim 22, wherein said first and second forming steps further comprise integrating said first grating and said second grating into a single two-dimensional grating.

24. The method of claim 22, wherein light having said second polarization mode is reduced such that light having said first polarization mode is greater than light having said second polarization mode within said resonant cavity.

25. The method of claim 22, wherein a difference in physical characteristics of said first grating relative to the physical characteristics of said second grating contributes to the reduction of light in said second polarization mode.

26. The method of claim 25, wherein said physical characteristics are selected from the group consisting of grating thickness, duty cycle, refractive index, reflectivity, and shape.

27. The method of claim 22, wherein said first and second forming steps further comprise forming the first grating and the second grating so that a modulation of the standing wave peak of light within said resonant cavity contributes to the reduction of light having a second polarization mode within the resonant cavity.

28. The method of claim 22 wherein said first and second forming steps further comprise forming the first grating and the second grating so that a modulation of the optical standing wave envelope of light within said resonant cavity contributes to the reduction of light having a second polarization mode within the resonant cavity.

29. The method of claim 22, wherein said second positioning step comprises selecting a position for said waveguide, wherein the position of the waveguide is selected from the group consisting of within said first mirror, on top of said first mirror, within said second mirror, and on top of said second mirror.

30. The method of claim 22, wherein said waveguide is composed of dielectric materials.

31. The method of claim 22, wherein said waveguide is composed of semiconductor materials.

* * * * *

UNITED STATES PATENT AND TRADEMARK OFFICE
CERTIFICATE OF CORRECTION

| | |
|---|---|
| PATENT NO. | : 7,627,018 B1 |
| APPLICATION NO. | : 12/005193 |
| DATED | : December 1, 2009 |
| INVENTOR(S) | : Peter Guilfoyle et al. |

It is certified that error appears in the above-identified patent and that said Letters Patent is hereby corrected as shown below:

In the Specification,

The Government Interests portion of the specification reading "The United States has a paid-up license in this invention and the right in limited circumstances to require the patent owner to license others on reasonable terms as provided by the terms of Contract No. F29601-03-C-0074 awarded by the United States Air Force Research Laboratory" is incorrect and should read --This invention was made with government support under Contract No. F29601-03-C-0074 awarded by the United States Air Force Research Laboratory. The government has certain rights in the invention.--

Signed and Sealed this
Second Day of June, 2015

Michelle K. Lee
*Director of the United States Patent and Trademark Office*